US010530393B2

(12) United States Patent
Ryabinin et al.

(10) Patent No.: US 10,530,393 B2
(45) Date of Patent: Jan. 7, 2020

(54) CONFIGURABLE ECC DECODER

(71) Applicant: WESTERN DIGITAL TECHNOLOGIES, INC., San Jose, CA (US)

(72) Inventors: Yuri Ryabinin, Beer Sheva (IL); Yan Dumchin, Beer Sheva (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/638,045

(22) Filed: Jun. 29, 2017

(65) Prior Publication Data

US 2018/0159555 A1 Jun. 7, 2018

Related U.S. Application Data

(63) Continuation-in-part of application No. 15/630,906, filed on Jun. 22, 2017, which is a continuation-in-part
(Continued)

(51) Int. Cl.
*H03M 13/15* (2006.01)
*H03M 13/11* (2006.01)
(Continued)

(52) U.S. Cl.
CPC ... *H03M 13/1575* (2013.01); *H03M 13/1105* (2013.01); *H03M 13/116* (2013.01); *H03M 13/1108* (2013.01); *H03M 13/1111* (2013.01); *H03M 13/1137* (2013.01); *H03M 13/3715* (2013.01); *H03M 13/616* (2013.01); *H03M 13/6511* (2013.01); *H03M 13/6561* (2013.01); *H03M 13/6577* (2013.01); *H03M 13/6586* (2013.01); *H03M 13/05* (2013.01); *H03M 13/15* (2013.01)

(58) Field of Classification Search
CPC .......... H03M 13/1111; H03M 13/3746; H03M 13/3707; H03M 13/11; G06F 3/0679; G06F 3/064; G06F 3/0619; G06F 11/1076
USPC ....................................................... 714/755
See application file for complete search history.

(56) References Cited

U.S. PATENT DOCUMENTS 7,318,186 B2 1/2008 Yokokawa et al.
7,509,480 B2 3/2009 Jensen et al.
(Continued)

OTHER PUBLICATIONS

United States Patent Office Action for U.S. Appl. No. 15/613,898 dated Nov. 20, 2018 (10 pages).
(Continued)

*Primary Examiner* — James C Kerveros
(74) *Attorney, Agent, or Firm* — Michael Best & Friedrich LLP

(57) ABSTRACT

A device includes a low density parity check (LDPC) decoder that is configured to receive a representation of a codeword. The LDPC decoder includes a circuit configured to set a message length of a decoding message at least partially based on an error metric associated with the representation of the codeword. The LDPC decoder also includes a processing unit including a first group of components and a second group of components. The processing unit configured to selectively couple the first group of components to the second group of components based on the message length of the decoding message.

16 Claims, 24 Drawing Sheets

Related U.S. Application Data of application No. 15/613,898, filed on Jun. 5, 2017, which is a continuation-in-part of application No. 15/366,859, filed on Dec. 1, 2016.

(51) Int. Cl.
*H03M 13/37* (2006.01)
*H03M 13/00* (2006.01)
*H03M 13/05* (2006.01)

(56) References Cited

U.S. PATENT DOCUMENTS

| | | | | |
|---|---|---|---|---|
| 7,818,649 | B1* | 10/2010 | Farjadrad | H03M 13/6502 |
| | | | | 714/758 |
| 8,281,210 | B1* | 10/2012 | Farjadrad | H03M 13/112 |
| | | | | 714/755 |
| 8,407,567 | B2 | 3/2013 | Gunnam | |
| 8,549,375 | B2 | 10/2013 | Ueng et al. | |
| 8,578,238 | B2* | 11/2013 | Priewasser | H03M 13/1105 |
| | | | | 714/758 |
| 9,135,108 | B2 | 9/2015 | Shinohara et al. | |
| 9,438,276 | B2 | 9/2016 | Varnica et al. | |
| 9,461,671 | B1* | 10/2016 | Chang | H03M 13/112 |
| 2004/0123230 | A1* | 6/2004 | Lee | H03M 13/1117 |
| | | | | 714/800 |
| 2007/0011586 | A1* | 1/2007 | Belogolovyi | H03M 13/1111 |
| | | | | 714/774 |
| 2007/0180349 | A1* | 8/2007 | Jacobsen | H03M 13/1102 |
| | | | | 714/776 |
| 2011/0126078 | A1 | 5/2011 | Ueng et al. | |
| 2012/0240007 | A1 | 9/2012 | Barndt et al. | |
| 2012/0290894 | A1* | 11/2012 | Graef | G06F 11/1068 |
| | | | | 714/758 |
| 2013/0073922 | A1 | 3/2013 | Varnica et al. | |
| 2014/0006898 | A1* | 1/2014 | Sharon | H03M 13/356 |
| | | | | 714/755 |
| 2014/0122962 | A1* | 5/2014 | Kodavalla | H03M 13/3746 |
| | | | | 714/755 |
| 2015/0128006 | A1* | 5/2015 | Alhussien | G06F 11/1068 |
| | | | | 714/758 |
| 2015/0381206 | A1 | 12/2015 | Fainzilber et al. | |
| 2016/0134305 | A1* | 5/2016 | Morero | H03M 13/616 |
| | | | | 714/757 |
| 2016/0179620 | A1 | 6/2016 | Bazarsky et al. | |
| 2016/0301425 | A1* | 10/2016 | Morero | H03M 13/1128 |
| 2017/0041024 | A1* | 2/2017 | Chang | H03M 13/112 |
| 2017/0118125 | A1 | 4/2017 | Mishra et al. | |
| 2017/0123902 | A1* | 5/2017 | Ravimohan | G11C 29/52 |
| 2017/0269991 | A1 | 9/2017 | Bazarsky et al. | |
| 2017/0272097 | A1* | 9/2017 | Weng | H03M 13/1108 |
| 2017/0337965 | A1 | 11/2017 | Ware et al. | |

OTHER PUBLICATIONS

United States Patent Office Action for U.S. Appl. No. 15/630,906 dated Dec. 17, 2018 (11 pages).

* cited by examiner

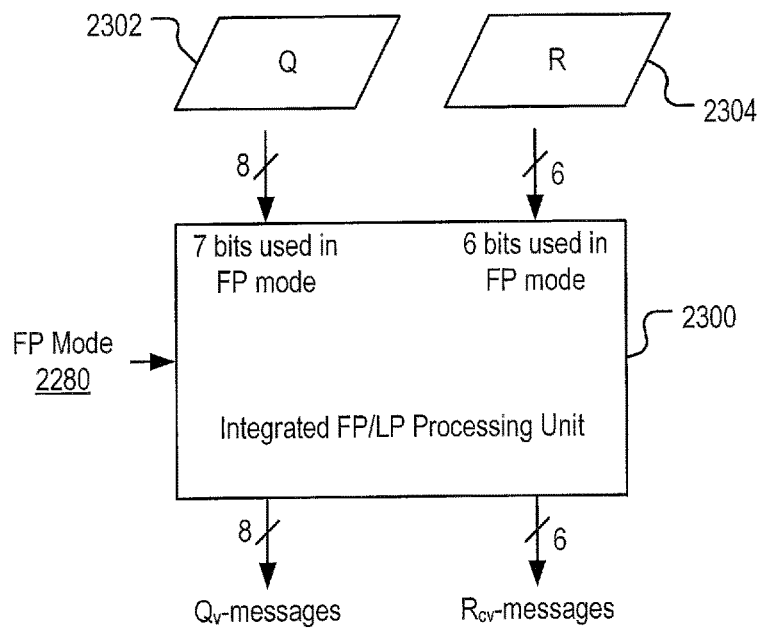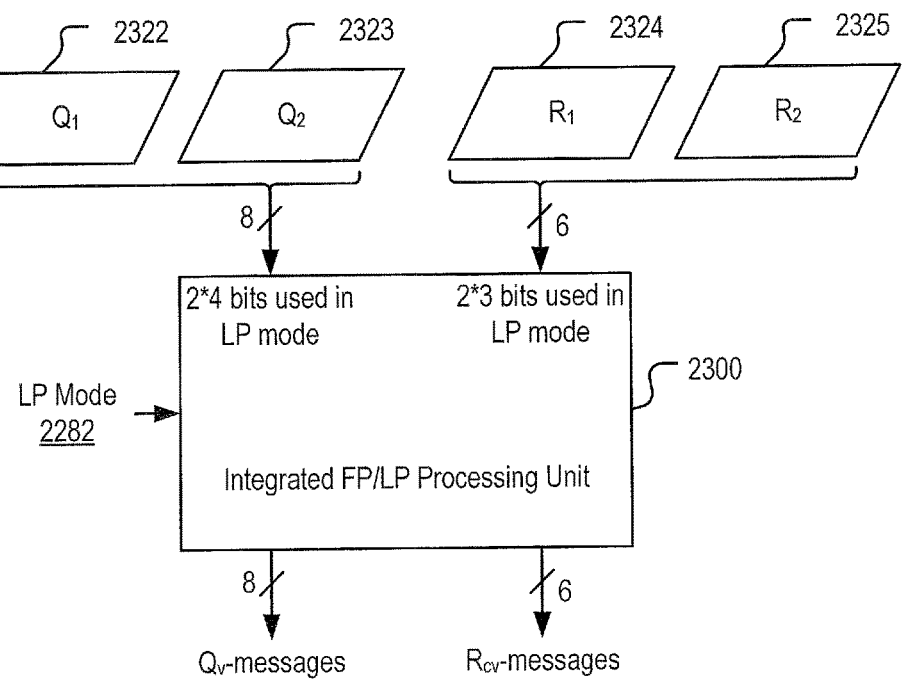
FIG. 23

CONFIGURABLE ECC DECODER

CROSS-REFERENCE TO RELATED APPLICATIONS

The present application claims priority from and is a continuation-in-part of U.S. Non-provisional application Ser. No. 15/630,906, filed Jun. 22, 2017, which claims priority from and is a continuation-in-part of U.S. Non-provisional application Ser. No. 15/613,898 filed Jun. 5, 2017, which claims priority from and is a continuation-in-part of U.S. Non-provisional application Ser. No. 15/366,859, filed Dec. 1, 2016. The content of each of these applications is incorporated by reference herein in their entirety.

FIELD OF THE DISCLOSURE

This disclosure is generally related to data encoding and recovery and more particularly to error correction code (ECC) decoding using multiple decoding message resolutions.

BACKGROUND

Non-volatile data storage devices, such as flash solid state drive (SSD) memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 2 bits per cell, 3 bits per cell, 4 bits per cell, or more. Although increasing the number of bits per cell and reducing device feature dimensions may increase a storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g., "parity bits") that are associated with parity check equations of the ECC encoding scheme and that may be stored with the data as an ECC codeword. As more parity bits are used, an error correction capacity of the ECC increases and a number of bits to store the encoded data also increases.

ECC codewords may be decoded according to variety of techniques. Some techniques may have a relatively high throughput and low power consumption but may provide relatively low error correction capability, while other techniques may provide relatively high error correction capability but may have lower throughput and increased power consumption. In order to provide high-throughput performance without sacrificing correction capability, ECC decoders may support multiple decoding modes. For example, an ECC decoder may use a low-power, high-throughput bit-flipping mode to decode received data and may transition to a higher-power, lower-throughput soft decoding mode for decoding data having an error rate that exceeds the correction capacity of the bit-flipping mode.

However, because the properties of an ECC code (also referred to as a "code") that is used to generate the codewords may determine the number of data bits that can be independently processed in parallel, the decoding modes implemented by an ECC decoder may be constrained to have the same degree of parallelism during decoding. Design of such an ECC system may be complicated due to competing priorities with regard to silicon area and cost, power budget, error correction capability, worst-case decoding latency, and throughput requirements. For example, although a high degree of parallelism may be beneficial for throughput performance using a bit-flipping mode, the same high degree of parallelism may cause the ECC decoder to exceed a power budget using a high-resolution soft decoding mode.

As another example, a decoder may include a first set of components to support a high-resolution soft decoding mode that uses decoding messages having a first number of bits. The decoder may also include a second set of components to support a reduced-resolution soft decoding mode that uses decoding messages having a second number of bits that is less than the first number of bits. Although supporting multiple resolutions enables reduced power consumption in the reduced-resolution soft decoding mode as compared to the high-resolution soft decoding mode, including both sets of components increases a size and cost of the decoder as compared to decoders that support a single-resolution soft decoding mode.

BRIEF DESCRIPTION OF THE DRAWINGS

FIG. 23 is a block diagram of an illustrative example of a configurable data processing unit (DPU) that may be included in the decoder of FIG. 21.

DETAILED DESCRIPTION

Figure 1:
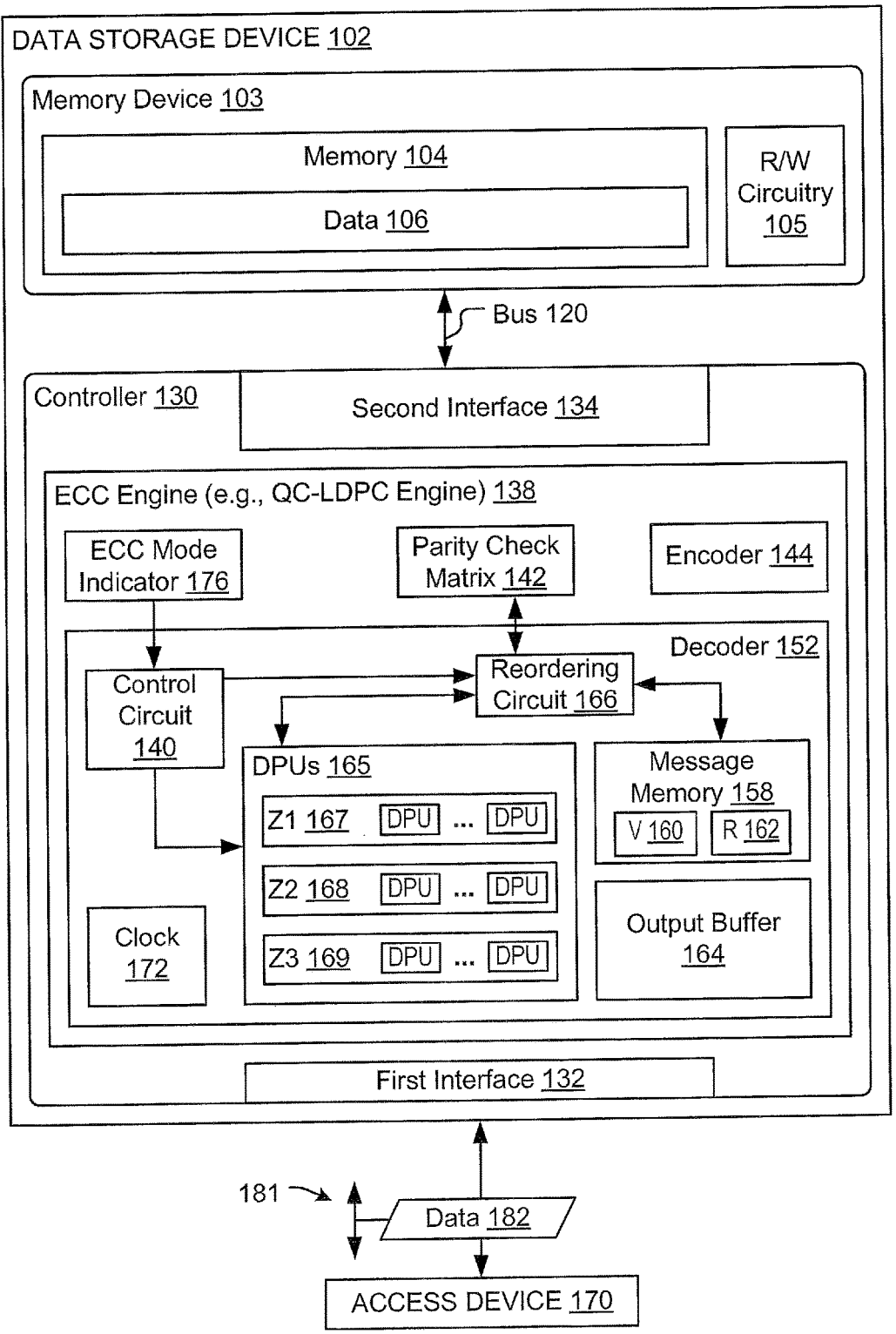
FIG. 1 is a block diagram of an illustrative example of a system including a data storage device including an ECC decoder that supports multiple decoding modes with multiple degrees of parallelism.

Particular examples in accordance with the disclosure are described below with reference to the drawings. In the description, common features are designated by common reference numbers. As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for identification and ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

The present disclosure describes several methods that may be used to "optimize" the tradeoff between area, throughput, and power consumption of an ECC decoder, such as a low-density parity check (LDPC) decoder, that has multiple decoding modes that differ in correction capability and energy consumption. As used herein, decoding modes are also referred to as decoding "gears."

The methods include setting the parallelism level (i.e., number of data processing units (DPUs)) used by each decoding mode. The parallelism level may be set as a function of the power consumption of the decoding mode, the frequency of use of the decoding mode, the message resolution used by each decoding mode, or any combination thereof. For example, the number of DPUs used by each particular decoding mode (e.g., the number of "active DPUs" for that particular decoding mode) may be set to be inversely proportional to the power consumption of the particular decoding mode, inversely proportional to the message resolution used by the particular decoding mode, proportional to the frequency of use of the particular decoding mode, or any combination thereof.

Because the parallelism level that can be most easily implemented in the decoder is directly related to the code structure (i.e., the code is designed for supporting a given parallelism), implementing a different parallelism for different decoding modes operating on the same code is not trivial. As described in further detail herein, the problem of how to implement a different parallelism for different decoding modes is solved by having different decoding modes operate according to one or more transformed versions of the code (or of the code's parity check matrix). A transform operation on the code's parity check matrix that can adjust the parity-check matrix structure to fit each decoding mode's parallelism level may be implemented in an ECC system. As a result, a given code can be used for decoding under multiple parallelism levels via transformations of the code's parity check matrix. The transform operation can be performed on-the-fly based on a code description that is stored once, and interpreted differently according to the particular transforms corresponding to the different decoding modes.

By setting the ratio between the number of DPUs per decoding mode (i.e., an amount of parallelism per decoding mode) to be inversely proportional to a message resolution used by each decoding mode, hardware components may be shared between the decoding modes. For example, a decoder can re-use components in decoder memories, sampling stages, and shifters. To illustrate, the same memory can be used in one decoding mode to store Z messages of 6 bits and in another decoding mode to store 2*Z messages of 3 bits (where Z is an integer corresponding to a parallelism level, a lifting factor, or block matrix size of a parity check matrix, as described further below). Hence, memories, routing layers, and processing units may be fully re-used between a "stronger" decoding mode that uses 6-bit messages and operates with parallelism Z and a "faster" decoding mode that uses 3-bit messages and operates with parallelism 2*Z.

Although particular examples using specific values (e.g., 6 bits, 3 bits) are described throughout the present disclosure, it should be understood that such examples are included for purposes of illustration and are not to be construed as limitations. To illustrate, although the above example describes a "stronger" mode that uses 6-bit messages and a "faster" mode that uses 3-bit messages, in other implementations a stronger decoding mode may use messages having a different resolution (e.g., 5 bits, 7 bits, or any other number of bits), a "faster" decoding mode may use messages having a different resolution (e.g., 2 bits, 4 bits, or any other number of bits), or a combination thereof.

Components of an ECC decoder, including a memory structure, DPUs, and routing from memory to the DPUs, may be designed to enable a large amount of hardware re-use between different decoding modes having different parallelism factors and different message resolutions. Examples of such components, in addition to examples of implementing the on-the-fly transform of the code's parity-check matrix to fit into the multiple parallelism levels used by the different decoding modes, are described in further detail with reference to FIGS. 1-9.

FIG. 1 depicts an illustrative example of a system 100 that includes a data storage device 102 and an access device 170 (e.g., a host device or another device). The data storage device 102 is configured to perform ECC decoding operations using multiple decoding modes having different levels of parallelism, as described further herein.

The data storage device 102 and the access device 170 may be coupled via a connection (e.g., a communication path 181), such as a bus or a wireless connection. The data storage device 102 may include a first interface 132 (e.g., an access device or host interface) that enables communication via the communication path 181 between the data storage device 102 and the access device 170.

The data storage device 102 may include or correspond to a solid state drive (SSD) which may be included in, or distinct from (and accessible to), the access device 170. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 170 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

In some implementations, the data storage device 102 may be embedded within the access device 170, such as in accordance with a Joint Electron Devices Engineering Council (JEDEC) Solid State Technology Association Universal Flash Storage (UFS) configuration. For example, the data storage device 102 may be configured to be coupled to the access device 170 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a micro SD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 170 (i.e., "removably" coupled to the access device 170). As an example, the data storage device 102 may be removably coupled to the access device 170 in accordance with a removable universal serial bus (USB) configuration.

The data storage device 102 may operate in compliance with an industry specification. For example, the data storage device 102 may include a SSD and may be configured to communicate with the access device 170 using a small computer system interface (SCSI)-type protocol, such as a serial attached SCSI (SAS) protocol. As other examples, the data storage device 102 may be configured to communicate with the access device 170 using a NVM Express (NVMe) protocol or a serial advanced technology attachment (SATA) protocol. In other examples, the data storage device 102 may operate in compliance with a JEDEC eMMC specification, a JEDEC Universal Flash Storage (UFS) specification, one or more other specifications, or a combination thereof, and may be configured to communicate using one or more protocols, such as an eMMC protocol, a universal flash storage (UFS) protocol, a universal serial bus (USB) protocol, and/or another protocol, as illustrative, non-limiting examples.

The access device 170 may include a memory interface (not shown) and may be configured to communicate with the data storage device 102 via the memory interface to read data from and write data to a memory device 103 of the data storage device 102. For example, the access device 170 may be configured to communicate with the data storage device 102 using a SAS, SATA, or NVMe protocol. As other examples, the access device 170 may operate in compliance with a Joint Electron Devices Engineering Council (JEDEC) industry specification, such as a Universal Flash Storage (UFS) Access Controller Interface specification. The access device 170 may communicate with the memory device 103 in accordance with any other suitable communication protocol.

The access device 170 may include a processor and a memory. The memory may be configured to store data and/or instructions that may be executable by the processor. The memory may be a single memory or may include multiple memories, such as one or more non-volatile memories, one or more volatile memories, or a combination thereof. The access device 170 may issue one or more commands to the data storage device 102, such as one or more requests to erase data, read data from, or write data to the memory device 103 of the data storage device 102. For example, the access device 170 may be configured to provide data, such as data 182, to be stored at the memory device 103 or to request data to be read from the memory device 103. The access device 170 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

Although the data storage device 102 is illustrated as including the memory device 103, in other implementations the data storage device 102 may include multiple memory devices that may be configured in a similar manner as described with respect to the memory device 103. For example, the data storage device 102 may include multiple memory devices, each memory device including one or more packages of memory dies, each package of memory dies including one or more memories such as the memory 104.

The memory 104 may include one or more blocks, such as a NAND flash erase group of storage elements. Each storage element of the memory 104 may be programmable to a state (e.g., a threshold voltage in a flash configuration or a resistive state in a resistive memory configuration) that indicates one or more values. Each block of the memory 104 may include one or more word lines. Each word line may include one or more pages, such as one or more physical pages. In some implementations, each page may be configured to store a codeword. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write circuitry 105, to support operation of one or more memory dies of the memory device 103. Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The data storage device 102 also includes a controller 130 that is coupled to the memory device 103 via a bus 120, an interface (e.g., interface circuitry, such as a second interface 134), another structure, or a combination thereof. For example, the bus 120 may include one or more channels to enable the controller 130 to communicate with a single memory die of the memory device. As another example, the bus 120 may include multiple distinct channels to enable the controller 130 to communicate with each memory die of the memory device 103 in parallel with, and independently of, communication with other memory dies of the memory device 103.

The controller 130 is configured to receive data and instructions from the access device 170 and to send data to the access device 170. For example, the controller 130 may send data to the access device 170 via the first interface 132, and the controller 130 may receive data from the access device 170 via the first interface 132. The controller 130 is configured to send data and commands to the memory 104 and to receive data from the memory 104. For example, the controller 130 is configured to send data and a write command to cause the memory 104 to store data to a specified address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The controller includes an ECC engine 138 that is configured to receive data to be stored to the memory 104 and to generate a codeword. For example, the ECC engine 138 may include an encoder 144 configured to encode data using an ECC scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 138 may include one or more decoders, such as a decoder 152, configured to decode data read from the memory 104 to detect and correct, up to an error correction capability of the ECC scheme, any bit errors that may be present in the data.

The ECC engine 138 may be implemented as a quasi-cyclic (QC) LDCP engine. The ECC engine 138 may include the encoder 144, the decoder 152, a parity check matrix 142, and an ECC mode indicator 176. The parity check matrix 142 may include information corresponding to an ECC code, such as address and shift amounts of shifted identity sub-matrixes, such described further with reference to FIG. 2. The ECC mode indicator 176 may include one or more bits, flags, or other indicators to indicate a decoding mode of the decoder 152. For example, in an implementation where the decoder 152 supports three decoding modes, the ECC mode indicator 176 may indicate a selected one of the three decoding modes for the decoder 152 to process data. The ECC mode indicator 176 may be provided to the decoder 152, such as via access by a control circuit 140 of the decoder 152. The ECC mode indicator 176 may be stored in one or more registers, latches, or other components configured to store an indicator.

The decoder 152 includes the control circuit 140, a clock 172, a message memory 158, an output buffer 164, multiple DPUs 165, and a reordering circuit 166. The control circuit 140 is responsive to the ECC mode indicator 176 to send configuration signals to the reordering circuit 166 and to the DPUs 165. For example, the control circuit 140 may be responsive to the ECC mode indicator 176 indicating a first decoding mode, and may indicate to the DPUs 165 that a first group 167 of the DPUs 165 are to be used for decode processing of received data. The control circuit 140 may also indicate to the reordering circuit 166 an amount (if any) of transformation to be applied for use in the indicated decoding mode. Examples of such transformations are described in further detail with reference to FIGS. 2-4.

The DPUs 165 include the first group of DPUs 167, a second group of DPUs 168, and a third group of DPUs 169. The first group of DPUs 167 includes a first number "Z1" of DPUs. The second group of DPUs 168 includes a second number "Z2" of DPUs, and the third group of DPUs 169 includes a third number "Z3" of DPUs. In an implementation where the first group of DPUs 167 is used for a lowest power processing mode, such as an ultra-low power (ULP) mode, the number Z1 of DPUs may correspond to a parallelism of the parity check matrix 142. When the second group of DPUs 168 corresponds to a message passing soft decoding mode using a first resolution (e.g., a low-power (LP) decoding mode), the second group of DPUs 168 may include a smaller number of DPUs than the first group, e.g., Z2<Z1. Similarly, the third group of DPUs 169 may be used for a full power (FP) decoding mode that uses even fewer DPUs (e.g., Z3<Z2). The DPUs 165 are therefore responsive to the control circuit 140 for selection and enablement of one or more of the groups of DPUs 167, 168, 169 for use during decode processing at the decoder 152.

The message memory 158 may include a random access memory (RAM) configured to store one or more messages for use during decoding at the decoder 152. For example, the message memory 158 may include data (messages) corresponding to values of variable nodes, such as within a variable node partition "V"160 of the message memory 158. Similarly, the message memory 158 may include data (messages) corresponding to check node values, such as at a second partition "R" 162, for use during decoding operations at the decoder 152. Although the message memory 158 is illustrated as a single component, in other implementations the decoder 152 may implement multiple memory structures for message storage.

The output buffer 164 may be configured to store data indicating error corrected versions of data read from the memory 104, such an error corrected version of data 106 read form the memory 104, after completion of decoding at the decoder 152. Data stored in the output buffer 164 may be provided to the access device 170 via the first interface 132.

The ordering circuit 166 is configured to perform one or more transformations of the parity check matrix 142 to enable decode processing at the decoder 152 according to a selected one of the multiple decoding modes, each of the multiple decoding modes using a different degree of parallelism. For example, as used herein, a degree of parallelism may be indicated by a number of the DPUs 165 that are operating concurrently during decode processing. For example, in a first decoding mode (e.g., a ULP mode), a parallelism of Z1 may be obtained using the first group of DPUs 167, a parallelism of Z2 may be obtained in a second decoding mode (e.g., an LP mode) using the second group of DPUs 168, and a parallelism of Z3 may be obtained in a third decoding mode (e.g., a FP mode) using the third group of DPUs 169. By performing reordering of messages of the message memory 158, the reordering circuit 166 enables each of the decoding modes to be structured based on a frequency of use of the decoding mode, while satisfying power budget and silicon area criteria of the decoder 152, and avoiding a need to adjust the clock 172 to accommodate higher power decoding modes. Operation of components of the decoder 152 are described in further detail with reference to FIGS. 2-4.

During operation, the controller 130 may receive a request to retrieve the data 106, such as from the access device 170. Responsive to the request, the data 106 is read from the memory 104. The read data 106 may differ from the data 106 originally stored into the memory 104 due to the introduction of one or more bit errors during retention of the data 106 in the memory 104. The LDPC decoder 152 may receive the data 106 (including the one or more errors) in the message memory 158. The controller 130 (e.g., the ECC engine 138) may select a decoding mode to correct the one or more errors. For example, the ECC engine 138 (e.g., the decoder 152) may select a default mode, such as the ULP mode, or may select a particular mode based on an estimated bit error rate (BER) of the read data 106. The ECC mode indicator 176 is set by the controller 130 or the ECC engine 138 to indicate the selected decoding mode. The control circuitry 140 receives the ECC mode indicator 176 and issues control signals to configure the DPUs 165 and the reordering circuit 166 for the selected decoding mode. The reordering circuit 166 is used to calculate, for the selected FP, LP, or ULP mode, column strip and shift indexes, as described below. The reordering circuit 166 may re-route the data bits from the message memory 158 to the DPUs 165 according to the QC LDPC matrix and the calculated column shifts and indexes, as described further with reference to FIGS. 2-4.

The control circuit 140 selects one (or more) of the groups of DPUs 167-169 to calculate in parallel the strip checks and variable and messages updates. For example, each of the selected DPUs may perform decode computations synchronously based on the clock 172. Next, the reordering circuit 166 is used to shift the data from the DPUs 165 back to message memory 158 and ultimately to the output buffer 164.

If decoding fails using the selected mode, the decoding mode indicator 176 may be updated to indicate selection of a higher-power decoding mode. In response to the updated indicator 176, the control circuit 140 may reconfigure the reorder circuit 166, may select/enable another (or an additional) group of DPUs 167-169, and may initiate decoding using the higher-power decoding mode. Although three groups of DPUs 165 are depicted to support three levels of parallelism in three decoding modes, in other implementations the DPUs 165 may include a different number of groups to support a different number of decoding modes. For example, in some implementations the decoder 152 may support two decoding modes, three decoding modes, four decoding modes, or any other number of decoding modes.

An "optimal" tradeoff between area, throughput and power consumption of an LDPC decoder may be achieved when the amount of parallelism is dimensioned according to throughput criteria and available power budget. During most of the lifetime of memory devices, such as flash memory devices, low bit error rates (BER) are typically encountered. Hence, the LDPC engine 138 may decode most of the time in a ULP mode, which may be the highest throughput and lowest power LDPC mode. If decoding in ULP mode fails, LP or FP modes may be used to decode data optionally using soft bits. However, because the ULP failure events are relatively rare, using a reduced number of DPUs for the LP and FP modes may have negligible influence on the overall decoder throughput, but may beneficially reduce the logic resources and the memory area used by the decoder 152. As an example, the decoder 152 may use 4*N DPUs for ULP, 2*N DPUs for LP, and N DPUs for FP decoding modes (also referred to as "power modes") (N is a positive integer).

Another consideration in designing decoders is peak power. In many cases, due to a peak power criteria, a large number of DPUs for the LP and FP modes (e.g., 64 DPUs) may not be usable with a full clock frequency. Satisfying the power criteria may require reducing the decoder clock frequency when moving to an LP or FP decoding mode. In this case, a decoder does not benefit from having a large number of DPUs due to the clock frequency reduction. Instead, the decoder 152 may use a smaller number of DPUs for the higher decoding power modes, without reducing the frequency of the decoder clock 172, to reduce decoder cost and size without sacrificing decoding power or latency.

A well-known class of LDPC codes, which is widely used in storage and communication standards, is Quasi-Cyclic (QC) LDPC codes, also known as LDPC codes based on lifted graphs (with cyclic lifting patterns). Such QC-LDPC codes can be represented by a proto-graph and lifting labels on the protograph edges. Alternatively, a QC-LDPC code can be represented by a QC block parity-check matrix that includes Z*Z "0" block matrices and cyclically shifted Z*Z unity matrices, where each such Z*Z (e.g., Z may be 64, 128, 512, etc.) cyclically shifted unity matrix is characterized by its shift from the diagonal, denoted by "k."

Figure 2:
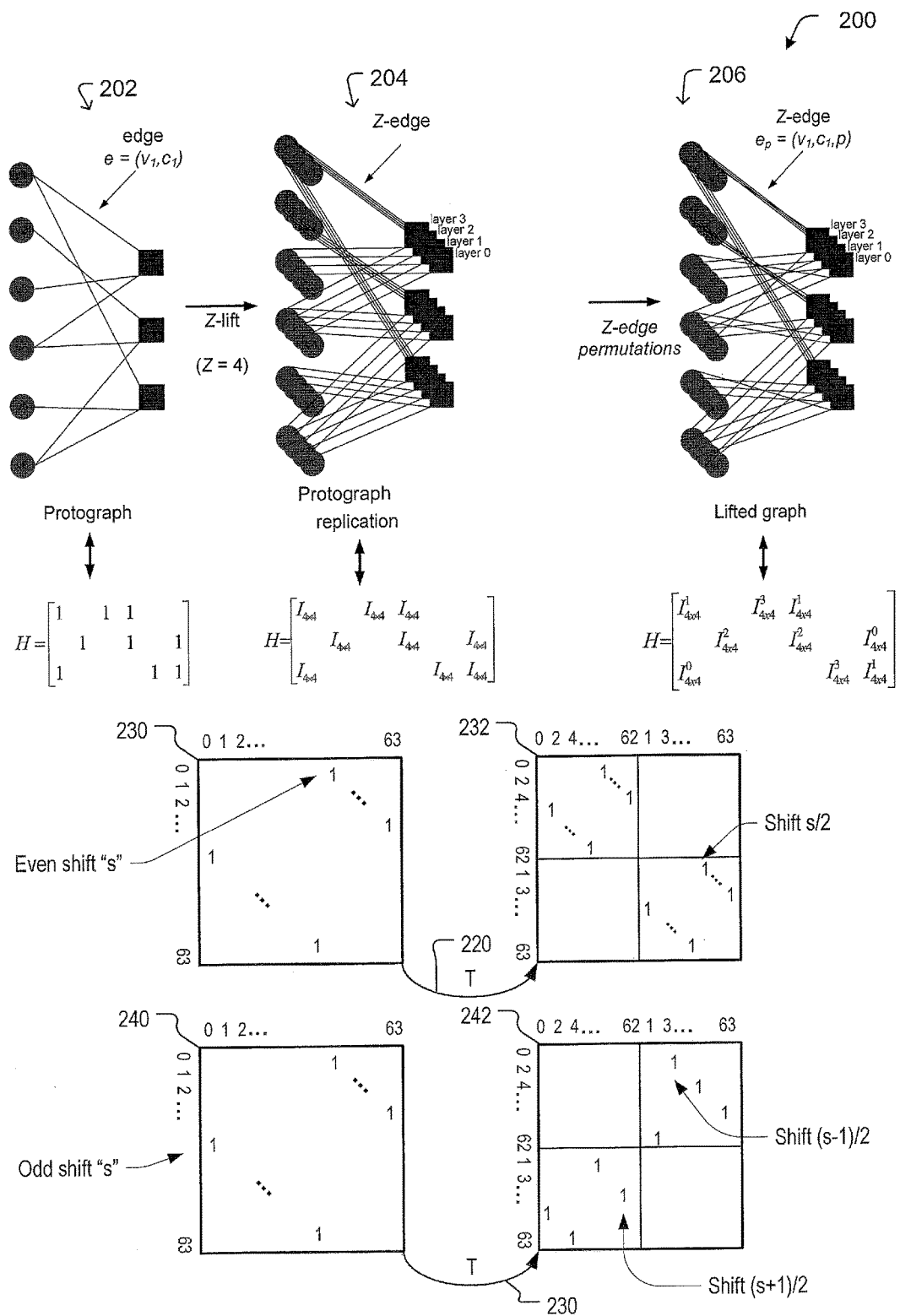
FIG. 2 is a diagram of a particular example of LDPC code construction, parity check matrices, and an even-odd transformation that may be used by the data storage device of FIG. 1.

FIG. 2 is a diagram of a particular example of QC-LDPC code construction based on lifted graphs and corresponding parity check matrices. FIG. 2 also illustrates examples of an even-odd transformation that may be used by the data storage device of FIG. 1.

A first graph 202 illustrates a "protograph" of an LDPC code, showing variable nodes as circles, check nodes as squares, and lines indicating edges between the variable nodes and the check nodes. A parity check matrix H corresponding to the protograph 202 includes "1" elements indicating the presence of an edge between the associated variable node (column) and check node (row) of the protograph and "0" elements (not shown) indicating the absence of an edge. A second graph 204 illustrates the result of replication of the graph 202 into four layers (Z=4). The parity check matrix H corresponding to the second graph 204 includes 4×4 identity sub-matrices in place of the "1" elements of the H matrix of graph 202. A third graph 206 illustrates the result of performing Z-edge permutations to the second graph 204. The parity check matrix H 208 corresponding to the lifted graph 206 includes cyclically shifted identity sub-matrices representing the permutations applied to the edges in the lifted graph 206.

One of the main reasons that QC-LDPC codes are widely adopted in industry standards is the amenability of QC-LDPC codes for high throughput parallel processing by iterative message passing decoders. Such decoding includes storing groups of Z messages corresponding to a "lifted edge" of the lifted graph in a single memory address, such that all Z messages may be accessed, processed and updated simultaneously using Z DPUs. The routing of the Z messages read from the single memory address to the Z DPUs is also simplified and can be performed using a simple barrel shifter, by limiting the graph lifting to cyclic shifts.

In order to utilize the cyclic lifted graph structure which enables low complexity parallel processing of multiple messages for all the decoding modes (ULP/LP/FP) while using a different parallelism ratio ($Z_{ULP}/Z_{LP}/Z_{FP}$), a novel transformation may be applied to the rows and columns of the parity check matrix used during the different decoding modes. For example, this transformation may transform a QC parity check matrix with block size $Z_{ULP}$ during ULP decoding to a QC parity check matrix with block size $Z_{LP}$ during LP decoding and to a QC parity check matrix with block size $Z_{FP}$ during FP decoding.

An LDPC parity check matrix that is constructed from cyclically shifting Z*Z unit matrices may therefore be transformed into an alternative parity check matrix with smaller cyclically shifted blocks using a multi-resolution transformation. The transform is based on performing a permutation of the variable nodes and performing a corresponding permutation of the columns and rows of the parity check matrix that enables transforming the original QC parity check matrix with block size $Z_{ULP}$ into transformed parity check matrices with smaller block sizes of $Z_{LP}$ and $Z_{FP}$, such as $Z_{LP}=Z_{ULP}/2$ and $Z_{FP}=Z_{ULP}/4$. As a non-limiting example, $Z_{ULP}=64$ in ULP mode, $Z_{LP}=32$ in LP mode, and $Z_{FP}=16$ in FP mode may be utilized. However the multi-resolution is general and may provide other resolutions alternatively, or in addition to, the $Z_{ULP}/Z_{LP}/Z_{FP}=64/32/16$ described herein (e.g., $Z_{ULP}=512/Z_{LP}=128/Z_{FP}=64$).

The multi-resolution transformation is reversible and may be performed first at the LDPC encoder 144 before storing the encoded data in the memory 104 and may later be inversed in the LDPC decoder 152, where for example Z/4*Z/4 cyclically shifted matrices may be used at the LDPC encoder 144 that may be later decoded as-is, e.g., Z/4*Z/4 matrices (in FP mode), or that may be transformed to Z/2*Z/2 (in LP mode) or to Z*Z (in ULP mode) at the LDPC decoder 152 according to the LDPC power mode.

The transformation can be implemented by the reordering circuit 166 using logic that manipulates the message memory address and a routing layer shift while using a single description of the code's graph (the parity-check matrix 142), which is "interpreted" differently according to the transform during ULP, LP, or FP decoding. For example, in a first decoding mode the LDPC decoder 152 may process a representation of a codeword based on a first permuted version of the parity check matrix 142 (e.g., a transformation generated by the reordering circuit 166), and in a second decoding mode the LDPC decoder 152 may process a representation of a codeword based on a second permuted version of the parity check matrix 142. In other implementations, multiple different QC-LDPC parity check matrices may be stored at the ECC engine 138 and retrieved based on which decoding mode is selected, rather than the reordering circuit 166 generating permutations of the parity check matrix 142.

Another aspect is related to efficient hardware re-use between the different decoding power modes as a function of the message bit resolution that is used by each decoding mode. For example, the LP and FP modes may use the same decoding algorithm but with different message resolution. Hence, both modes can re-use the same hardware. As the FP message resolution may be double than the LP message resolution (e.g., 6 bits vs. 3 bits), then by setting the LP parallelism to be double than the FP parallelism ($Z_{LP}=2*Z_{FP}$), full hardware re-use and efficiency may be obtained. To illustrate, the same memories and data path can be used for operating in the LP decoder mode with double the parallelism (and hence double the throughput) of the FP mode. In this example, a memory address either stores $Z_{LP}*3$ bits or $Z_{FP}*6$ bits (which are equally sized) that are routed into either $Z_{LP}$ LP DPUs or $Z_{FP}$ FP DPUs. There can also be hardware re-use between the LP and FP DPUs, as the LP DPUs perform similar computations as the FP DPUs but with different resolution (i.e., different message sizes). Thus, FP DPUs may be used in the FP mode and may also be used (with reduced resolution) in the LP mode along with additional LP DPUs.

In such an implementation, both the LP and FP modes have similar power consumption; however, the LP mode provides double the decoding throughput using the same amount of power as the FP mode.

To summarize, by setting the ratio between the number of DPUs per decoding mode (i.e., parallelism per decoding mode) to be inversely proportional to the message resolution used by each decoding mode, an efficient hardware re-use can be implemented, especially in the decoder memories, sampling stages, and shifters.

The transformation applied by the reordering circuit 166 that enables multi-resolution processing at the decoder 152 may be referred to as the even-odd (EO) transformation. This transformation is applied to Z*Z matrices that are obtained by cyclically shifting the columns of an identity matrix of order Z. Informally, the transformation swaps the rows and columns of the matrix such that the even index rows and columns appear first. This is illustrated in FIG. 2, which shows an example of applying the EO transformation to an identity matrix whose columns are cyclically shifted, the shift being denoted by "s" (s is an integer having any value in the range $0, 1, \ldots, Z-1$). In the case where the shift s is even, such as in a matrix 230, the resulting matrix 232 after the EO transformation 220 is a block matrix where the upper right and lower left blocks are all zero, and the upper left and lower right blocks are identity matrices of order Z/2 shifted by a shift s/2. In the case where s is an odd number, such as a matrix 240, the positions of the non-zero blocks and their corresponding shifts after the EO transformation 220 are different, as shown in the resulting matrix 242. Since the transformation 220 is a permutation of indices, it is invertible.

Applying the EO transformation enables a multi-resolution LDPC decoding. For example, a decoder "A" (e.g., the LP mode of the decoder 152) may operate with parallelism factor Z and a decoder "B" (e.g., the FP mode of the decoder 152) may operate with parallelism factor Z/2. Data may be written to the memory 104 after performing the EO transformation on the encoded data. (Note that it is not mandatory to apply the transformation prior to writing to the memory 104 since it is straightforward to transition between the transformed vector and the de-transformed vector. Each Z-tuple of bits written to the memory 104 may be rearranged such that the even indices appear first, followed by the odd indices. The rearranged Z-tuple may be written to the memory 104. Decoder A can operate on the entire layer of Z bits while employing Z DPUs, by reading the entire Z-tuple (arranged as two halves, each cyclically shifted by a shift in the range $0, 1, \ldots, Z/2$), de-permuting the Z-tuple, and operating normally on the resulting Z-tuple. Decoder B can operate on the upper layer and lower layer separately.

More generally, the EO transformation can be applied recursively multiple times to the original Z*Z matrix (e.g., after applying it once to the original matrix, the EO is reapplied to each non-zero Z/2*Z*2 block, and then reapplied recursively to each resulting Z/4*Z*4 block, etc.), and this can enable wider differences between the parallelism factors of different decoders. As an example, a decoder may have $Z_{ULP}=512/Z_{LP}=128/Z_{FP}=64$, which means there is a factor of 8 between the minimum and maximum parallelism factors. Consequently, the underlying EO transformation is of order 3 (i.e., applied recursively 3 times).

Even more generally, computation may be performed for the matrix product y=Ax, where x,y are vectors (e.g. binary vectors), A is a Z*Z matrix (e.g. binary matrix), and the product is computed over the binary field GF(2). This computation may be performed directly, but it may also be performed by applying a permutation into x,y,A. Explicitly the permutation π may be applied to both the rows of A and to the columns of A. When π is applied to the rows of A it is represented by a matrix P which multiplies A from the left, and when π is applied to the columns of A it is represented by the matrix $P^{-1}$ which multiplies A from the right. The result of applying the permutation g to the rows and columns of A is therefore represented by a permuted-matrix $PAP^{-1}$. Applying the permutation π to x is represented by a permuted-vector-x Px. Applying the permuted-matrix to the permuted-vector-x results in $PAP^{-1}$ Px=PAx=Py, denoted as permuted-vector-y. Applying the inverse permutation $P^{-1}$ to Py results in the original vector y.

Figure 3:
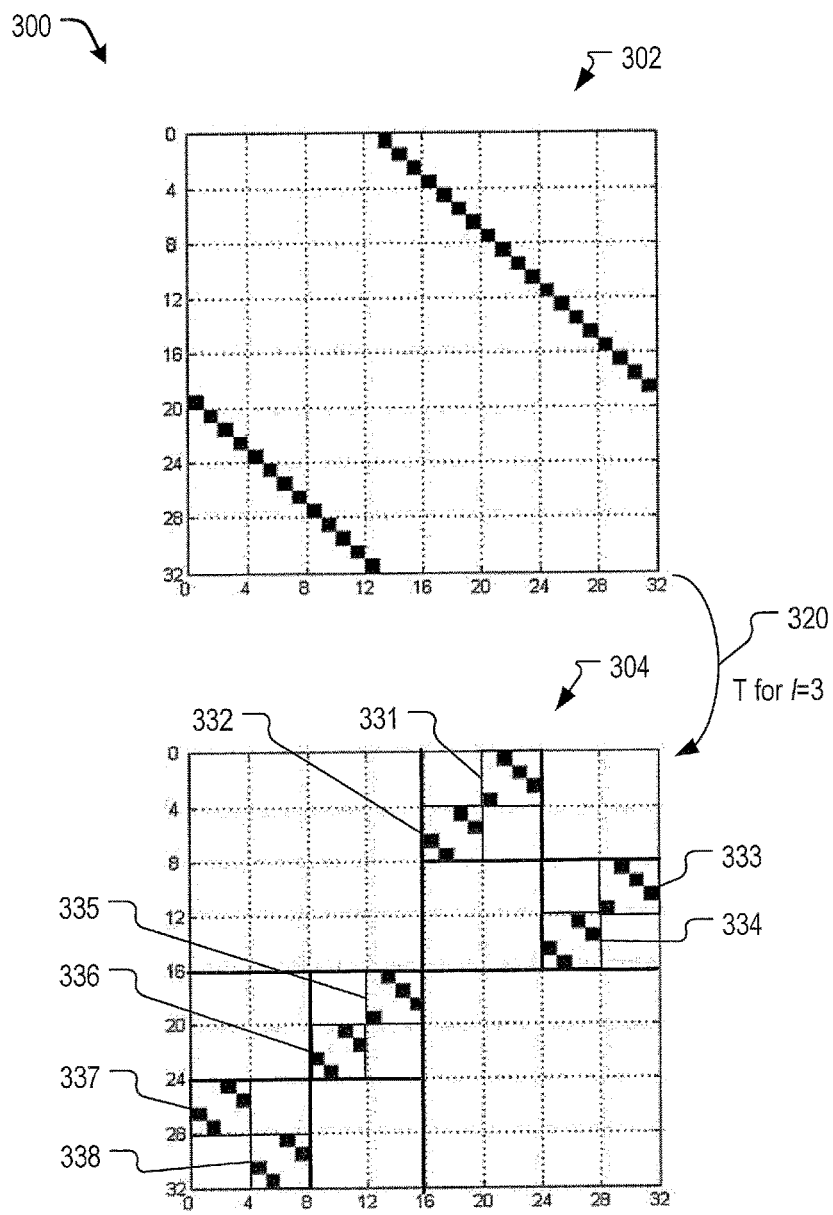
FIG. 3 is a diagram of a particular example of an even-odd transformation of a block matrix of a parity check matrix that may be used by the data storage device of FIG. 1.

Suppose A is the matrix 302 of FIG. 3. Computing Ax directly involves reading all 32 coordinates of x, and the result is a 32 coordinate vector y. If this is performed in one clock of a hardware (HW) machine, then at this clock all 32 coordinates are read, and all 32 coordinates of y are written back to memory. Reading the input vector x from the memory and writing the output vector y to the memory may be relatively uncomplicated, since both the 32 input coordinates and 32 output coordinates may be arranged to reside in consecutive 32 addresses in memory. Therefore, one memory access may be sufficient for both read and write. If a parallelism of 32 is unattainable for the system, and instead the system were designed to perform the computation in 2 steps of 16 coordinates in each step, system design becomes more complicated. For example, consider reading the first 16 coordinates of x in one clock, computing just the relevant coordinates of y, and writing them back to memory. NA is the matrix 302, then the first 16 consecutive coordinates of x give the results of the last 13 coordinates of y and the first 3 coordinates of y. Thus writing y to the memory may be relatively complicated. If the memory is accessible in resolution of 16 coordinates, then both the first 16 coordinates, and the last 16 coordinates are written just for writing the last 13 coordinates and first 3 coordinates of y. On a second clock the coordinates in positions 4-19 of y are written to memory. Again, since y is accessed in a resolution of 16 coordinates (beginning with the $1^{st}$ position), this involves 2 writes.

However, if A is a matrix representing a cyclic permutation (for example A is the matrix 302 of FIG. 3), and if P is an $EO_l$ transformation, and if the input vector x is stored in memory according to the permutation Px, and y is computed by applying $PAP^{-1}$ to Px, system design may be relatively less complicated. For example, suppose P is a permutation matrix of an $EO_3$ transformation. Then $PAP^{-1}$ is represented by the matrix 304 of FIG. 3. The computation of $PAP^{-1} \cdot Px$ may be performed in various resolutions, where for each of the resolutions, in each computing step, consecutive input elements are read and consecutive output elements are written. For example, computing $PAP^{-1} \cdot Px$ may be performed by 8 parallel processing steps, where each processing step receives 4 consecutive values of Px, and computes 4 consecutive values of Py. Considering the matrix of 304, the first processing step receives as input coordinates 21-24 of Px, and computes the first 4 coordinates 1-4 of Py according to multiplication by the submatrix 331. The second processing step receives as input coordinates 17-20 of Px, and computes the next 4 coordinates 5-8 of Py according to multiplication by the submatrix 332. The example continues up to the eighth processing step which receives as input coordinates 5-8 of Px, and computes the last 4 coordinates 29-32 of Py. If the results are stored in the memory according to the permuted order, then there is no need to apply the inverse permutation to Py, but rather store the result Py. However, the computation may also be performed by 4 parallel processing steps where each step computes 8 consecutive values, or by 2 parallel processing steps where each step computes 16 consecutive values. Because the matrix 304 may be partitioned into 4 matrices of 16×16, where in the upper half only 1 of the matrices is not a full 0 matrix, the 16 initial coordinates of $Py=PAP^{-1} \cdot Px$ depend only on 16 initial consecutive coordinates of Px, or on the 16 last consecutive coordinates of Px. In any case reading 16 consecutive coordinates of Px is sufficient for producing the first consecutive 16 coordinates of Py. The same is true for the lower half of the matrix. Reading 16 consecutive coordinates of Px is sufficient for producing the last consecutive 16 coordinates of Py, thus Py may be computed in 2 steps where each step involves reading 16 consecutive coordinates of Px and writing 16 consecutive coordinates of Py. Furthermore, each of the non-zero matrices in the upper half and lower half may be partitioned in the same manner (see emphasized lines in the graph), showing that Py may also be computed in 4 steps where each step involves reading 8 consecutive coordinates of Px and writing 8 consecutive coordinates of Py.

This property may be generalized as follows, where P denotes the permutation matrix associated with $EO_l$. For each matrix A which is a cyclic permutation matrix whose order is divisible by $2^l$, the product $Py=PAP^{-1}\cdot Px$ may be computed in l+1 resolutions, where the first resolution involves 1 computing step in which all the coordinates of Px are read, and all the coordinates of Py are computed and written, the second resolution involves 2 computing steps where in each step half of the coordinates of Px are read, and half the coordinates of Py are computed (where half may be either first half or second half). The (l+1)-th resolution involves $2^l$ computing steps where in each step $\frac{1}{2^l}$ consecutive coordinates of Px are read, and $\frac{1}{2^l}$ consecutive coordinates of Py are computed.

In HW applications, efficiencies may be attained when reads and writes are performed only for consecutive coordinates, thus the use of an EO transformation on a cyclic matrix provides efficient ways to compute y (or rather Py). For example, the computation may be performed in 4 computation steps of 8 coordinates each, where the resolution of the messages associated with the x and y vectors is 3 bits. Alternatively the computation may be performed in 8 computation steps of 4 coordinates each, where the resolution of the messages associated with the x and y vectors is 6 bits. The same amount of memory is consumed for the 2 modes, but the computation speed and power for the 2 modes may be different.

If H is a mZ*nZ matrix, comprised of block Z*Z matrices of, where each of block matrices is either 0 or a cyclic permutation of the Z*Z identity matrix, (e.g. His the matrix 208 of FIG. 2, where n=6, and m=3), then H operates on a vector x of length nZ. The EO transformation may be applied by partitioning the vector x into blocks where each block contains Z coordinates and the EO transformation is applied to each block. The matrix representing this transformation may be derived from the identity matrix of order n*n by replacing the diagonal elements with P, (the matrix representing EO when acting on rows), and replacing the 0 elements with block-0 matrices of order Z*Z.

Similarly, the matrix representing this transformation when operating on the columns of H may be derived from the identity matrix of order n*n by replacing the diagonal elements with $P^{-1}$, (the matrix representing EO when acting on columns), and replacing the 0 elements with block-0 matrices of order Z*Z. The matrix representing the transformation EO on the rows of H may be derived from the identity matrix of order m*m by replacing the diagonal elements with P, and replacing the 0 elements with block-0 matrices of order Z*Z.

An EO transformation applied to a vector v may be more formally described as follows: let l denote the order of the transformation, let $g=\log_2 Z$, (where "≡" signifies definition) and let $v=[v_0 v_1, \ldots v_{2^g-1}]$, be a vector of Z bits. Furthermore, for any number i between 0 and Z−1, the binary representation of the number by g bits is denoted as $i_{[g-1:0]}$. For a vector of bits, the bit-reversal of the vector is denoted by the BR(·) operator.

The direct and inverse EO transformations may be defined by:

$$EO_l(v)_{i[g-1:0]} = v_{[i[g-l-1:0]BR(i[g-1:g-l])]} \quad \text{(Eq. 1A)}$$

(direct transformation)

$$EO_l^{-1}(v)_{i[g-1:0]} = v_{[BR(i[l-1:0])(i[g-1:l])]} \quad \text{(Eq. 1B)}$$

(inverse transformation)

FIG. 3 is a diagram of a particular example 300 of an even-odd transformation of a block matrix of a parity check matrix that may be used by the data storage device 102 of FIG. 1. When applied to matrices, the even-odd transformation is applied to both the rows and columns of the matrix. FIG. 3 illustrates a Z*Z (Z=32) identity matrix 302 whose columns are cyclically shifted to the right by 13 positions and a matrix 304 that is the result of applying the even-odd transformation 320 of order l=3 to the matrix 302. The matrix 304 is composed of sub-matrices with size (i.e., having dimensions of) 4*4 (4=Z/$2^l$) which are either zero or cyclical shifts (of order 4) of the identity matrix. There are a total of 8 non-zero matrices 331-338 of size 4*4 in the matrix 304. This situation can correspond to a setting where $Z_{ULP}=32/Z_{LP}=16/Z_{FP}=4$, as an illustrative example.

A QC-LDPC code can be decoded using a variety of decoders or decoding modes, each employing potentially a different value of parallelism. The decoder parallelism levels may be multiples of some base level (such as in the example above where $Z_{FP}$ is a divisor of $Z_{LP}$ and $Z_{ULP}$), though this is not necessary. Each decoder can process a Z-tuple of bits in layers, the number of layers depending on the ratio between the decoder's parallelism and Z.

The actual order in which the sub-matrix blocks are processed may depend on the decoder schedule. For example, an implementation of the decoder 152 may use a serial-C decoding schedule, also referred to as a layered decoder. In this implementation, the check nodes in the graphs may be processed sequentially, where in the processing of a single check node, in each clock cycle, a message is processed which is associated with an edge connected to the check node. The QC nature of the code enables processing of Z messages corresponding to Z check nodes simultaneously. To illustrate multi-resolution operation in this implementation, the decoder 152 may have two decoding modes, D and D' (which can represent the FP and LP decoding modes, for example), which have parallelism of $Z_D < Z_{D'} < Z$, where the ratios $Z/Z_D$ and $Z/Z_{D'}$ represent the number of non-zero $Z_D*Z_D$ (or $Z_{D'}*Z_{D'}$) blocks in each Z*Z block of the matrix. An example of this setting appears in FIG. 3, where $Z_D=4$, $Z_{D'}=8$, and Z=32. The matrix 304 may be considered as a QC-LDPC matrix with parallelism factor $Z_D$, and decoder D could operate as a standard serial-C decoder. However, the transformation (e.g., implemented by the reordering circuit 166) enables the decoder to store the address and shift values at the original LDPC parallelism factor, Z, without storing the address and shift values for $Z_D$. In other words, using only the shift value, the reordering circuitry 166 can operate on a matrix such as the matrix 304 of FIG. 3 using the lower parallelism decoder D. In the context of serial-C decoding, the Z*Z matrix may be logically partitioned into horizontal stripes of $Z_D$ rows and vertical stripes of $Z_D$ columns. The Z edges are processed $Z_D$ edges at a time, where, borrowing from the FIG. 3 example, the first $Z_D$ checks corresponding to the first horizontal stripe process messages corresponding to the variables in vertical stripe 5 (using vertical stripe indices of 0, 1, ..., 7, starting from the left). During processing of the second horizontal stripe, messages corresponding to variables in vertical stripe 4 are processed, etc. The general relation between the horizontal (or row stripe) index and the original shift k to the vertical (or column stripe) index and the resulting shift is given by equations 2A, 2B and 2C.

$$a_{EO}=k[l-1:0]+BR(\text{rowstripe}[l-1:0]) \quad \text{(Eq. 2A)}$$

$$\text{columnstripe}=BR(a_{EO}[l-1:0]) \quad \text{(Eq. 2B)}$$

$$\text{shift}=k[g-1:l]+a_{EO}[l] \quad \text{(Eq. 2C)}$$

Referring again to the example of FIG. 3, since k=13= [01101] (in the matrix 302), k[g-1:l]=k[4:3]=[01], and k[l-1:0]=k[2:0]=[101]. The parameters of the 8 non-zero 4*4 matrices computed via the above equations are summarized in Table 1:

TABLE 1

| rowstripe | $a_{EO}$ = k[2:0] + BR(rs[2:0]) | columnstripe = BR($a_{EO}$[2:0]) | shift = k[4:3] + $a_{EO}$[3] |
|---|---|---|---|
| 0 = [000] | [0101] | [101] = 5 | 1 + 0 = 1 |
| 1 = [001] | [1001] | [100] = 4 | 1 + 1 = 2 |
| 2 = [010] | [0111] | [111] = 7 | 1 + 0 = 1 |
| 3 = [011] | [1011] | [110] = 6 | 1 + 1 = 2 |
| 4 = [100] | [0110] | [011] = 3 | 1 + 0 = 1 |
| 5 = [101] | [1010] | [010] = 2 | 1 + 1 = 2 |
| 6 = [110] | [1000] | [000] = 0 | 1 + 1 = 2 |
| 7 = [111] | [1100] | [001] = 1 | 1 + 1 = 2 |

Operation of decoder D' is similar. Upon reading a set of $Z_{D'}$ messages, these messages may first be de-permuted by performing the inverse EO transformation of order $$\log_2 \frac{Z_{D'}}{Z_D},$$

and the above process may be repeated with the parameters of decoder D replaced by those of decoder D'. If the information is arranged in memory according to the orientation of decoder D, performing the inverse EO transformation converts the arrangement of the data in memory to fit the orientation of decoder D'. As an alternative to performing the inverse EO transformation, another option is to work directly in the D'-domain and use $$\frac{Z_{D'}}{Z_D}$$

shifters. This enables a re-use of existing barrel shifters when decoder D is the FP decoder (e.g., 6 bits per message) and decoder D' is the LP decoder (e.g., 3 bits per message). In this case, there may be full re-use of the barrel shifter layer when $$\frac{Z_{LP}}{Z_{FP}} = 2,$$

as described in further detail with reference to FIG. 5.

Figure 4:
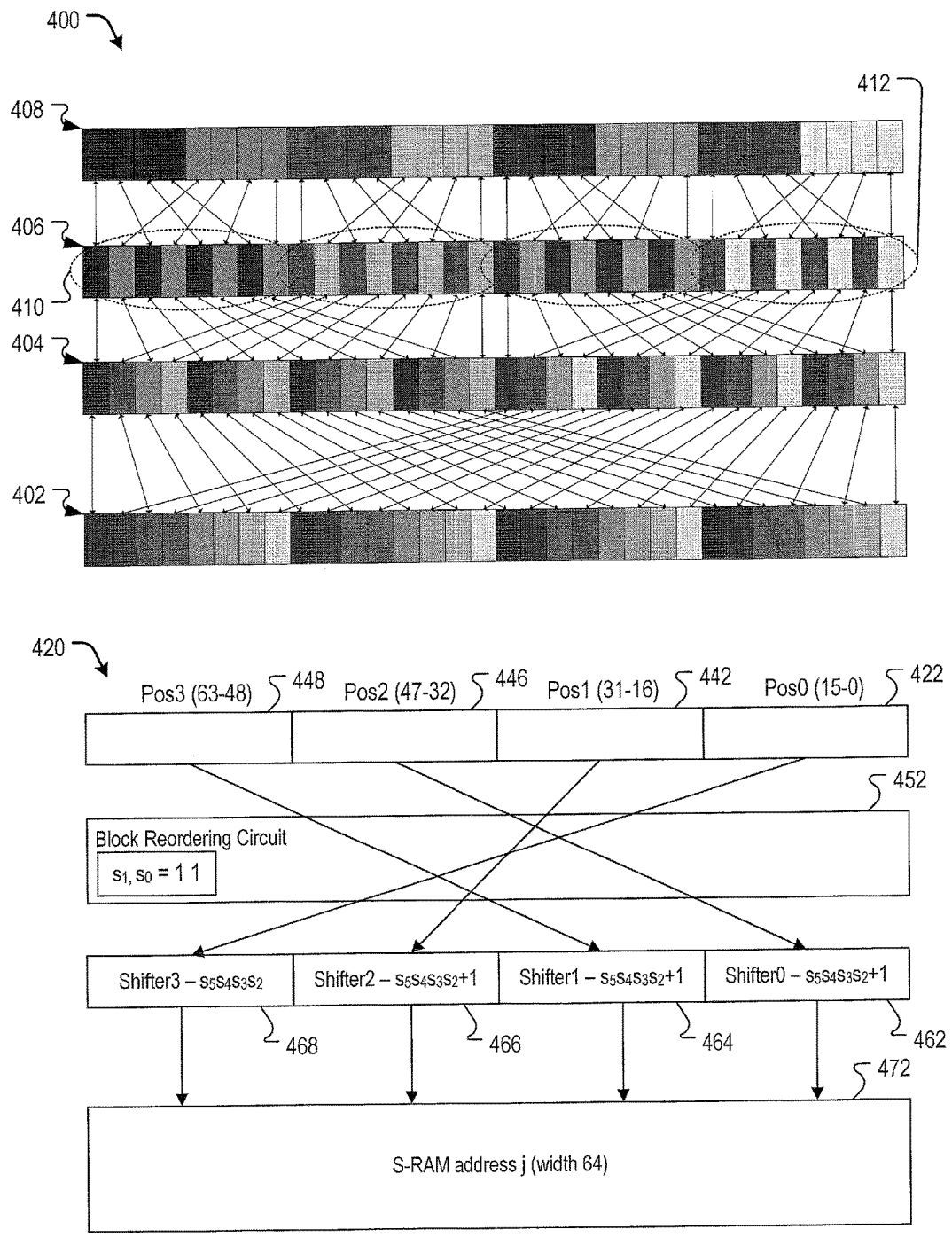
FIG. 4 is a diagram of a particular example of components of the data storage device of FIG. 1 including a reordering circuit and illustrates an example of an even-odd transformation that may be used by the data storage device of FIG. 1.

FIG. 4 is a diagram of a particular example of components of the reordering circuit 166 of FIG. 1 and illustrates an example of permutations that may be applied by the reordering circuit 166, resulting from using an even-odd transformation as described above. A graph 400 illustrates the bit shifts performed by applying the even/odd (E/O) transformation 3 times, consequently generating smaller lifted matrices in FP mode from the original larger matrices of the ULP mode. Bit shifts by the reordering circuit 166 E/O transformation are illustrated for Z=64/32/16.

The graph 400 illustrates a first representation 402 of a single bit-vector of Z=-64 bits, a second representation 404 of the bit-vector after a first EO transformation is applied to the first representation 402, a third representation 406 of the bit-vector after a second EO transformation is applied to the second representation 404, and a fourth representation 408 of the bit-vector after a third EO transformation is applied to the third representation 406. Each representation 402-408 may be logically partitioned into one or more pages corresponding to a Z associated with the representation. For example, the first representation 402 may correspond to a single page of Z=64, the second representation 404 may correspond to two pages of Z=32, the third representation 406 may correspond to four pages of Z=16 including representative pages 410 and 412, and the fourth representation 408 may correspond to eight pages of Z=8.

A diagram 420 illustrates block shifts performed by a block reordering tier 452 (e.g., a block reordering circuit) of the reordering circuit 166. In this case, a first block 422 of 16 bits (bits 0-15) is shifted to the highest position in the memory (bits 48-63) and a second block 442 (bits 16-31) is shifted to the next position (bits 32-47). The next two blocks 446 and 448 (bits 32-47 and 48-63 respectively) are shifted to the lower positions (bits 0-15 and bits 16-32). In addition to the block shift, the bits are cyclically shifted within the shifted blocks by a bit shifting tier of the reordering circuit 166. Each shifter 462, 464, 466, and 468 of the bit shifting tier may be configured to perform a barrel-shift by the value denoted in the figure. For example shifter 3 shifts by a shift amount indicated by the 4-bit word formed of the bits "$S_5 S_4 S_3 S_2$".

The reordering circuit 166 may include direct and inverse ("shift-right" and "shift-left") combinational cyclic shifters that perform the shifts illustrated in FIG. 4. "Shift-right" barrel shifters may be used on input data received from the message memory 158 and sent to DPUs groups 167, 168, or 169 for processing, while "shift-left" barrel shifters may receive the output from the DPUs and forward the output back to an address j of an S-RAM 472 (e.g., the message memory 158) having a width of 64.

The barrel shifters 462-468 may be sized for m bits and may be constructed of $\log_2$ m multiplexer layers (2-to-1 multiplexers), where each layer n shifts data either by 0 or $2^n$ bits. The shifters 462-468 may implement bit shifts as computed by applying the direct and inverse EO transforms as described in Eqs. 2A-C to a cyclic shift matrix.

Figure 5:
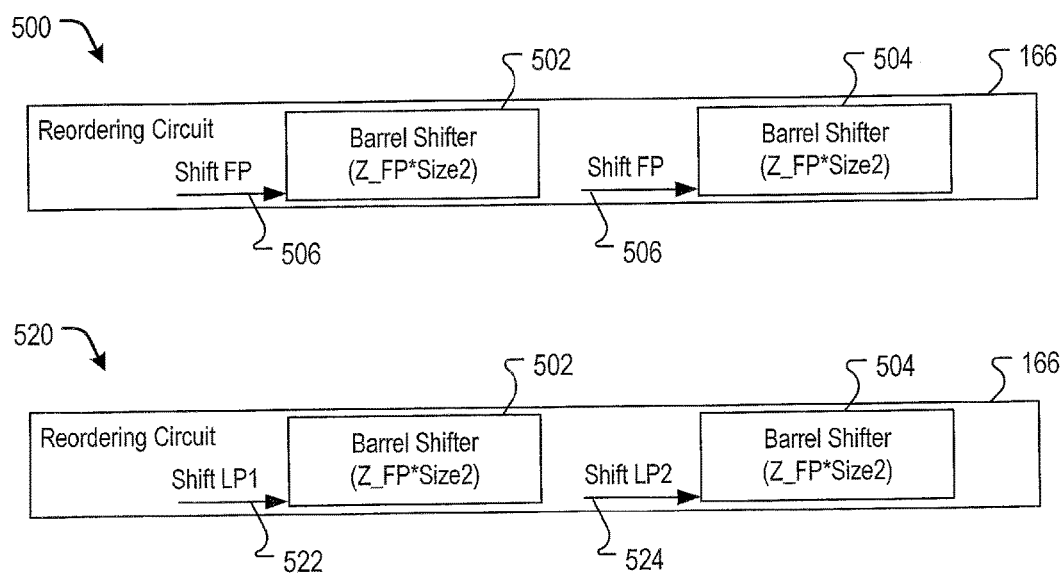
FIG. 5 is a diagram of another particular example of a reordering circuit that may be included in the data storage device of FIG. 1.

FIG. 5 illustrates an example of re-use of buffers of the reordering circuit 166 in FP and LP modes. In a particular example, the reordering circuit 166 may include two barrel shifters with $Z_{LP}$ messages of 4 bits in LP mode or $Z_{FP}$ messages of 7 bits in FP mode. To illustrate, a first configuration 500 of the reordering circuit 166 includes a first barrel shifter 502 and a second barrel shifter 504 (e.g., the shifters 462-468 of FIG. 4) that are each sized to handle $Z_{FP}$ messages, where LP messages have a size "Size1" (e.g., 3 bits) and FP messages have a size "Size2" (e.g., 6 bits). In the first configuration 500, the reordering circuit operates in a FP mode, and each of the shifters 502, 504 receives a shift value 506 corresponding to a FP shift amount. In a second configuration 520, the reordering circuit 166 operates in a LP mode, and each of the shifters 502, 504 receives a different LP shift value 522, 524 to accommodate twice the number of messages (of approximate half the size) as in the FP mode using the same set of shifters 502-504. It should be noted that reordering circuit 166 may implement different shifts per power mode (e.g., FP, LP and ULP) according to the EO transformations applied and the number of DPUs utilized to process the data in in parallel in each mode.

In an illustrative, non-limiting example of multi-mode decoder operation, the initial LDPC cyclic shifted matrix may be 64*64 ($Z_{ULP}$=64) and smaller cyclic shifted 32*32 ($Z_{LP}$=32) and 16*16 ($Z_{FP}$=16) matrices using the EO transformation of order 2 are used in LP and FP modes. The decoder 152 may apply EO transformation of order 2 to recover the structure of 64*64 matrices in ULP mode and may use 64 DPUs in parallel to calculate the checks and update the variables. In LP mode, the decoder 152 may apply a single inverse EO transformation to recover the structure of 32*32 matrices and may use 32 DPUs in parallel to calculate the checks and update the variables. In FP mode, the decoder 152 may use the 16*16 matrix and may use 16 DPUs in parallel to calculate the checks and update the variables.

It should be noted that the Z gear LDPC engine in the present example may re-use hardware, for example, when messages may be 7 bits in FP mode and 4 bits in LP mode. The same barrel shifter buffer may be used in the reordering circuit 166 to shift 16 values of 7 bits in FP mode and to shift 32 values of 4 bits in LP mode, similar to the configurations illustrated in FIG. 5. Additionally, as described previously, the same 16 FP DPUs may utilized in both FP and LP modes, and an additional 16 DPUs may be utilized in the LP mode (so that 32 DPUs are used in LP mode). Another 64 DPUs may be utilized in the ULP mode.

Figure 6:
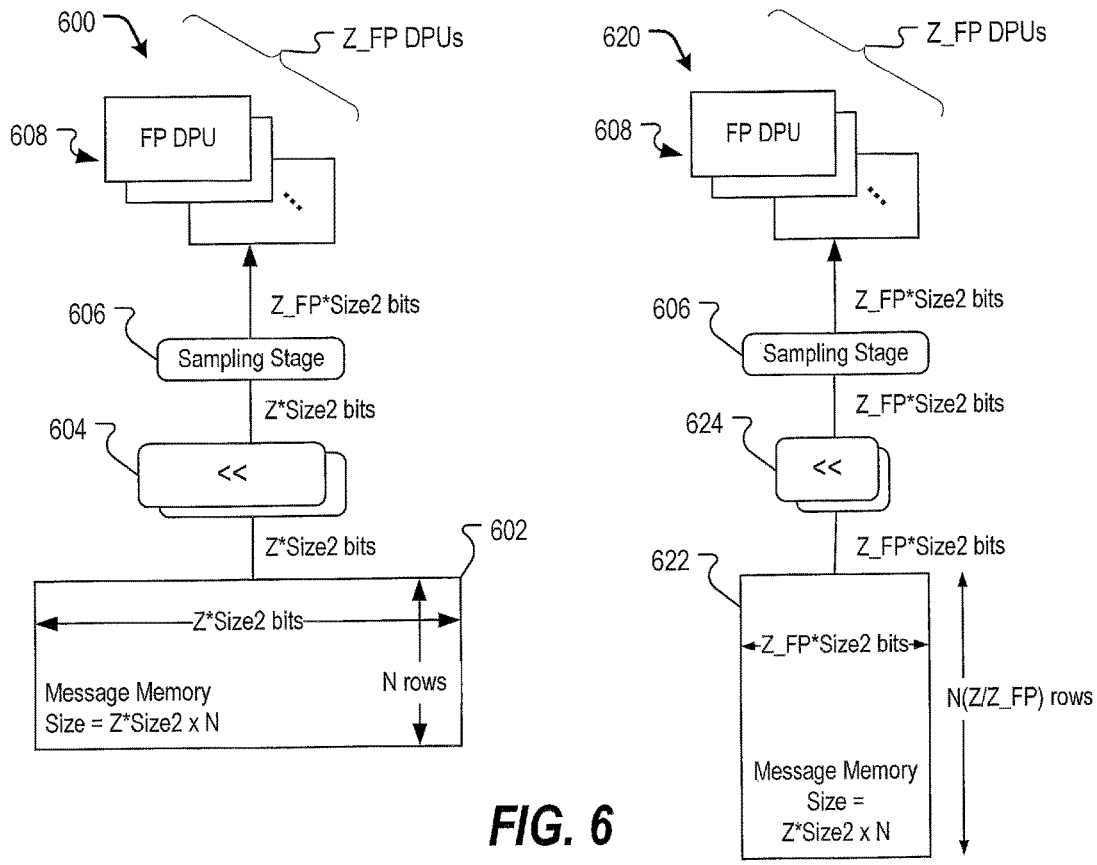
FIG. 6 is a diagram illustrating an example of components including a message memory that may be included in the data storage device of FIG. 1.

FIG. 6 depicts a comparison between two LDPC decoders 600 and 620 which use a QC-LDPC code with parallelism Z but are using a reduced number of $Z_{FP}$ DPU's. Decoder 600 includes a message memory 602, shifters 604, a sampling stage 606, and a set of $Z_{FP}$ DPUs 608. Decoder 600 has the message memory 602 sized to read Z messages of FP message size ("Size2" bits). The shifters 604 are sized to operate on the Z*Size2 bits read from the memory 602, the sampling stage 606 is sized to sample the $Z_{FP}$*Size2 bits to be sent to the DPUs 608. Decoder 620 includes a narrower message memory 622 than decoder 600 and shifters 624, with the memory 622 and the shifters 624 sized to accommodate $Z_{FP}$*Size2 bits rather than Z*Size2 bits. Decoder 600 does not use the Z-Gear LDPC EO-transform; therefore, the message data of size 7*Z (Z=512) is shifted across the entire row and the decoder 600 must read the full 7*Z messages, shift Z*7 messages, and then get the data sub-set. In decoder 620 that uses the Z-Gear EO-transform, the data is block-shifted and therefore may be stored in a much narrower memory, only 7*$Z_{FP}$ ($Z_{FP}$=64) bits are read every cycle, and only 7*$Z_{FP}$ bits are shifted and sampled. Thus, use of the EO transform may enable reduced component size and power consumption.

Figure 7:
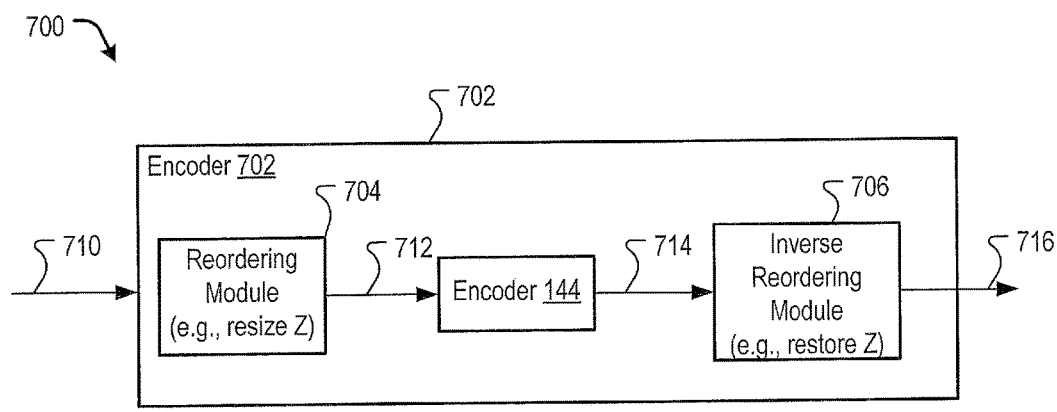
FIG. 7 is a diagram illustrating an example of an encoder that may be included in the data storage device of FIG. 1.

FIG. 7 depicts a Z gear LDPC engine encoder 702. The LDPC encoder 702 may include a reordering module 704, the encoder 144, and an inverse reordering module 706. The reordering module 704 may perform an EO transformation on input user data 710 (e.g., in chunks of 512 bits). Next a quasi-cyclic LDPC encoding is performed on the transformed data 712 by the encoder 144 with optionally the maximal Z value of the parity check matrix 142 to calculate parity bits. An inverse EO transformation is performed by the inverse reordering module 706 on the encoded data 714, and the resulting data and parity 716 are written to the memory 104.

Figure 8:
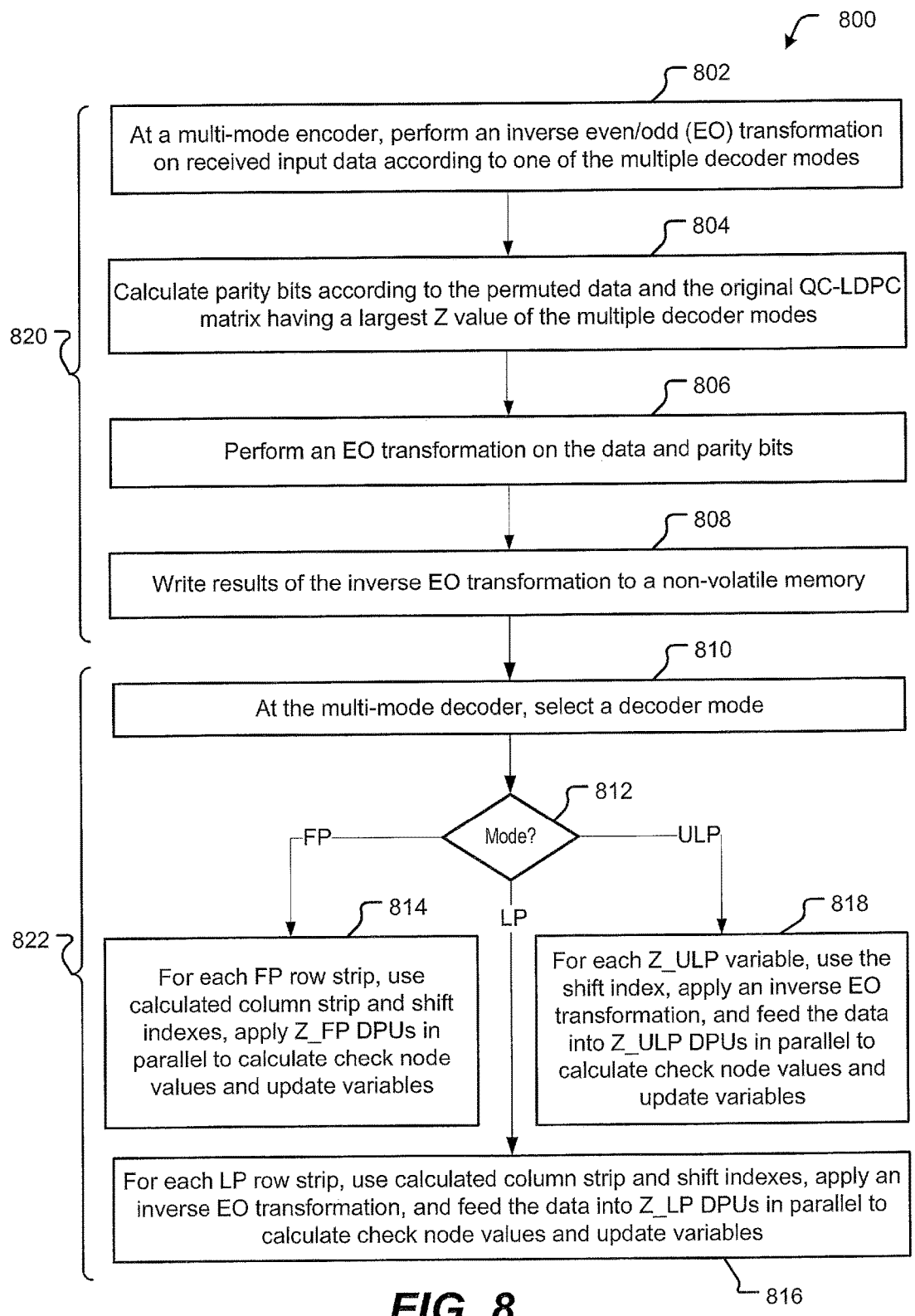
FIG. 8 is a flow diagram of a particular example of a method of operation that may be performed by the data storage device of FIG. 1.

Referring to FIG. 8, a particular illustrative example of a method of operation of a device is depicted and generally designated 800. The method 800 may be performed at a data storage device, such as at the controller 130 coupled to the memory device 103 of FIG. 1. For example, the method 800 may be performed at a high throughput and low power Z gear LDPC engine, such as the ECC engine 138, configured to process data using a varying number of DPUs in parallel, e.g., different Z values. The encoder and decoder may be described by a QC LDPC matrix with a "maximal" Z value.

The method 800 may include a first method 820 (corresponding to a method of encoding) and a second method 822 (corresponding to a method of decoding). For example, the first method 820 may be performed by an encoder, such as the encoder 144 of FIG. 1 or the encoder 702 of FIG. 7, and the second method 822 may be performed by a multi-mode decoder, such as the decoder 152 of FIG. 1. Although described as part of a single method 800, in other implementations, the first method 820 may be performed independent of the second method 822 and vice versa.

The method 800 includes, at the multi-mode encoder, performing an inverse even/odd (EO) transformation on received input data according to one of multiple decoder modes, at 802. For example, the inverse EO transformation may be performed by the reordering circuit 166 of FIG. 1 or by the reordering module 704 of FIG. 7. The method 800 includes calculating parity bits according to permuted data and an original QC-LDPC matrix having a largest Z value of the multiple decoder modes, at 804.

The method 800 includes performing an EO transformation on the data and parity bits, at 806, and writing the results of the EO transformation to a non-volatile memory, at 808. For example, the EO transformation may be performed by the reordering circuit 166 of FIG. 1 or by the reordering module 706 of FIG. 7. The non-volatile memory may include or correspond to the memory device 103 (e.g., the memory 104) of FIG. 1.

In another implementation the block 802 may perform an EO transformation and the block 806 may perform an EO transformation.

The method 800 also includes, at the multi-mode decoder, selecting a decoder mode, at 810. Processing may advance based on the selected mode, at 812. To illustrate, if the FP mode is selected at 810, the method 800 may include, for each FP row strip, using calculated column strip and shift indexes and applying $Z_{FP}$ DPUs in parallel to calculate check node value and update variables, at 814. Alternatively, if the LP mode is selected at 810, the method 800 may include, for each LP row strip, using calculated column strip and shift indexes, applying an inverse EO transformation, and feeding the data into $Z_{LP}$ DPUs in parallel to calculate check node values and update variables, at 816. If the ULP mode is selected at 810, the method 800 may include, for each $Z_{ULP}$, using the shift index, applying an inverse EO transformation, and feeding the data into $Z_{ULP}$ DPUs in parallel to calculate check node values and update variables, at 818.

By selecting a decoding mode and applying an EO transformation based on the selected decoding mode, adjustable amount of parallelism may be used by the multi-mode decoder. As a result, a number of DPUs for each mode may be selected based on power consumption, complexity, and frequency of use of the respective mode without storing multiple representations of the code for each mode. Further, by encoding permuted data, the encoded data may be stored in a configuration for efficient decoding in a selected decoding mode (e.g., an LP mode).

Figure 9:
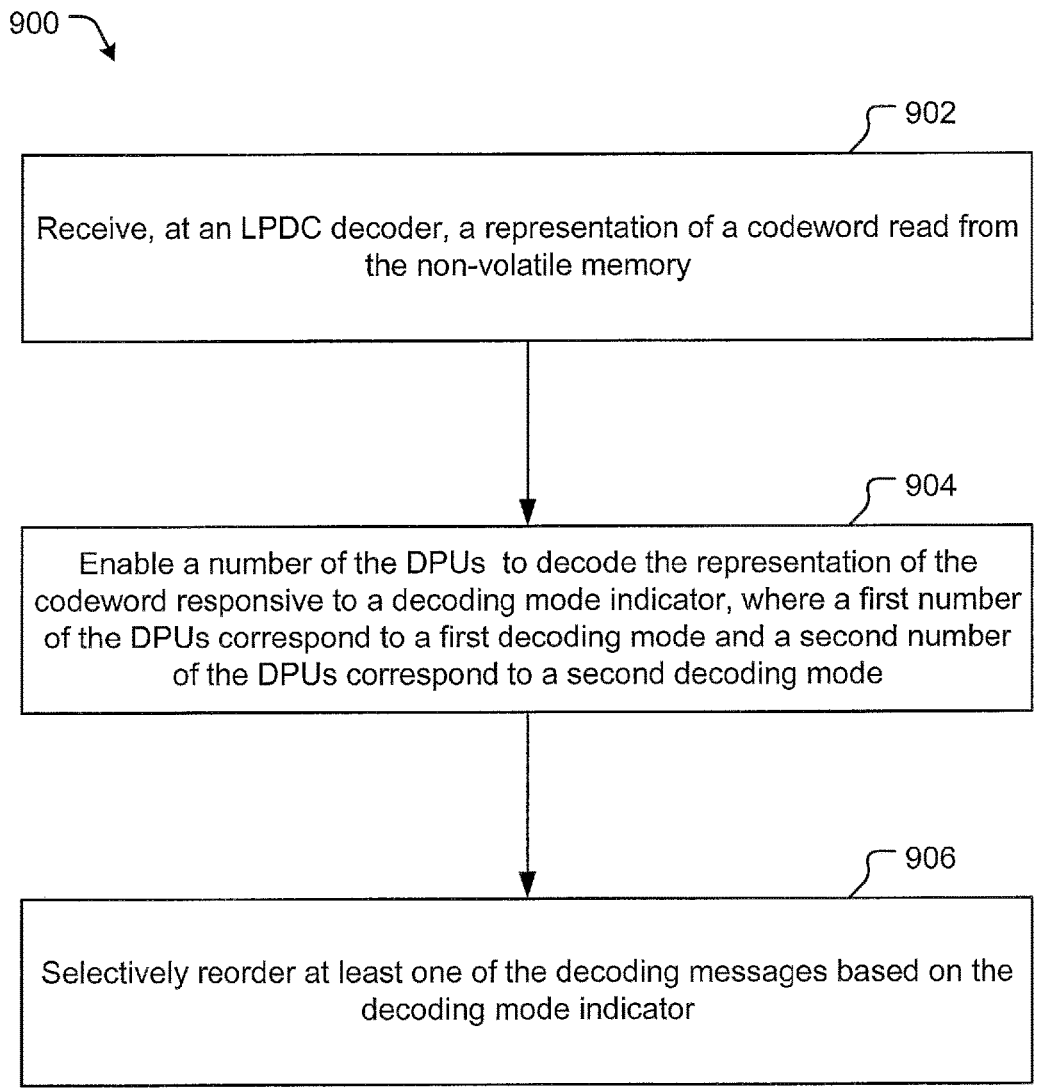
FIG. 9 is a flow diagram of another particular example of a method of operation that may be performed by the data storage device of FIG. 1.

Referring to FIG. 9, a particular illustrative example of a method of operation of a device is depicted and generally designated 900. The method 900 may be performed at a data storage device, such as at the decoder 152 of FIG. 1.

The method 900 includes receiving, at a low density parity check (LDPC) decoder, a representation of a codeword read from a non-volatile memory, at 902. For example, the LDPC decoder may include or correspond to the decoder 152 of FIG. 1. In some implementations, the LDPC decoder and the non-volatile memory may be included in the same device, such as the data storage device 102 of FIG. 1. For example, the non-volatile memory may include or correspond to the memory device 103 (e.g., the memory 104) of FIG. 1.

In some implementations, the LDPC decoder may include multiple data processing units (DPUs), a control circuit, a reordering circuit, a message memory configured to store decoding messages, or a combination thereof. For example, the multiple DPUs may include or correspond to the DPUs 165 of FIG. 1. The control circuit, the reordering circuit, and the message memory may include or correspond to the control circuit 140, the reordering circuit 166, and the message memory 158, respectively, of FIG. 1. In other implementations, one or more of the multiple data processing units (DPUs), a control circuit, a reordering circuit, or a message memory may be external to the LDPC decoder.

The method 900 also includes enabling a number of the DPUs to decode the representation of the codeword responsive to a decoding mode indicator, where a first number of the DPUs correspond to a first decoding mode and a second number of the DPUs correspond to a second decoding mode, at 904. For example, the decoding mode indicator may include or correspond to the ECC mode indicator 176 of FIG. 1. In some implementations, power consumption of the LDPC decoder per cycle of a decoder clock (e.g., the clock 172 of FIG. 1) in the first decoding mode may be substantially the same as in the second decoding mode.

The method 900 further includes selectively reordering at least one of the decoding messages based on the decoding mode indicator, at 906. For example, the reordering circuit 166 of FIG. 1 may be configured to perform reordering corresponding to one or more layers of EO transformation, such as described with reference to FIG. 4, to messages transferred between the message memory 158 and the enabled DPUs of the DPUs 165. In some implementations, reordering the at least one decoding message corresponds to transforming a quasi-cyclic LDPC (QC-LDPC) parity check matrix (e.g., the parity check matrix 142 of FIG. 1) having a first block matrix size to a second QC-LDPC parity check matrix having a second block matrix size.

In some implementations, the first decoding mode uses first decoding messages having a first size and the second decoding mode uses second decoding messages having a second size that is larger than the first size. In such implementations, the first number of DPUs may be greater than the second number of DPUs. Additionally, in a first illustrative example, the first decoding mode corresponds to a bit-flipping configuration (e.g., a ULP decoding mode) and the second decoding mode corresponds to an iterative message-passing decoding configuration. In the first illustrative example, the first size may be one bit. Alternatively, in a second illustrative example, the first decoding mode corresponds to a first iterative message-passing decoding configuration (e.g., a LP decoding mode) and the second decoding mode corresponds to a second iterative message-passing decoding configuration (e.g., a FP decoding mode). In the second illustrative example, the first number may be twice the second number, and the second size may be twice the first size. Numbers of active DPUs in each particular decoding mode may be set to be inversely proportional to average power consumption of the active DPUs in the particular decoding mode, proportional to a frequency of use of the particular decoding mode, inversely proportional to message resolution of the active DPUs in the particular decoding mode, or any combination thereof.

In some implementations, in the first decoding mode the LDPC decoder processes a first permuted version of the representation of the codeword, and in the second decoding mode the LDPC decoder processes a second permuted version of the representation of the codeword. In the first decoding mode, the LDPC decoder may be configured to process the representation of the codeword based on a first permuted version of a quasi-cyclic LDPC (QC-LDPC) parity check matrix, and in the second decoding mode the LDPC decoder is configured to process the representation of the codeword based on a second permuted version of the QC-LDPC parity check matrix. In another implementation, in the first decoding mode the LDPC decoder is configured to process the representation of the codeword based on a first quasi-cyclic LDPC (QC-LDPC) parity check matrix, and in the second decoding mode the LDPC decoder is configured to process the representation of the codeword based on a second QC-LDPC parity check matrix.

Figure 10:
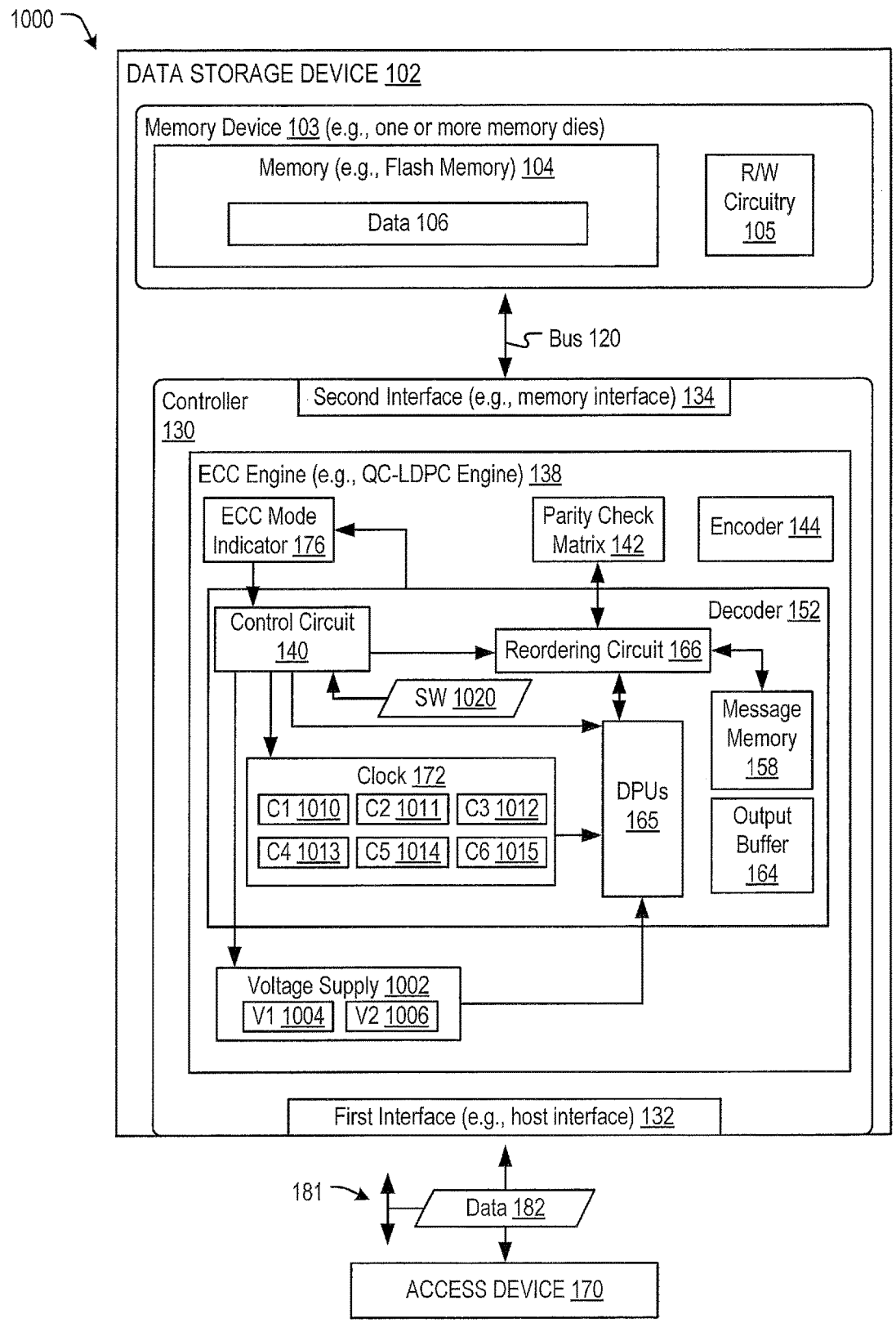
FIG. 10 is a block diagram of an illustrative example of a system including the data storage device of FIG. 1 that includes the ECC decoder that supports multiple decoding modes with multiple degrees of parallelism and that further supports a reduced-power configuration of one or more of the multiple decoding modes.

FIG. 10 depicts an illustrative example of a system 100 that includes the data storage device 102 and the access device 170 of FIG. 1. The decoder 152 of the data storage device 102 is configured to operate in multiple decoding modes having different levels of parallelism, as described with reference to FIG. 1. One or more components of the decoder 152 are also configurable, for each of the decoding modes, to operate in a full-power configuration associated with the decoding mode or to operate in one or more reduced-power configurations associated with the decoding mode. In the reduced-power configurations, one or more components of the decoder 152 are adjusted to reduce power consumption during decoding.

The decoder 152 includes control circuit 140, the clock 172, the reordering circuit 166, the DPUs 165, the message memory 158, and the output buffer 164 of FIG. 1. The decoder 152 also includes a voltage supply 1002 coupled to the control circuit 140 and to the DPUs 165.

The control circuit 140 is configured to receive an error metric 1020, such as a syndrome weight, and to generate one or more control signals to selectively set one or more components of the decoder 152 to operate in a full-power configuration or a reduced power configuration associated with a selected decoding mode. For example, the control circuit 140 may generate a control signal to indicate a number of the DPUs 165 to be enabled, a control signal to the clock 172 to indicate a clock frequency to be used during decoding, a control signal to the voltage supply 1002 to indicate a supply voltage to be used during decoding, or any combination thereof.

The control circuit 140 is responsive to the ECC decoding mode indicator 176 and to the error metric 1020. To illustrate, the control circuit 140 is configured to enable decoding of a representation of a codeword according to a decoding mode that is indicated by the ECC decoding mode indicator 176. For example, the ECC decoding mode indicator 176 may indicate the ULP mode, the LP mode, or the FP mode. The control circuit 140 configures the DPUs 165 according to the decoding mode indicated by the ECC decoding mode indicator 176, such as by enabling one or more groups of DPUs (e.g., enabling different numbers of DPUs) based on the indicated decoding mode. Each indicated decoding mode may be associated with a particular number of enabled DPUs, such as 128 DPUs for ULP, 32 DPUs for LP, and 16 DPUs for FP, in a "full-power" configuration of the DPUs for the indicated decoding mode. As described further below, one or more "reduced-power" configurations of the DPUs for a particular mode may include fewer enabled DPUs than the full-power, or default, configuration for the particular mode.

The control circuit 140 is configured to selectively set a reduced-power configuration of one or more components of the decoder 152 at least partially based on whether the error metric 1020 exceeds a threshold. For example, as described further with reference to FIG. 11, decoding codewords using a reduced-power configuration associated with a decoding mode (e.g., a reduced-power configuration associated with the ULP mode) may increase an average decoding time of the codewords as compared to decoding using the full-power configuration associated with the decoding mode (e.g., a full-power configuration associated with the ULP mode). Because the decoding time for a codeword is approximately proportional to the number of errors in the codeword, the decoding time for codewords with high error rates may satisfy a throughput time limit of the decoder 152 using the full-power configuration associated with the decoding mode but may exceed the throughput time limit using the reduced-power configuration associated with the decoding mode. In some implementations, the control circuit 140 is configured to compare the error metric 1020 corresponding to a particular codeword to one or more thresholds to determine whether to use a full-power configuration or a reduced-power configuration to decode the codeword.

In a particular implementation, a reduced-power configuration associated with a decoding mode includes configuring the decoder 152 to decode based on a reduced amount of parallelism, including a reduced number of the DPUs 165, as compared to the full-power configuration associated with the decoding mode. As explained with reference to FIG. 1, the reordering circuit 166 is configured to selectively reorder at least one of the decoding messages based on the decoding mode, and the control circuit 140 may select a number of DPUs for decoding in the particular decoding mode. In a particular implementation, the control circuit 140 is configured to reduce the parallelism for decoding using the decoding mode and may send a control signal to the DPUs 165 to enable a reduced number the DPUs. In addition, the reordering circuit 166 is further configured to selectively reorder decoding messages in response to receiving a control signal from the control circuit 140 that indicates decoding according to a reduced-power configuration associated with the decoding mode. For example, the decoder 152 may be configured to process the representation of the codeword based on the QC-LDPC parity check matrix 142 that has a first block matrix size according to the decoding mode (e.g., a first matrix size for the ULP mode). The reordering circuit 166 may be further configured to selectively reorder the decoding messages in the reduced-power configuration associated with the decoding mode to transform the QC-LDPC parity check matrix to a second QC-LDPC parity check matrix having a second block matrix size smaller than the first block matrix size.

The clock 172 is configured to generate one or more clock signals responsive to the control circuit 140. As illustrated, the clock 172 is configured to generate multiple clock signals including a first clock signal 1010, a second clock signal 1011, a third clock signal 1012, a fourth clock signal 1013, a fifth clock signal 1014, and a sixth clock signal 1015.

The first clock signal 1010 and the second clock signal 1011 are used during ULP decoding. The first clock signal 1010 has a first clock frequency and the second clock signal 1011 has a second frequency that is less than the first clock frequency. The first clock signal 1010 may be provided (e.g., generated and output) by the clock 172 during decoding in the ULP mode using a full-power configuration, and the second clock signal 1011 is provided by the clock 172 during decoding in the ULP mode using a reduced-power configuration. The lower clock frequency of the second clock signal 1011 reduces power consumption of circuit elements during decoding and also increases a decoding time as compared to the first clock signal 1010.

The third clock signal 1012 and the fourth clock signal 1013 are used during LP decoding. For example, the third clock signal 1012 may have a higher frequency than the fourth clock signal 1013. The third clock signal 1012 may be used in a full-power configuration during decoding according to the LP mode, and the fourth clock signal 1013 may be used in a reduced-power configuration during decoding according to the LP mode.

The fifth clock signal 1014 and the sixth clock signal 1015 are used during FP decoding. For example, the fifth clock signal 1014 may have a higher frequency than the sixth clock signal 1015. The fifth clock signal 1014 may be used in a full-power configuration during decoding according to the FP mode, and the sixth clock signal 1015 may be used in a reduced-power configuration during decoding according to the FP mode.

The voltage supply 1002 is configured to provide one of a first supply voltage 1004 and a second supply voltage 1006 to the DPUs 165 based on a control signal from the control circuit 140. The second supply voltage 1006 is lower than the first supply voltage 1004 and may be provided in a reduced-power configuration associated with one or more of the decoding modes. For example, using a lower supply voltage may reduce static and dynamic power consumption as compared to using a higher supply voltage, and may also slow circuit performance (e.g., reduce switching speeds of transistors and digital logic circuitry) as compared to the higher supply voltage.

During operation, the control circuit 140 receives a particular codeword to be decoded and also receives the ECC mode indicator 176 and the error metric 1020 for the codeword that is to be decoded. For example, the ECC engine 138 may include a syndrome generator circuit that computes a syndrome weight (e.g., a count of unsatisfied parity checks) of the codeword. The control circuit 140 may configure the decoder 152 for decoding according to the indicated decoding mode (e.g., ULP, LP, or FP) and may also select whether the decoder 152 is to operate in a full-power or reduced-power configuration for decoding according to the decoding mode.

In response to detecting that a value of the error metric 1020 is less than a threshold value, the control circuit 140 may generate one or more control signals to configure one or more components of the decoder 152 in a reduced-power configuration. In a particular implementation, the control circuit 140 reduces the amount of parallelism by reducing the number of DPUs and causing the reordering circuit 166 to reorder decoding messages to enable decoding using the reduced parallelism. For example, the ECC engine 138 may be configured to perform decoding according to the ULP mode using 128 DPUs (e.g., a full-power ULP configuration), the LP mode using 32 DPUs (e.g., a full-power LP configuration), and the FP mode using 16 DPUs (e.g., a full-power FP configuration). In response to the ECC mode indicator 176 indicating the ULP mode and the error metric 1020 having a value indicating a relatively low number of errors in the codeword, the control circuit 140 may configure the decoder 152 to operate in a reduced-power ULP mode that enables (e.g., activates) 64 of the 128 DPUs of the ULP mode.

In another particular implementation, instead of reducing the parallelism and the number of DPUs, the control circuit 140 may generate one or more control signals to configure the decoder 152 in a reduced-power configuration with a reduced decoding clock frequency. For example, the In response to the ECC mode indicator 176 indicating the ULP mode and the error metric 1020 having a value indicating a relatively low number of errors in the codeword, the control circuit 140 may configure the decoder 152 to operate in a reduced-power ULP mode where decoding is performed according to the second clock signal 1011 rather than the first clock signal 1010.

In another particular implementation, instead of reducing the parallelism or the clock frequency, the control circuit 140 may generate one or more control signals to configure the decoder 152 in a reduced-power configuration with a reduced supply voltage. For example, in response to the ECC mode indicator 176 indicating the ULP mode and the error metric 1020 having a value indicating a relatively low number of errors in the codeword, the control circuit 140 may configure the decoder 152 to operate in a reduced-power ULP mode where decoding is performed by DPUs receiving the second supply voltage 1006 rather than the first supply voltage 1004.

In some implementations, a reduced-power configuration of the decoder 152 includes reducing the number of DPUs in addition to reducing the clock frequency without reducing the supply voltage, reducing the number of DPUs in addition to reducing the supply voltage without reducing the clock frequency, or reducing the clock frequency and the supply voltage without reducing the number of DPUs. In other implementations, a reduced-power configuration of the decoder 152 includes reducing the number of DPUs, the clock frequency, and the supply voltage.

Because data read from the memory 104 may exhibit relatively low bit error rates during most of the lifetime of the memory device 103, the decoder 152 may primarily operate in the ULP mode with relatively high throughput and low power consumption as compared to the LP and FP modes. For lower power consumption, the parallelism can be adjusted dynamically (e.g., on-the-fly, on a codeword-by-codeword basis) in the ULP mode, according to the number of errors to be corrected, to reduce the number of DPUs that are used while satisfying a throughput time limit, as described further in FIG. 11. Similarly, parallelism may also be adjusted in LP and FP modes for reduced power consumption.

Alternatively, or in addition, power savings may be accomplished via changing the decoding clock frequency. For example, a relationship between a signal toggling frequency and dynamic power consumption may expressed as in Equation 3, where $C_{eff}$ is effective capacitance of the load, $V_{dd}^2$ is power supply voltage, and $f_c$ is clock frequency.

$$P_{dyn} = C_{eff} V_{dd}^2 f_c \qquad \text{Eq. 3}$$

Frequency reduction may be achieved by periodically masking the clock pulses according to the frequency/power reduction criteria. For example, the clock 172 may implement an adjustable pulse swallow divider circuit to generate one or more of the clock signals 1010-1015.

By reducing peak power consumption at the ECC engine 138, more power may be available to other components of the controller 130 that share a power supply with the ECC engine 138. Thus performance bottlenecks of the data storage device 102 related to power availability may be reduced and overall performance of the data storage device 102 may be improved.

Although the clock 172 is described as providing six distinct clock signals 1010-1015 to accommodate two power configurations associated with each of three decoding modes, in other implementations the clock 172 may provide fewer clock signals. To illustrate, in some implementations the full-power mode associated with two or more of the decoding modes (e.g., the LP mode and the FP mode) may use a common clock signal (e.g., the third clock signal 1012 may be used in place of the fifth clock signal 1014). As another example, in some implementations the reduced-power configurations associated with two or more of the decoding modes (e.g., the ULP and the LP modes) may use a common clock signal (e.g., the second clock signal 1011 may be used in place of the fourth clock signal 1013). In some implementations, the clock 172 is configured to provide multiple reduced-frequency clock signals to support multiple reduced-power configurations for a particular decoding mode (e.g., the ULP mode). An example of multiple reduced-power configurations for a decoding mode is described with reference to FIG. 11.

Although the voltage supply 1002 is described as having two supply voltages 1004-1006, in other implementations the voltage supply 1002 may be configured to provide one or more additional supply voltages. For example, in some implementations the voltage supply 1002 is configured to provide multiple supply voltages to support multiple reduced-power configurations for a particular decoding mode (e.g., the ULP mode). An example of multiple reduced-power configurations for a decoding mode is described with reference to FIG. 11. As another example, in some implementations the voltage supply 1002 provides three distinct supply voltages to support decoding in a full-power configuration for each of the ULP, LP, and FP decoding modes and also provides three additional distinct supply voltages to support decoding in a reduced-power configuration for each of the ULP, LP, and FP decoding modes.

Figure 11:
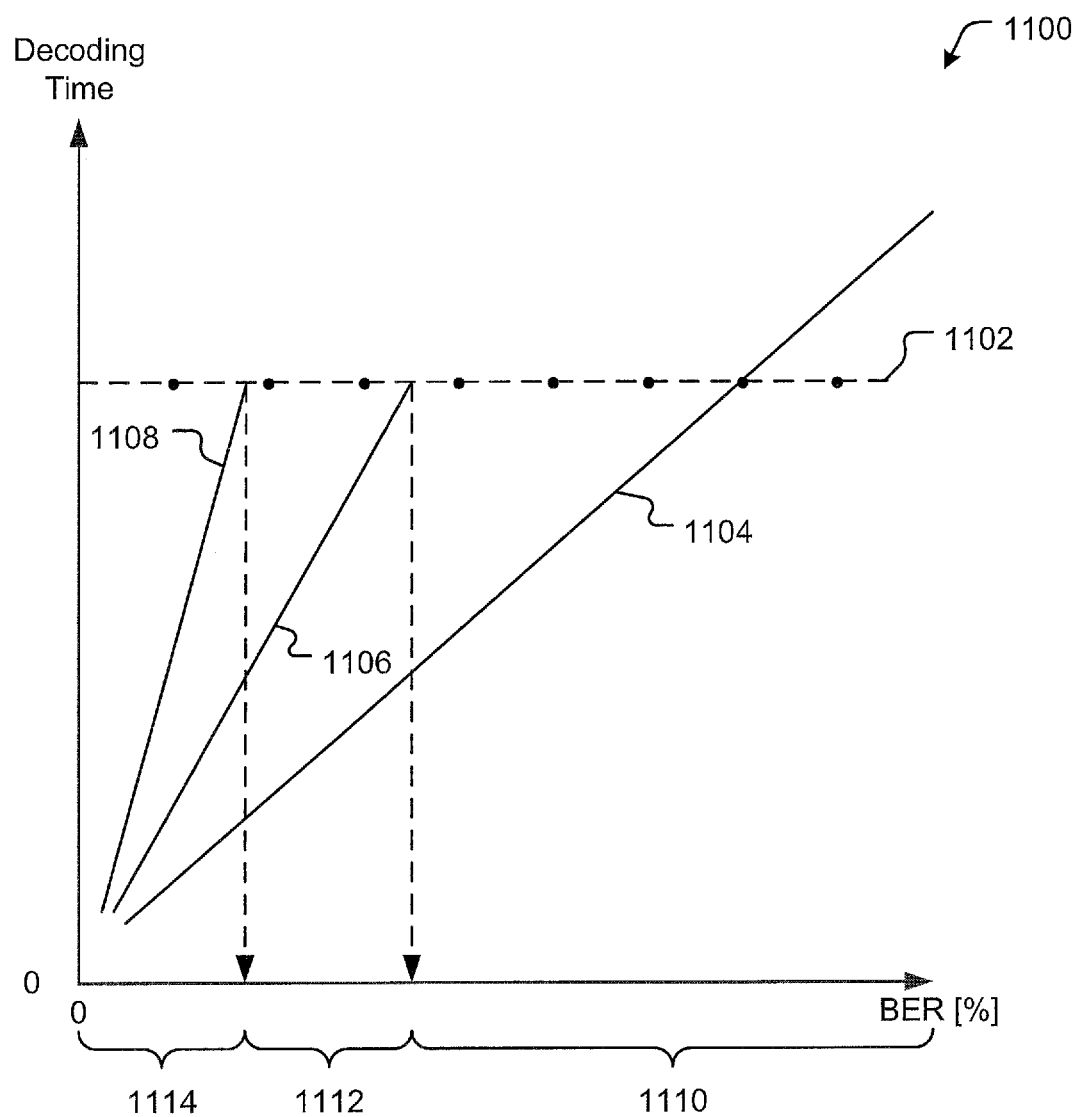
FIG. 11 is a diagram illustrating an example of decoding characteristics of the ECC decoder of FIG. 10 at multiple power configurations of a decoding mode.

Referring to FIG. 11, an illustrative chart 1100 depicts examples of decoding times (latencies) corresponding to an associated bit error rate. As illustrated, the vertical axis indicates decoding time, and a horizontal axis indicates bit error rate. A decoding time limit 1102 is illustrated as a horizontal line corresponding to a threshold decoding time. For example, the limit 1102 may indicate a largest acceptable decoding latency that maintains a throughput criterion of the ECC decoder.

A first trace 1104 illustrates an example of a relationship between decoding time and bit error rate for a particular decoding mode of the decoder 152 using a full power configuration associated with that particular decoding mode. For example, in an implementation where the graph 1100 corresponds to a ULP decoding mode, the first trace 1104 corresponds to the relationship between decoding time and bit error rate using the number of DPUs Z_ULP and using the full clock frequency for the ULP decoding mode. As the bit error rate decreases below a first range 1110 and into a second range 1112, the decoding time decreases to a value that is less than half of the limit 1102. As a result, when the bit error rate is estimated as being below the first range 1110, one or more components of the decoder 152 may be configured by the control circuit 140 into a lower power configuration, which may include reducing decoding resources, such as by reducing the number of DPUs, reducing the clock frequency, reducing one or more other decoding resources, or a combination thereof.

For example, a second trace 1106 represents a second relationship between decoding time and bit error rate for a reduced-power configuration associated with the decoding mode. In a first implementation, the reduced-power configuration corresponds to operating the decoder 152 using half the parallelism of the full-power configuration of the decoding mode. For example, in a ULP decoding mode, the reduced power configuration may correspond to using a number of DPUs=$Z\_ULP/2^n$. As illustrated, the second trace 1106 has a slope of approximately twice the slope of the first trace 1104 and indicates that, for a given bit error rate, an amount of decoding time in the reduced-power mode is approximately twice the amount of decoding time in the full-power mode. Thus, when the bit error rate is below the first range 1110, e.g., in the second range 1112, the control circuit 140 may configure the decoder 152 to operate in the reduced-power configuration to perform decoding with a decoding time indicated by the second trace 1106.

A third trace 1108 illustrates a relationship between decoding time and bit error rate for a second reduced-power configuration associated with the particular decoding mode. For example, the third trace 1108 may correspond to having a second reduced number of DPUs, having a second reduced clock frequency, or a combination thereof, as compared to the reduced-power configuration corresponding to the second trace 1106. As illustrated, when the bit error rate is below the second range 1112 and is within a third range 1114, decoding may be performed using the second reduced power configuration without exceeding the limit 1102 for decoding time.

Thus, the control circuit 140 may be configured to select one of the default power configuration associated with the first trace 1104, the reduced-power configuration associated with the second trace 1106, or the second reduced-power configuration associated with the third trace 1108. Selection of one of the configurations associated with the traces 1104, 1106, 1108 may be based on comparing an estimated bit error rate of a codeword to be decoded with one or more of the first range 1110, the second range 1112, and the third range 1114. The control circuit 140 may therefore be configured to reduce a power usage associated with decoding the codeword, such as by reducing the number of enabled DPUs that perform computations during decoding, by reducing the decoding clock frequency during decoding, by reducing the supply voltage provided to the DPUs, or a combination thereof, while satisfying a criterion that the limit 1102 is not exceeded during decoding.

Figure 12:
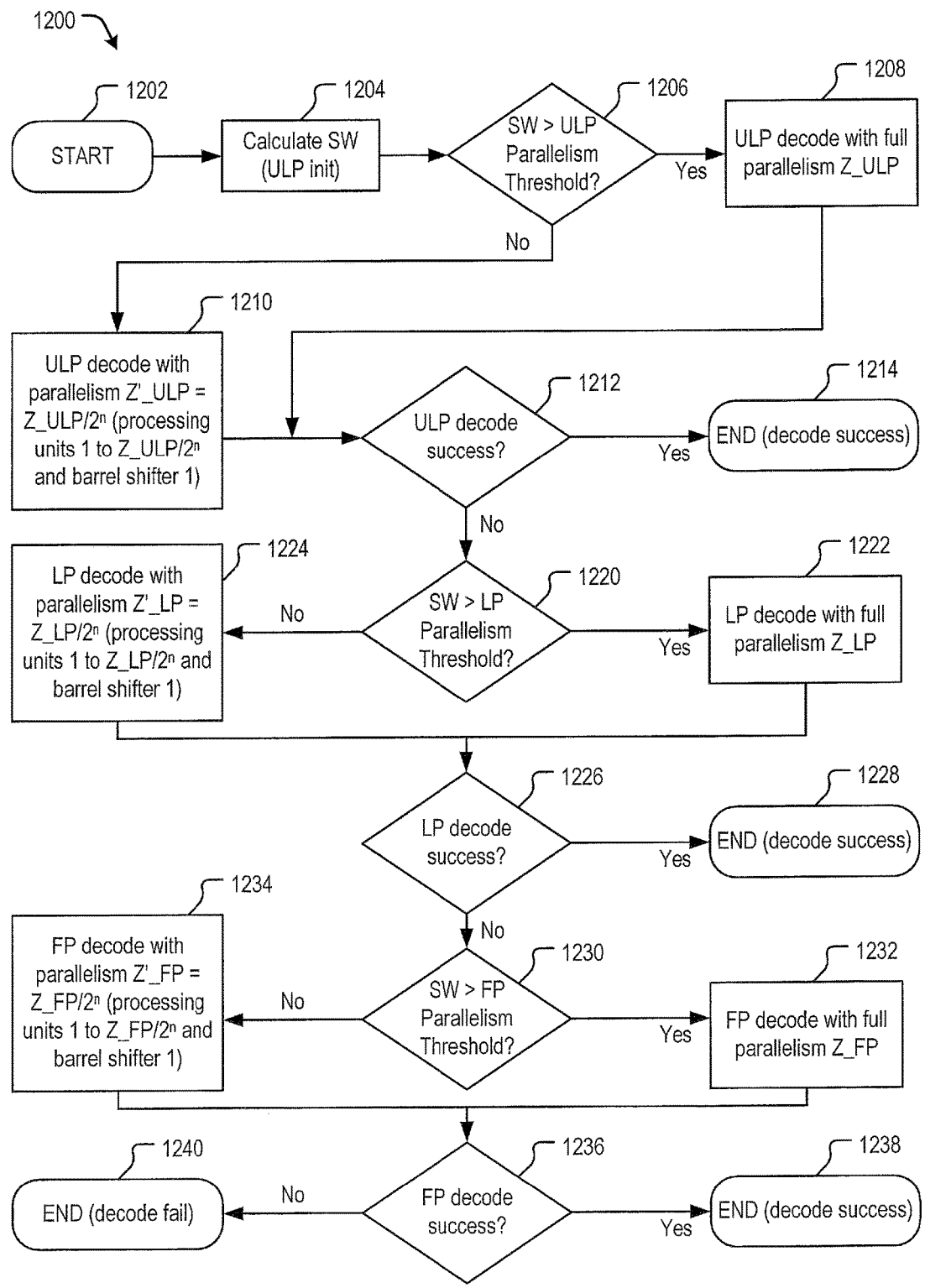
FIG. 12 is a flow diagram of a particular example of a method of operation that may be included in the data storage device of FIG. 10.

FIG. 12 illustrates an example 1200 of a method of operation that may be performed at the decoder 152 of FIG. 10. The method may begin, at 1202, where a codeword may be received to be decoded. A syndrome weight of the codeword may be determined, at 1204, and a ULP decoding mode may be initiated.

A determination may be made, at 1206, as to whether the syndrome weight exceeds a ULP parallelism threshold, at 1206. For example, the ULP parallelism threshold may correspond to the boundary between the first range 1110 and the second range 1112 of FIG. 11, and may indicate a threshold syndrome weight below which a reduced-power configuration may be expected to complete decoding without exceeding a time limit, such as the limit 1102 of FIG. 11.

In response to the syndrome weight exceeding the ULP parallelism threshold, at 1206, a ULP decode operation is performed with the full parallelism Z_ULP, at 1208. Otherwise, when the syndrome weight is not greater than the ULP parallelism threshold, a ULP decode operation is performed with reduced ULP parallelism Z'_ULP=Z_ULP/2n, at 1210. For example, the ULP decode with the parallelism Z'_ULP may correspond to the reduced-power configuration described with reference to FIG. 10 and FIG. 11, which may reduce the number of DPUs to one-half of the full ULP parallelism and may reconfigure associated hardware to perform decoding and adjust default ULP reordering and shifting of messages to accommodate the reduced parallelism in the code.

After decoding with the full ULP parallelism, at 1208, or with a reduced parallelism, at 1210, a determination may be made whether the ULP decode was successful, at 1212. In response to the ULP decode being successful, the method 1200 ends, at 1214, with a successful decoding of the codeword.

Otherwise, when the ULP decode is not successful, a determination is made as to whether the syndrome weight exceeds an LP parallelism threshold, at 1220. In response to the syndrome weight exceeding the LP parallelism threshold, at 1220, an LP decode operation is performed with full LP parallelism Z_LP, at 1222. Otherwise, when the syndrome weight is not greater than the LP parallelism threshold, an LP decode operation may be performed with reduced LP parallelism Z'_LP=Z_LP/2n, at 1224. After completion of the LP decoding, a determination is made whether the LP decoding was successful, at 1226. In response to the LP decoding being successful, the method 1200 ends with a successful decoding of the codeword, at 1228.

Otherwise, a determination is made whether the syndrome weight exceeds the FP parallelism threshold, at 1230. In response to the syndrome weight exceeding the FP parallelism threshold, an FP decode operation is performed with full FP parallelism Z_FP, at 1232. Otherwise, an FP decode operation is performed with reduced FP parallelism Z'_FP=Z_FP/2n, at 1234.

After completion of the FP decoding, a determination is made whether the FP decoding was successful, at 1236. If the FP decoding was successful, the method 1200 ends, at 1238, with a decode success. Otherwise, the method 1200 ends at 1240, with a decoding failure.

Although the method 1200 of FIG. 12 illustrates, for each of the ULP, LP, and FP mode, selectively choosing a full parallelism or a reduced parallelism for that particular mode, in other implementations more than two parallelism configurations per decoding mode may be available. For example, as described with reference to FIG. 11, bit error rate (or syndrome weight) may be divided into three or more regions corresponding to three or more power configurations of a single decoding mode. For example, the decision 1206 may include a first comparison as to whether the syndrome weight corresponds to a bit error rate in the first range 1110 of FIG. 11, and a second comparison as to whether the syndrome weight corresponds to a bit error rate within the second range 1112. A determination at the decision 1206 may route the processing of the method to one of the three power configurations of the ULP decoding mode.

Although the method 1200 of FIG. 12 illustrates first attempting decoding using the ULP mode, followed by attempting decoding using the LP mode, followed by attempting decoding using the FP mode, in other implementations an initial decoding attempt may be made using the LP mode or the FP mode, rather than the ULP mode, based on the syndrome weight. For example, a determination may be made that the syndrome weight exceeds a threshold corresponding to a likelihood of successful decoding using the LP mode, and decoding may instead initiate using the LP mode or the FP mode. Further, although three decoding modes are illustrated in FIG. 12, it should be understood that in other implementations, fewer than three decoding modes or more than three decoding modes may be implemented, with one or more of the decoding modes being configurable to operate in a default power configuration or in one or more reduced-power configurations, such as described with reference to FIGS. 10-11.

Figure 13:
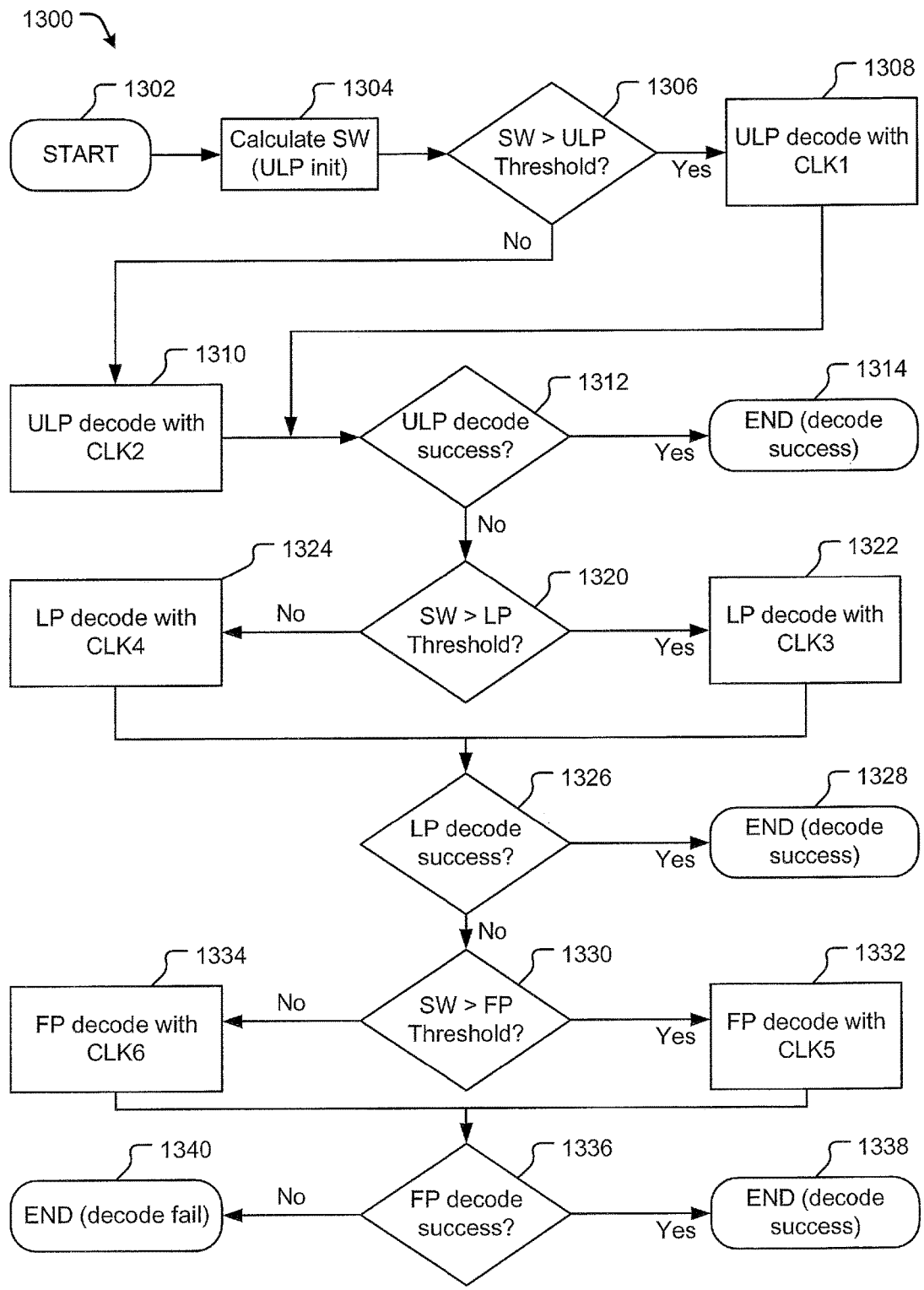
FIG. 13 is a flow diagram of another particular example of a method of operation that may be included in the data storage device of FIG. 10.

FIG. 13 illustrates an example 1300 of a method of operation that may be performed at the decoder 152 of FIG. 10. The method may begin, at 1302, where a codeword may be received to be decoded. A syndrome weight of the codeword may be determined, at 1304, and a ULP decoding mode may be initiated.

A determination may be made, at 1306, as to whether the syndrome weight exceeds a ULP threshold, at 1306. For example, the ULP threshold may correspond to the boundary between the first range 1110 and the second range 1112 of FIG. 11, and may indicate a threshold syndrome weight below which a reduced-power configuration may be expected to complete decoding without exceeding a time limit, such as the limit 1102 of FIG. 11.

In response to the syndrome weight exceeding the ULP threshold, at 1306, a ULP decode operation is performed with the first clock signal 1010, at 1308. Otherwise, when the syndrome weight is not greater than the ULP threshold, a ULP decode operation is performed with the second clock signal 1011, at 1210. For example, the ULP decode using the second clock signal 1011 may correspond to the reduced-power configuration described with reference to FIG. 10 and FIG. 11.

After decoding with the first clock 1010, at 1308, or with the second clock 1011, at 1310, a determination may be made whether the ULP decode was successful, at 1312. In response to the ULP decode being successful, the method 1300 ends, at 1314, with a successful decoding of the codeword.

Otherwise, when the ULP decode is not successful, a determination is made as to whether the syndrome weight exceeds an LP threshold, at 1320. In response to the syndrome weight exceeding the LP threshold, at 1320, an LP decode operation is performed with the third clock 1012, at 1322. Otherwise, when the syndrome weight is not greater than the LP threshold, an LP decode operation may be performed with the fourth clock 1013, at 1324. After completion of the LP decoding, a determination is made whether the LP decoding was successful, at 1326. In response to the LP decoding being successful, the method 1300 ends with a successful decoding of the codeword, at 1328.

Otherwise, a determination is made whether the syndrome weight exceeds the FP threshold, at 1330. In response to the syndrome weight exceeding the FP threshold, an FP decode operation is performed with the fifth clock 1014, at 1332. Otherwise, an FP decode operation is performed with the sixth clock 1015, at 1334.

After completion of the FP decoding, a determination is made whether the FP decoding was successful, at 1336. If the FP decoding was successful, the method 1300 ends, at 1338, with a decode success. Otherwise, the method 1300 ends at 1340, with a decoding failure.

Although the method 1300 of FIG. 13 illustrates, for each of the ULP, LP, and FP mode, selectively choosing a faster clock signal or a slower clock signal for that particular mode, in other implementations more than two clock frequencies per decoding mode may be available. For example, as described with reference to FIG. 11, bit error rate (or syndrome weight) may be divided into three or more regions corresponding to three or more power configurations of a single decoding mode. For example, the decision 1206 may include a first comparison as to whether the syndrome weight corresponds to a bit error rate in the first range 1110 of FIG. 11, and a second comparison as to whether the syndrome weight corresponds to a bit error rate within the second range 1112. A determination at the decision 1306 may route the processing of the method to one of the three clock signals of the ULP decoding mode.

Although the method 1300 of FIG. 13 illustrates first attempting decoding using the ULP mode, followed by attempting decoding using the LP mode, followed by attempting decoding using the FP mode, in other implementations an initial decoding attempt may be made using the LP mode or the FP mode, rather than the ULP mode, based on the syndrome weight. For example, a determination may be made that the syndrome weight exceeds a threshold corresponding to a likelihood of successful decoding using the LP mode, and decoding may instead initiate using the LP mode or the FP mode. Further, although three decoding modes are illustrated in FIG. 13, it should be understood that in other implementations, fewer than three decoding modes or more than three decoding modes may be implemented, with one or more of the decoding modes being configurable to operate in a default power configuration or in one or more reduced-power configurations, such as described with reference to FIGS. 10-11.

Figure 14:
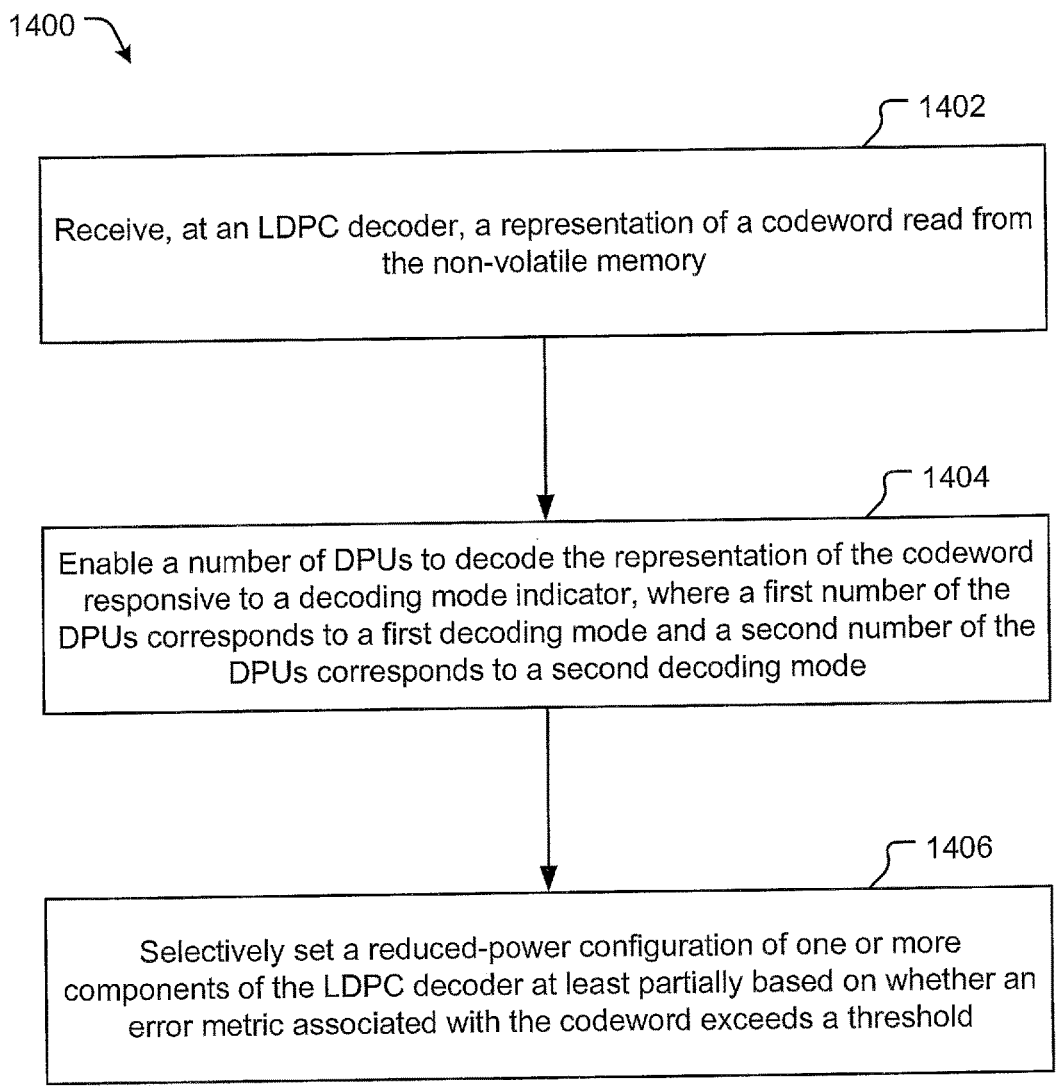
FIG. 14 is a flow diagram of another particular example of a method of operation that may be included in the data storage device of FIG. 10.

FIG. 14 depicts an illustrative example of a method 1400 of operation at a device including a non-volatile memory and a low density parity check (LDPC) decoder that includes multiple data processing units (DPUs). For example, the method 1400 may be performed at the ECC engine 138 of FIG. 10.

The method 1400 includes receiving, at the LDPC decoder, a representation of a codeword read from the non-volatile memory, at 1402. A number of the DPUs are enabled to decode the representation of the codeword responsive to a decoding mode indicator, at 1404. A first number of the DPUs corresponds to a first decoding mode and a second number of the DPUs corresponds to a second decoding mode. For example, 128 DPUs may be enabled in a ULP mode, 32 DPUs may be enabled in a LP mode, and 16 DPUs may be enabled in a FP mode.

The method 1400 includes selectively setting a reduced-power configuration of one or more components of the LDPC decoder at least partially based on whether an error metric associated with the codeword exceeds a threshold, at 1406. For example, when the error metric includes a syndrome weight that is less than or equal to the threshold, the control circuit 140 may generate one or more control signals to components of the decoder 152 (e.g., to the DPUs 165, the voltage supply 1002, the clock 172, or any combination thereof) to configure the component in a reduced-power configuration associated with the first decoding mode.

In a first illustrative example, in the first decoding mode a first number of DPUs are enabled, and in the reduced-power configuration a second number of DPUs are enabled. The second number is less than the first number. For example, 128 DPUs may be enabled in a full-power configuration of the DPUs in the ULP mode, and 64 DPUS may be enabled in a reduced-power configuration of the DPUs in the ULP mode.

In a second illustrative example, in the first decoding mode the DPUs receive a first clock signal having a first clock frequency, and in the reduced-power configuration the DPUs receive a second clock signal having a second clock frequency. The second clock frequency is less than the first clock frequency. For example, the clock 172 may generate the first clock signal 1010 in a full-power configuration of the clock 172 in the ULP mode, and the clock 172 generate the second clock signal 1011 in a reduced-power configuration of the clock 172 in the ULP mode.

In a third illustrative example, in the first decoding mode a first supply voltage is provided to the DPUs, and in the reduced-power configuration a second supply voltage is provided to the DPUs. The second supply voltage less than the first supply voltage. For example, the voltage supply 1002 may provide the first voltage 1004 in a full-power configuration of the voltage supply 1002 in the ULP mode, and the voltage supply 1002 may generate the second voltage 1006 in a reduced-power configuration of the voltage supply 1002 in the ULP mode.

In some implementations, the method 1400 includes selectively reordering at least one decoding message according to a first degree of parallelism and responsive to the decoding mode indicator, and the reduced-power configuration includes selectively reordering the at least one decoding message according to a second degree of parallelism. The representation of the codeword is processed based on a quasi-cyclic LDPC (QC-LDPC) parity check matrix that has a first block matrix size associated with the decoding mode, and decoding messages are selectively reordered in the reduced-power configuration to transform the QC-LDPC parity check matrix to a second QC-LDPC parity check matrix having a second block matrix size. For example, the reordering circuit 166 may be configured to reorder decoding messages between the message memory 158 and the DPUs 165 in accordance with a parallelism of 128 (e.g., a block size of 128 of the parity check matrix 142) for the ULP decoding mode, and to reorder the decoding messages in accordance with a parallelism of 64 (e.g., a block size of 64 of the parity check matrix 142) for the reduced-power configuration in the ULP decoding mode.

Decoder power consumption in a "soft" decoding mode, such as a belief-propagation LDPC decoding mode, can be reduced in decoders that use a reduced-resolution processor as compared to using a full-resolution processor that provides an increased correction capability with a higher power consumption. For example, in order to provide correction capability for a wide range of error rates (BER) while reducing or minimizing power consumption, computations may be performed with different accuracies of the probabilistic information used during soft decoding. An example of such probabilistic information is log-likelihood ratio values (LLRs) that may be generated for variable nodes based on input from check nodes and that may also be generated for check nodes based on input from variable nodes. Probabilistic information generated for variable nodes and for check nodes during decoding is referred to herein as decoding "messages," such as check node-to-variable node messages and variable node-to-check node messages.

Increasing the number of bits ("resolution") used to represent the information in the decoding messages (e.g., LLR messages) increases the accuracy of the decoding messages and also increases the power consumption of the decoder because more circuitry is used to process the larger number of bits. In some LDPC dedoders, the LLR resolution is hardwired in the decoder design and only two different resolution options were used, with separate processing units tailored for each message resolution. As an illustrative example, a decoder may include separate sets of data processing hardware, such as a first set of data processing units (DPUs) for a full-power (FP) decoding mode and a second set of DPUs for a low-power (LP) decoding mode. In the FP mode, one bit is used for sign information and six bits are used for magnitude information for each LLR message. In the LP mode, decoding messages use one bit for the sign information and three bits for the magnitude information. Although including separate sets of data processing hardware for the FP mode and for the LP mode enables reduced power consumption during LP decoding as compared to during FP decoding, the size and expense of the decoder is increased as compared to decoders that implement a single soft decoding mode (e.g., FP mode) and that include a single set of data processing hardware.

FIGS. 15-19 illustrate aspects of providing reduced power decoding by selectively disabling decoder components corresponding to unused bits in a reduced-resolution message decoding mode. In some implementations, fine-tuning of the accuracy of LDPC soft decoding calculations may be performed dynamically, according to the instant estimated BER, without introduction of duplicate sets of data processing hardware, such as a first set of data processing units (DPUs) for a full-power (FP) decoding mode and a second set of DPUs for a low-power (LP) decoding mode. An error metric, such as syndrome weight (SW) or another bit error rate (BER) estimator, is calculated in the initial stage of decoding. Since increasing the calculation accuracy (message resolution) leads to increased power consumption, the decoder power consumption may be adjusted according to the error metric, thus enabling dynamic power savings.

Soft decoding processing units may implement fixed-point calculations for updating LLR values of the codeword bits. Equations 4-14 below provide an illustrative example of message calculations that may be performed in an LDPC decoder. In Equations 4-14, Qvc is a variable-to-check message from variable node v to check node c, Qv is an estimate corresponding to variable node v, and Rcv is a check-to-variable message from check node c to variable node v.

$$Q_{vc} = Q_v - R_{cv} \qquad \text{(Eq. 4)}$$

$$R_c = \underset{\forall v \in c}{SXOR}(Q_{vc}) \qquad \text{(Eq. 5)}$$

$$R_c^{\bar{v}} = \underset{\forall v \in c/\bar{v}}{SXOR}(Q_{vc}), \text{ where } \bar{v} \text{ is such that } Q_{\bar{v}c} = \underset{\forall v \in c}{\min}(Q_{vc}) \qquad \text{(Eq. 6)}$$

The function SXOR(Q1,Q2) ("Soft XOR") of Equations 5 and 6 is calculated as provided in Equations 7-11.

$$Q_m = \min(|Q_1|, |Q_2|) \qquad \text{(Eq. 7)}$$

$$Q_d = ||Q_1| - |Q_2|| \qquad \text{(Eq. 8)}$$

$$\varepsilon = \begin{cases} 1 & ((Q_m = 1) \& (Q_d = 0)) | ((Q_m > 1) \& (Q_d < 2)) \\ 0 & \text{else} \end{cases} \qquad \text{(Eq. 9)}$$

$$\text{Sign}(SXOR) = (\text{Sign}(Q_1))XOR(\text{Sign}(Q_2)) \qquad \text{(Eq. 10)}$$

$$\text{Magnitude}(SXOR) = Q_m - \varepsilon \qquad \text{(Eq. 11)}$$

Updated values of Qv and Rcv messages are determined according to Equations 12-14.

$$\text{Sign}(R_{cv}^{new}) = XOR(\text{sign}(Q_{vc}), \text{sign}(R_c)) \quad (\text{Eq. 12})$$

$$\text{Magnitude}(R_{cv}^{new}) = \begin{cases} |R_c^{\bar{v}}|, & v = \bar{v} \\ |R_c|, & \text{otherwise} \end{cases} \quad (\text{Eq. 13})$$

$$Q_v^{new} = Q_{vc} + R_{cv}^{new} \quad (\text{Eq. 14})$$

Since most operations of Equations 4-14 are based on the addition and subtraction (with subtraction implemented as addition of 2's complemented numbers), adder circuitry may be reused for messages having different numbers of bits. To illustrate, when least significant bits of two operands are zero, only most significant bits participate in the operation, and the least significant bits of the operation results are also zero, as provided in Equation 15.

$$\{A, nb'0\} + \{B, nb'0\} = \{(A+B), n'b0\} \quad (\text{Eq. 15})$$

In Equation 15, the brackets "{ }" indicate concatenation of variables, and nb'0 is a zero vector of n bits. Calculations with messages of different accuracy (number of bits) may thus be performed with the same hardware, and the least significant bits of Q and R messages may be initialized to zero according to the selected accuracy. An example of a message adder circuit that is used for messages having different resolutions is described further with reference to FIG. 17.

In an implementation in which the largest supported accuracy for Qvc messages is N bits (N a positive integer) and the largest supported accuracy for Rcv messages is Nr=N−1 bits, the above Qvc calculations performed by LDPC processing units may be rewritten as in Equations 16 and 17.

$$Q_{vc}[N:N-n] = Q_v[N:N-n] - R_{cv}[N-1:N-n] \quad (\text{Eq. 16})$$

$$Q_{vc}[N-n-1:0] = Q_v[N-n-1:0] - R_{cv}[N-n-1:0] = (N-n)\,b'0 - (N-n)b'0 = 0 \quad (\text{Eq. 17})$$

In Equations 16 and 17, n is the current accuracy (number of bits) used by the Qvc messages (and Rcv messages use n−1 bits), and (N−n)b'0 is a zero vector of (N−n) bits. Note that the sign bit remains the most significant bit of each message.

Based on Equations 16 and 17, retrieving the (N−n) least significant bits of the Qvc and Rcv messages from the message memories of the decoder and writing the least significant bits of the Qvc and Rcv messages back into the message memories may be omitted. By arranging the message memories into dedicated portions (e.g., banks), power consumption is reduced by accessing the portions holding most-significant bits and omitting access to the portions holding the least significant bits. Further examples of decoder components that may be unused or disabled to reduce power consumption when the decoder operates using a reduced number of message bits are provided with reference to FIGS. 15-20.

Figure 15:
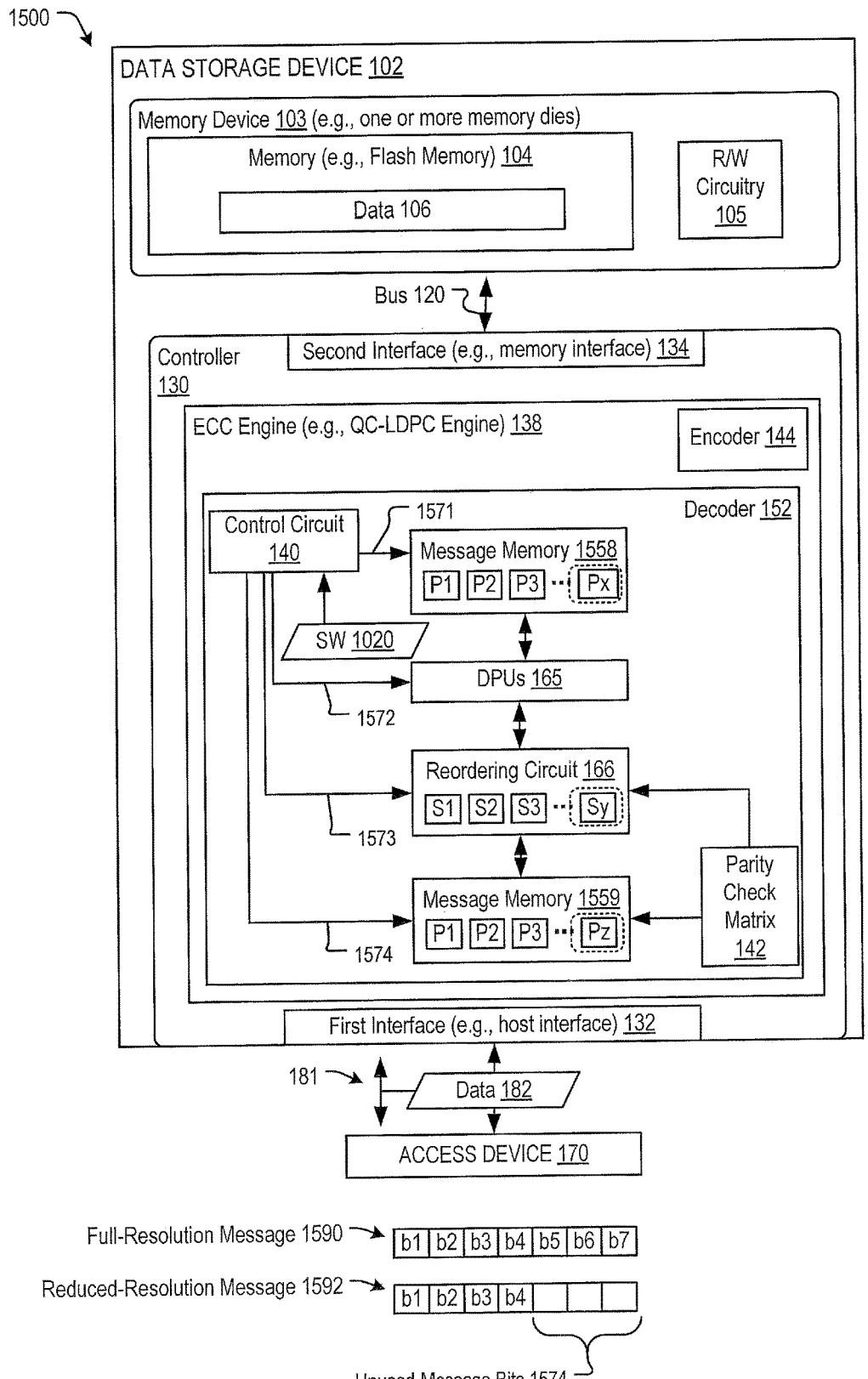
FIG. 15 is a block diagram of an illustrative example of a system including the data storage device of FIG. 1 that includes an ECC decoder that supports multiple message resolutions and that is configured to selectively disable decoder components corresponding to unused message bits.

FIG. 15 depicts an illustrative example of a system 1500 that includes the data storage device 102 and the access device 170 of FIG. 1. The decoder 152 of the data storage device 102 is configured to operate in multiple decoding modes having different levels of parallelism, as described with reference to FIG. 1 and FIG. 10. The decoder 152 is also configurable to select a message resolution for decoding based on the error metric 1020. Rather than including one set of dedicated components for decoding using full-resolution messages and another set of dedicated components for decoding using reduced-resolution messages, processing components and storage components of the decoder 152 of FIG. 15 are configured to be used with multiple message resolutions. In a decoding mode using a reduced message resolution, one or more components of the decoder 152 that correspond to message bits that are unused (e.g., one or more least significant bits) are disabled, reducing power consumption of the decoder 152.

The decoder 152 includes the control circuit 140, the DPUs 165, and the parity check matrix 142 as described with reference to the example implementations of FIG. 1 and FIG. 10. The decoder 152 also includes the reordering circuit 166, a first message memory 1558, and a second message memory 1559. In a particular implementation, the first message memory 1558 and the second message memory 1559 correspond to the message memory 158 of FIG. 1 and FIG. 10. The reordering circuit 166, the first message memory 1558, and the second message memory 1559 each includes multiple components that may be selectively disabled during decoding using a reduced message resolution.

To illustrate, in a full-resolution message decoding mode (also referred to herein as a "full-resolution mode"), the decoder 152 uses full-resolution messages, such as a representative full-resolution message 1590 that includes bits b1-b7. In a reduced-resolution message decoding mode (also referred to herein as a "reduced-resolution mode"), the decoder 152 uses reduced-resolution messages, such as a representative reduced-resolution message 1592 that includes bits b1-b4. The three lowest-order (least significant) bits b5-b7 that are used during the full-resolution message decoding mode and that are unused in the reduced-resolution message decoding mode are referred to as "unused" message bits 1574. Circuit elements (e.g., adders, shifters, memory banks, flip-flops, etc.) of the decoder 152 that are configured to process bits b1-b4 of memory messages in the full-resolution message decoding mode also process bits b1-b4 of memory messages in the reduced-resolution message decoding mode. However, because bits b5-b7 are unused in the reduced-resolution message decoding mode, circuit elements that are configured to process bits b5-b7 of memory messages in the full-resolution message decoding mode are disabled in the reduced-resolution message decoding mode.

The first message memory 1558 includes a random access memory (RAM) configured to store decoding messages of the decoder 152. For example, the first message memory 1558 may be configured to store a set of messages, such as check node messages, with each of the messages having "x" bits (x is a positive integer). For example, the first message memory 1558 may be sized to store check node messages (Rc) or check-to-variable messages (Rcv) having five magnitude bits plus a sign bit.

The first message memory 1558 includes multiple portions, illustrated as a first portion P1, a second portion P2, a third portion P3, and one or more additional portions including an x-th portion Px. Each portion P1-Px may store data that is accessible independently of the other portions P1-Px. For example, each portion P1-Px may correspond to a distinct bank of the first message memory 1558. One or more of the portions P1-Px is configured to be selectively disabled, illustrated as a dashed line encircling the portion Px. For example, portion Px may be configured to be decoupled from a power supply (e.g., in a separate voltage domain) or from a decoder clock signal (e.g., in a separate clock domain) while portions P1-P3 remain coupled to the power supply and to the decoder clock.

The first message memory 1558 is configured to distribute message bits across the multiple portions P1-Px. For example, when a message stored in the message memory 1558 includes x bits, a first bit of the message is stored in the first portion P1, a second bit of the message is stored in the second portion P2, a third bit of the message is stored in the third portion P3, and an x-th bit of the message is stored in the x-th portion Px.

The first message memory 1558 is configured to disable one or more portions that correspond to unused message bits. For example, although the first message memory 1558 may be sized to store an x-bit message according to a high-resolution message decoding mode, in a lower-resolution message decoding mode one or more message low-order bits may be unused, such as the unused message bits 1574. Thus, one or more portions of the first message memory 1558, including the portion Px, may be disabled as corresponding to unused message bits in the reduced-resolution message decoding mode.

The first message memory 1558 may be responsive to a control signal 1571 from the control circuit 140 to disable one or more of the portions P1-Px that correspond to unused message bits. In some implementations, the control signal 1571 includes separate enable/disable signals for one or more of the portions P1-Px, and each of the enable/disable signals may be routed to enable/disable circuity of the respective portion (e.g., a head switch, a foot switch, a clock gating circuit, etc.). In other implementations, the control signal 1571 includes a value indicating the current decoding mode (e.g., a full-resolution message decoding mode or a reduced-resolution message decoding mode), and the first message memory 1558 includes a mode decoder circuit configured to generate enable/disable signals for one or more of the portions P1-Px based on the current decoding mode.

The second message memory 1559 includes a RAM configured to store decoding messages of the decoder 152. For example, the second message memory 1559 may be configured to store a set of z-bit variable node messages (z is a positive integer). For example, the second message memory 1559 may be sized to store variable node messages (Qv) or variable-to-check messages (Qvc) having six magnitude bits plus a sign bit (i.e., 7-bit messages).

The second message memory 1559 includes multiple portions P1-Pz. Each of the portions P1-Pz may store data that is accessible independently of the other portions P1-Pz, such as distinct banks of the second message memory 1559. One or more of the portions P1-Pz is configured to be selectively disabled. For example, portion Pz may be decoupled from a power supply or from a decoder clock signal while portions P1-P3 remain coupled to the power supply and to the decoder clock.

The second message memory 1559 is configured to distribute message bits across the multiple portions P1-Pz. For example, when a message stored in the second message memory 1559 includes z bits, a first bit of the message is stored in the first portion P1, a second bit of the message is stored in the second portion P2, a third bit of the message is stored in the third portion P3, and a z-th bit of the message is stored in the z-th portion Pz.

The second message memory 1559 is configured to disable one or more portions that correspond to unused message bits. For example, although the second message memory 1559 may be sized to store a z-bit message according to a high-resolution message decoding mode, in a lower-resolution message decoding mode one or more message low-order bits may be unused (e.g., the unused message bits 1574). Thus, one or more portions of the second message memory 1559, including the portion Pz, may be disabled as corresponding to unused message bits in the reduced-resolution message decoding mode.

The second message memory 1559 is responsive to a control signal 1574 from the control circuit 140 to disable one or more of the portions P1-Pz that correspond to unused message bits. In some implementations, the control signal 1574 includes separate enable/disable signals for one or more of the portions P1-Pz, and each of the enable/disable signals may be routed to enable/disable circuity of the respective portion (e.g., a head switch, a foot switch, a clock gating circuit, etc.). In other implementations, the control signal 1574 includes a value indicating the current decoding mode (e.g., a full-resolution message decoding mode or a reduced-resolution message decoding mode), and the second message memory 1559 includes a mode decoder circuit configured to generate enable/disable signals for one or more of the portions P1-Pz based on the current decoding mode.

The reordering circuit 166 includes multiple shifters, illustrated as a first shifter S1, a second shifter S2, a third shifter S3, and one or more additional shifters including a y-th shifter Sy (y is a positive integer). One or more of the shifters S1-Sy is configured to be selectively disabled when the shifter corresponds to an unused message bit. For example, the shifter S1 corresponds to (e.g., operates on) one or more most significant bits of a message, the shifter S2 corresponds to one or more less significant bits, and the shifter Sy corresponds to one or more least significant bits of the message to be shifted. In a high-resolution mode, all shifters S1-Sy of the reordering circuit 166 are enabled to perform shifting. In a lower-resolution mode, one or more of the shifters S1-Sy corresponds to an unused message bit and is disabled. For example, a lowest order message bit corresponding to the shifter Sy may be unused in the reduced-resolution mode.

The reordering circuit 166 is responsive to a control signal 1573 from the control circuit 140 to disable one or more of the shifters S1-Sy corresponding to unused message bits. In some implementations, the control signal 1573 includes separate enable/disable signals for each of the shifters S1-Sy, and each of the enable/disable signals may be routed to enable/disable circuity of the respective shifter (e.g., a head switch, a foot switch, a clock gating circuit, etc.). In other implementations, the control signal 1573 includes a value indicating the current decoding mode (e.g., a full-resolution message decoding mode or a reduced-resolution message decoding mode), and the reordering circuit 166 includes a mode decoder circuit configured to generate enable/disable signals for one or more of the shifters S1-Sy based on the current decoding mode.

The control circuit 140 is responsive to the error metric 1020, such as the syndrome weight, associated with the representation of a codeword read from the memory 104. The control circuit 140 is configured to set a message resolution at least partially based on the error metric 1020. In some implementations, the control circuit 140 compares the error metric 1020 to one or more thresholds and selects a message resolution based on the comparison(s). In an illustrative example, the decoder 152 supports a full-resolution message decoding mode (e.g., FP mode) and a reduced-resolution message decoding mode (e.g., LP mode). The control circuit 140 compares the error metric 1020 to a threshold and selects the full-resolution message decoding mode in response to the error metric 1020 exceeding the threshold, and selects the reduced-resolution message decoding mode otherwise. In other implementations, the decoder 152 supports multiple reduced-resolution message decoding modes, and the control circuit 140 is configured to perform comparisons of the error metric 1020 to multiple thresholds to select a decoding mode, as described further with reference to FIG. 19. In other implementations, the control circuit 140 is configured to determine a message resolution as a function of the error metric 1020. For example, the control circuit 140 may calculate a number of message bits according to an equation, such as num_bits=ceil((A*error_metric)+B), where num_bits indicates a bit length of a memory message (e.g., Qv, Rc), ceil(x) is a ceiling function that gives the nearest integer less than x, and A and B are fitting parameters.

The control circuit 140 is further configured to selective disable one or more components of the LDCP decoder 152 based on the message resolution. For example, the control circuit 140 is configured to send the control signal 1571 to selectively disable one or more of the portions P1-Px, the control signal 1573 to selectively disable one or more of the shifters S1-Sy, and the control signal 1574 to selectively disable one or more of the portions P1-Pz. The control circuit 140 is also configured to send a control signal 1572 to the DPUs 165 to selectively disable one or more components of one or more of the DPUs 165 based on message resolution, such a message adder circuit as described in further detail with reference to FIG. 17, a portion of a pipeline register such as described further with reference to FIG. 18, one or more other components of one or more of the DPUs 165, or a combination thereof.

During operation, the control circuit 140 receives the error metric 1020, such as in response to generation of syndrome data corresponding to a representation of the data 106 read from the memory 104. The control circuit 140 determines a message resolution in response to the error metric 1020. In some implementations, the control circuit 140 determines the message resolution further based on a decoding mode indicator, such as the ECC mode indicator 176 of FIG. 1. The control circuit 140 may generate the control signals 1571-1574 to selectively enable or disable one or more components of the first message memory 1558, the DPUs 165, the reordering circuit 166, and the second message memory 1559 based on the selected message resolution.

During the decoding operation using the selected message resolution, a value of the error metric 1020 may change, such as when one or more errors are detected and corrected in the representation of a codeword. The control circuit 140 may be configured to adjust the message resolution on-the-fly during decoding. For example, in response to a number of errors being corrected such that the error metric 1020 decreases below a threshold amount, the control circuit 140 may reduce a message resolution for the remainder of the decoding of the codeword. For on-the-fly message resolution adjustment, the threshold amount may vary based on an amount of allotted decoding time remaining for the decoding operation to converge to a valid codeword. For example, the threshold amount may decrease as the remaining decoding time decreases. The threshold may be set to a value that prevents transitioning to a reduced message resolution unless the estimated convergence time using the reduced message resolution is less than the remaining allotted decoding time. Reducing the message resolution may result in power saving by disabling one or more components of the decoder 152 and may be performed when the error metric 1020 has a value indicating that decoding is likely to be successful within a specified time period at the reduced message resolution.

By reducing the message resolution and disabling one or more components of the decoder 152 based on the error metric 1020, power consumption of the decoder 152 may be reduced as compared to implementations in which message resolution is not adjusted, and also as compared to implementations in which message resolution may be adjusted but components corresponding to unused message bits are not disabled. In addition, a size of the decoder 152 (e.g., a number of components within the decoder 152) may be reduced as compared to implementations in which components are duplicated for message resolutions. For example, in an implementation that has a first version of the first message memory 1558 for high-resolution messages and a second version of the first message memory 1558 (e.g., a duplicate memory having a smaller size for smaller message resolution), a footprint of the decoder may be significantly larger than a footprint of the decoder 152 of FIG. 15. Thus, adjusting message resolution based on the error metric 1020 and selectively disabling one or more components of the decoder 152 based on the message resolution may result in reduced power consumption, reduced decoder size, or a combination thereof.

Although the decoder 152 is illustrated as including the control circuit 140 that generates the control signals 1571-1574 to selectively disable one or more components of the first message memory 1558, the second message memory 1559, the DPUs, and the reordering circuit 166, in other implementations the control circuit 140 may be configured to selectively disable one or more additional components or one or more fewer components of the decoder 152. For example, in some implementations, the first message memory 1558 may not be configured to have a portion that can be disabled responsive to a control signal. As another example, in some implementations the reordering circuit 166, the second message memory 1559, the DPUs 165, or any combination thereof, may not include components configured to be selectively disabled.

Although the full-resolution message 1590 is depicted as a 7-bit message and the reduced-resolution message 1592 is depicted as a 4-bit message, in other implementations a full-resolution message may have fewer than seven bits or more than seven bits, and a reduced-resolution message may have fewer than four bits or more than four bits. Although a single reduced-resolution message is illustrated, in other implementations the decoder 152 may support multiple reduced-resolution message decoding modes. As a non-limiting illustrative example, a first reduced-resolution message decoding mode may use 6-bit messages, a second reduced-resolution message decoding mode may use 4-bit messages, and a third reduced-resolution message decoding mode may use 2-bit messages. An example of operation in an implementation using multiple reduced-resolution message decoding modes is described further with reference to FIG. 19.

Figure 16:
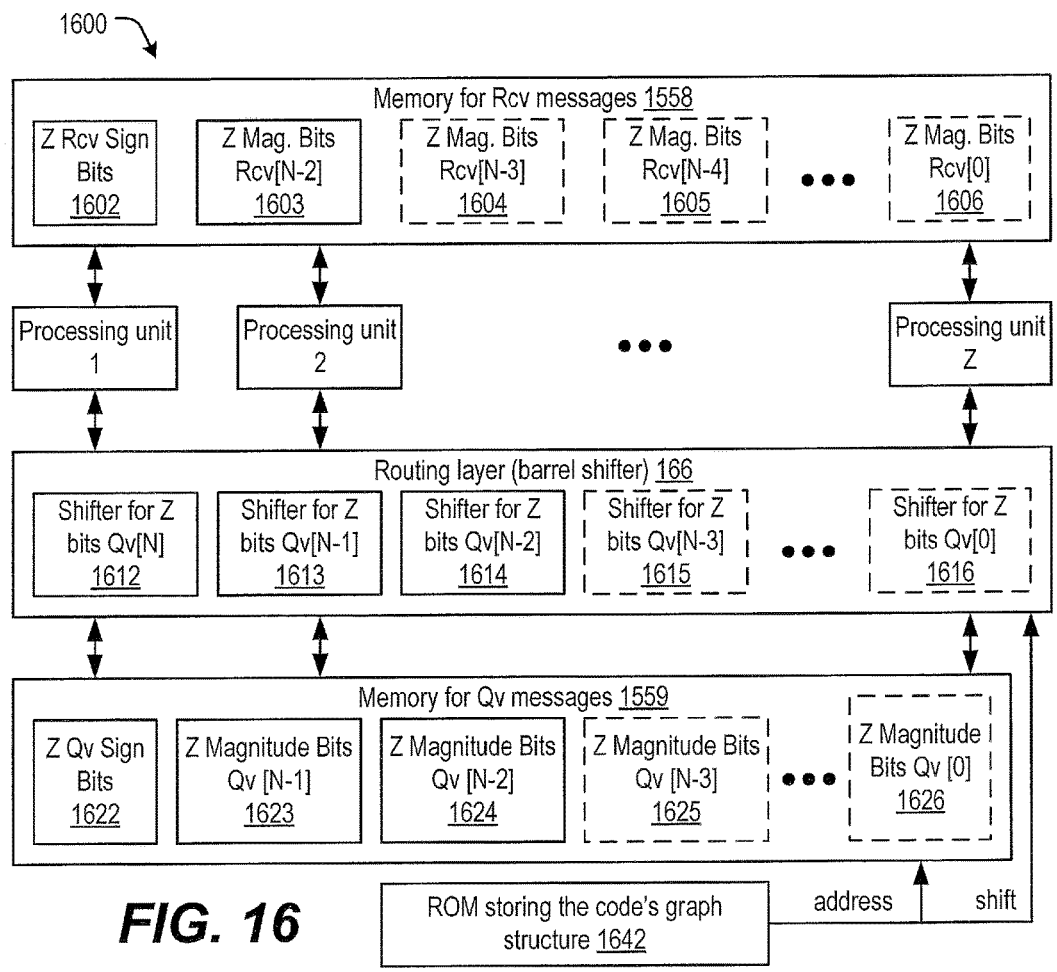
FIG. 16 is a block diagram of an illustrative example of the decoder of FIG. 15.

FIG. 16 illustrates an example 1600 of an implementation of the decoder 152 of FIG. 15. The first message memory 1558 is illustrated as a memory for Rcv messages and includes a first portion 1602, a second portion 1603, a third portion 1604, a fourth portion 1605, and one or more other portions including a portion 1606. The first portion 1602 may be sized to store a sign bit (e.g., a highest-order bit) of each of Z Rcv messages. The second portion 1603 may be configured to store the highest-order magnitude bit of each of the Z Rcv messages. The third portion 1604 may be configured to store the second most significant magnitude bit of each of the Z Rcv messages. The portion 1606 may be configured to store the lowest-order magnitude bit of each of the Z Rcv messages.

The second message memory 1559 is illustrated as a memory for Qv messages and includes a first portion 1622, a second portion 1623, a third portion 1624, a fourth portion 1625, and one or more other portions including a portion 1626. The first portion 1622 may be sized to store a sign bit (e.g., a highest-order bit) of each of Z Qv messages. The second portion 1623 may be configured to store the highest-order magnitude bit of each of the Z Qv messages. The third portion 1624 may be configured to store the second most significant magnitude bit of each of the Z Qv messages. The portion 1626 may be configured to store the lowest-order magnitude bit of each of the Z Qv messages.

The routing layer 166 (e.g., a routing circuit) is illustrated as including a first shifter 1612, a second shifter 1613, a third shifter 1614, a fourth shifter 1615, and one or more other shifters including a shifter 1616. The first shifter 1612 is configured to shift the highest-order bit of each of Z Qv messages. The second shifter 1613 is configured to shift the second highest-order bit of each of the Z Qv messages, and the shifter 1616 is configured to shift the lowest-order bit of each of the Z Qv messages.

A representation of the parity check matrix 142 may be stored in a read-only memory (ROM) 1642 that stores data corresponding to a graph structure of an LDPC code. Address information may be provided to the second message memory 1559, and shift information may be provided to the routing layer 166.

In the example 1600, the variable messages Qv are one bit larger than the check-to-variable messages Rcv. As illustrated, the Qv messages at full-resolution have N bits, and the Rcv messages at full-resolution have N−1 bits. The highest-order bit of each of the Qv and Rcv messages is a sign bit, and the remaining bits of each of the Qv and Rcv messages are magnitude bits. In a decoding operation in which the message resolution is reduced as compared to a full resolution, one or more bits of the Qv messages and the Rcv messages are unused.

In the example 1600, in reduced-resolution message decoding the Rcv messages use a sign bit and a highest-order magnitude bit, and the remaining N−2 bits allocated for the full-resolution Rcv messages are unused. Thus, the first portion 1602 and the second portion 1603 of the first message memory 1558 are enabled, while the remaining portion 1604-1606 are disabled. Similarly, reduced-resolution Qv messages include a sign bit and two magnitude bits, and the remaining N−3 bits allocated for the full-resolution Qv messages are unused. Thus, the first three portions 1622-1624 of the second message memory 1559 are enabled, and the remaining portions 1625-1626 are disabled. Similarly, the shifters 1612, 1613, and 1614 corresponding to the three highest-order bits of the Qv messages are enabled, while the remaining shifters 1615-1616 are disabled.

Thus, one or more components of the LDPC decoder 152 may be selectively disabled based on the message resolution. As a result, the power consumption may be reduced in a decoding mode using reduced message resolution.

In some implementations, the example 1600 may support two message resolution modes: a full-resolution mode that includes (N−1)-bit Rcv messages and N-bit Qv messages, and a reduced-resolution mode that includes 2-bit Rcv messages and 3-bit Qv messages. However, in other implementations one or more additional message resolutions may also be supported. For example, several of the portions 1602-1606 of the first message memory 1558 may be individually capable of being enabled or disabled, to support a continuous range of message resolutions from N−1 bits to 2 bits (or, in some implementations, to 1 bit). Similarly, the shifters 1612-1616 of the routing layer 166 may be individually enabled or disabled, and the portions 1622-1626 of the second message memory 1559 may be individually enabled or disabled. Thus, the example 1600 of the decoder 152 may be responsive to the control circuit 140 of FIG. 15 to support a continuous range of message resolutions that may be modified on-the-fly and that are computed based a value of the error metric 1020.

Figure 17:
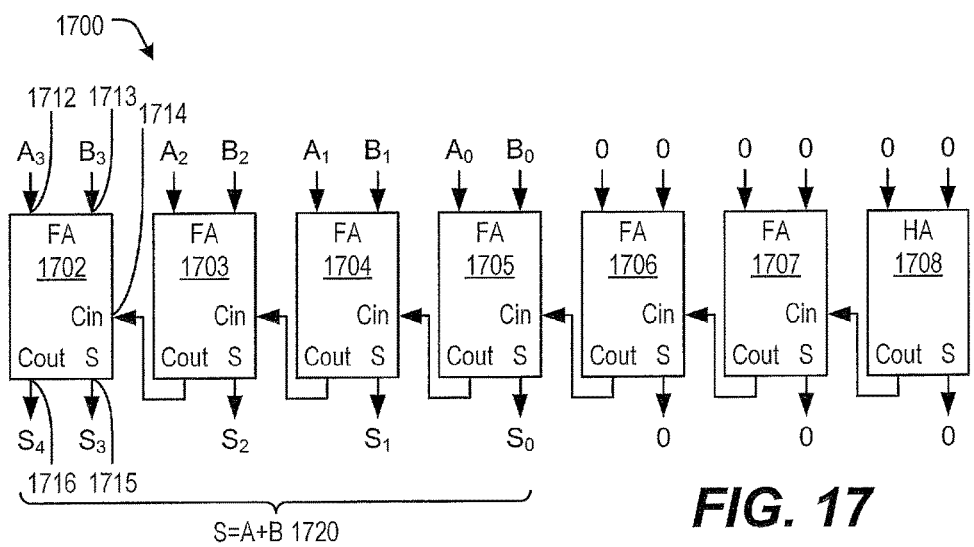
FIG. 17 is a block diagram of an illustrative example of a message adding circuit that may be included in the decoder of FIG. 15.

FIG. 17 illustrates an example of a message adding circuit 1700 that may be implemented in one or more of the DPUs 165 of FIG. 15. The message adding circuit 1700 includes a first adder 1702, a second adder 1703, a third adder 1704, a fourth adder 1705, a fifth adder 1706, a sixth adder 1707, and a seventh adder 1708 in a serially-coupled configuration. Each of the adders 1702-1707 is a full adder (FA) that includes two data inputs, a carry input, a sum output, and a carry output, such as a first data input 1712 and a second data input 1713, a carry input 1714, a sum output 1715, and a carry output 1716 of the first adder 1702. The seventh adder 1708 is a half adder (HA) that includes 2 data inputs, a sum output, and a carry output, but does not include a carry input. The message adding circuit 1700 is configured to add a first message A and second message B. In a full-resolution mode, each of the messages A and B is a 7-bit message. The lowest-order bit of message A and the lowest-order bit of message B are provided to the data inputs of the seventh adder 1708, the second lowest-order bit of message A and the second lowest-order bit of message B are provided to the data inputs of the sixth adder 1707, and the highest-order bit of message A and the highest-order bit of message B are provided to the data inputs 1712, 1713 of the first adder 1702.

In a reduced-resolution mode, each of the messages A and B is a 4-bit message, and addition of the 4-bit messages A and B is performed using the adders 1702-1705. The adders 1706-1708 correspond to unused low-order message bits of the full-resolution messages and are unused in the reduced-resolution mode. A first portion 1720 of the message adding circuit 1700 that includes the adders 1702-1705 is enabled, and a second portion that includes the adders 1706-1708 is disabled by providing "0" values to the data inputs of each of the disabled adders 1706-1708. Providing "0" values as inputs prevents toggling and state changes within each of the adders 1706-1708, reducing dynamic power consumption of the message adding circuit 1700 when operating in the reduced-resolution mode. In other implementations, one or more of the unused adders 1706-1708 are disabled by disconnecting the adders 1706-1708 from a voltage supply, such as by operation of a head switch, a foot switch, or a combination thereof, or by sending a disable signal to an enable input of the adders 1706-1708.

The message adding circuit 1700 may be representative of one or more adding circuits in each of the DPUs 165, such as to compute decoding messages in accordance with one or more of Equations 4-14. The message adding circuit 1700 may be responsive to a control signal from the control circuit 140, such as the control signal 1572, to selectively disable one or more of the adders 1702-1708 based on the message resolution in order to reduce power consumption of components corresponding to unused message bits.

Figure 18:
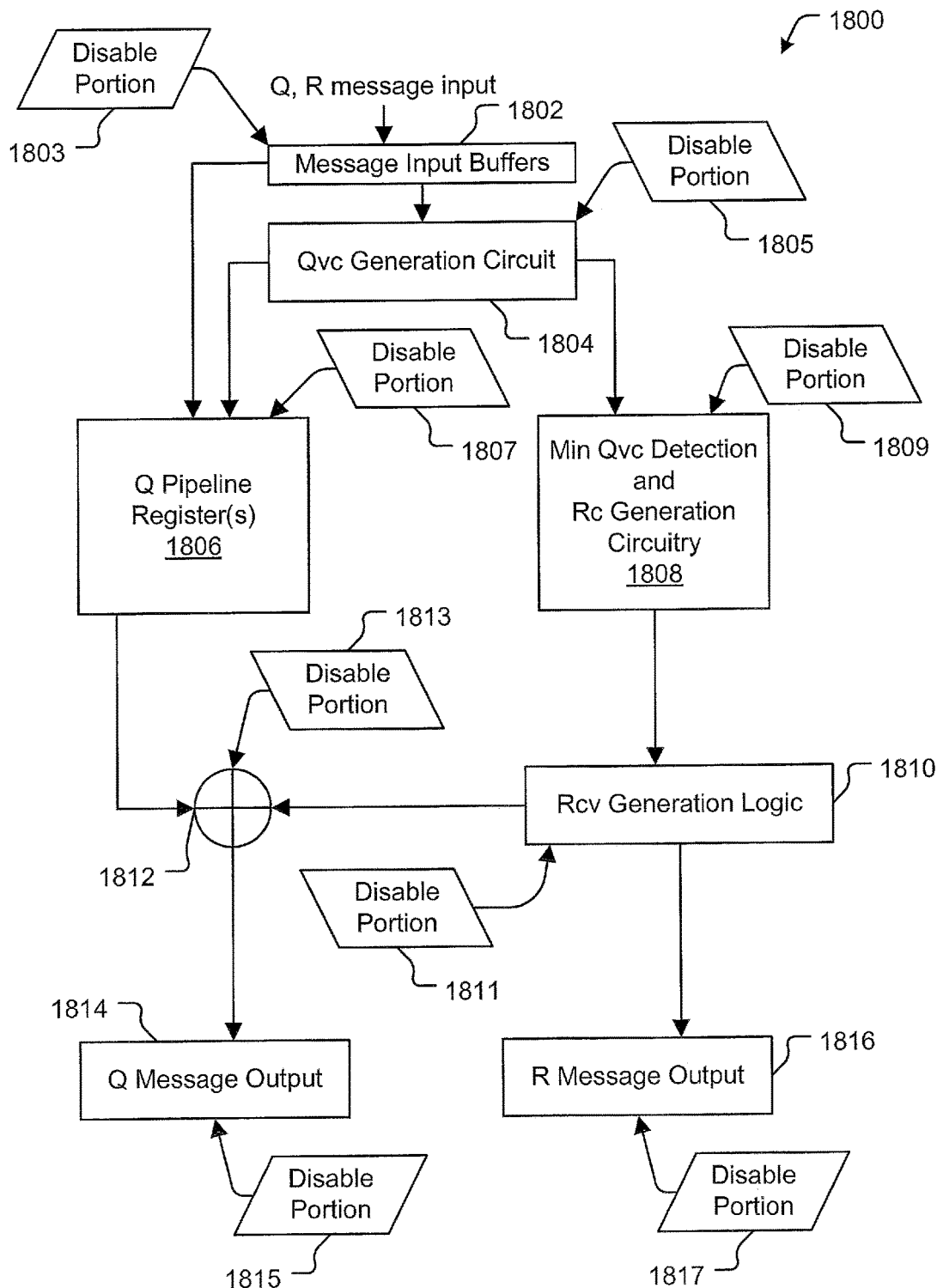
FIG. 18 is a block diagram of an illustrative example of a data processing unit (DPU) that may be included in the decoder of FIG. 15.

FIG. 18 illustrates an example of a DPU 1800 of one or more of the DPUs 165 of FIG. 15. The DPU 1800 includes message input buffers 1802 configured to receive Q and R message inputs, a Qvc generation circuit 1804, pipeline registers 1806 for Q messages, circuitry 1808 configured to determine min Qvc and to generate Rc messages, Rcv generation logic 1810, a message adder 1812, a Q message output buffer 1814, and an R message output buffer 1816.

The message input buffers 1802 include one or more registers configured to receive the Q and R message input and to buffer the received message input to be processed by other components of the DPU 1800. One or more components of the message input buffers 1802, such as one or more flip-flops corresponding to unused message bits in a reduced-resolution mode, is configured to be selectively disabled. To illustrate, the message input buffers 1802 are responsive to a "disable portion" control signal 1803 to disable one or more flip-flops in the reduced-resolution mode.

The Qvc generation circuit 1804 includes circuitry configured to calculate Qvc messages based on the Q and R message inputs and to output Qvc values. The circuit 1804 may include one or more adders, flip-flops, or other circuit elements corresponding to components that are disabled when associated with unused message bits. For example, one or more adders, such as the message adding circuit 1700 of FIG. 17, may be included in the circuit 1804. The circuit 1804 is responsive to a disable portion signal 1805 to disable one or more components of the circuit 1804.

The pipeline registers 1806 include one or more registers configured to function as pipeline registers to store and convey Qvc message data over multiple clock cycles while processing is ongoing at the circuitry 1808. Each of the pipeline registers 1806 is sized to store a respective full-resolution Qvc message, and is configured to have one or more components selectively disabled when a lower-resolution set of Qvc messages are stored in a reduced-resolution mode. For example, the pipeline registers 1806 may be responsive to a disable portion signal 1807 to disable one or more flip-flops of one or more of the pipeline registers 1806, such as register latches corresponding to low-order bits, when the low-order bits correspond to unused bits of the Qvc messages. In some implementations, the Q pipeline registers 1806 are implemented using an SRAM (instead of flip-flops) to store and convey the Qvc message data. The SRAM may be organized into memory banks according to bit significance and shared between DPUs in a manner similar to the first (Rcv) message memory 1558 and the second (Qv) message memory 1559.

The circuitry 1808 is configured to perform one or more operations using Qvc messages from the circuit 1804 to determine a min Qvc, and to generate Rc messages. For example, the circuitry 1808 may include one or more adders, such as the message adding circuit 1700 of FIG. 17, one or more shifters, one or more multiplexers, one or more registers, or other components. Portions of the one or more components of the circuitry 1808 are configured to be selectively disabled based on message resolution, such as in response to a disable portion signal 1809.

The Rcv generation logic 1810 is configured to receive an output from the circuitry 1808. The Rcv generation logic 1810 is configured to generate Rcv messages and includes one or more circuit components responsive to a disable portion signal 1811 to selectively disable a portion of the one or more components that corresponds to unused message bits.

The adder 1812 corresponds to the message adding circuit 1700 of FIG. 17 and is configured to generate Qv messages. The adder 1812 is responsive to a disable portion signal 1813 to selectively disable one or more components of the adder 1812, such as described with reference to FIG. 17.

The Q message output buffer 1814 includes multiple latches and is sized to store a full-resolution Qv message. The Q message output buffer 1814 is responsive to a disable portion signal 1815 to selectively disable one or more latches corresponding to low-order message bits that are unused in a reduced-resolution message decoding mode. Similarly, the R message output buffer 1816 includes multiple latches and is sized to store information corresponding to full-resolution R messages. The R message output buffer 1816 is responsive to a disable portion signal 1817 to selectively disable one or more latches corresponding to unused message bits in a reduced-resolution message decoding mode.

Components of the DPU 1800 are thus responsive to the respective disable portion signals 1803, 1805, 1807, 1809, 1811, 1813, 1815, and 1817 to reduce power by disabling unused portions in a reduced-resolution message decoding mode. Although illustrated as distinct signals, the disable portion signals 1803, 1805, 1807, 1809, 1811, 1813, 1815, and 1817 illustrated in FIG. 18 may be a single signal received from the control circuit 140, such as the control signal 1572, and that is routed to each of the configurable components of the DPU 1800.

Although each of the components of the DPU 1800 is configurable to disable unused portions in a reduced-resolution message decoding mode, in other implementations one or more of the components 1802, 1804, 1806, 1808, 1810, 1812, 1814, or 1816 is not configurable to disable unused portions. Although the DPU 1800 includes components to perform LDPC decoding in accordance with Equations 4-14, in other implementations one or more other LDPC decoding techniques, such as a min-sum or sum-product variation, is implemented by the decoder 152 and consequently the DPU 1800 includes one or more additional or alternative components than those illustrated in FIG. 18. Thus, it should be understood that the above equations and corresponding implementations are provided as illustrative, non-limiting examples, and that the multi-resolution techniques described herein may be applied to other implementations.

Figure 19:
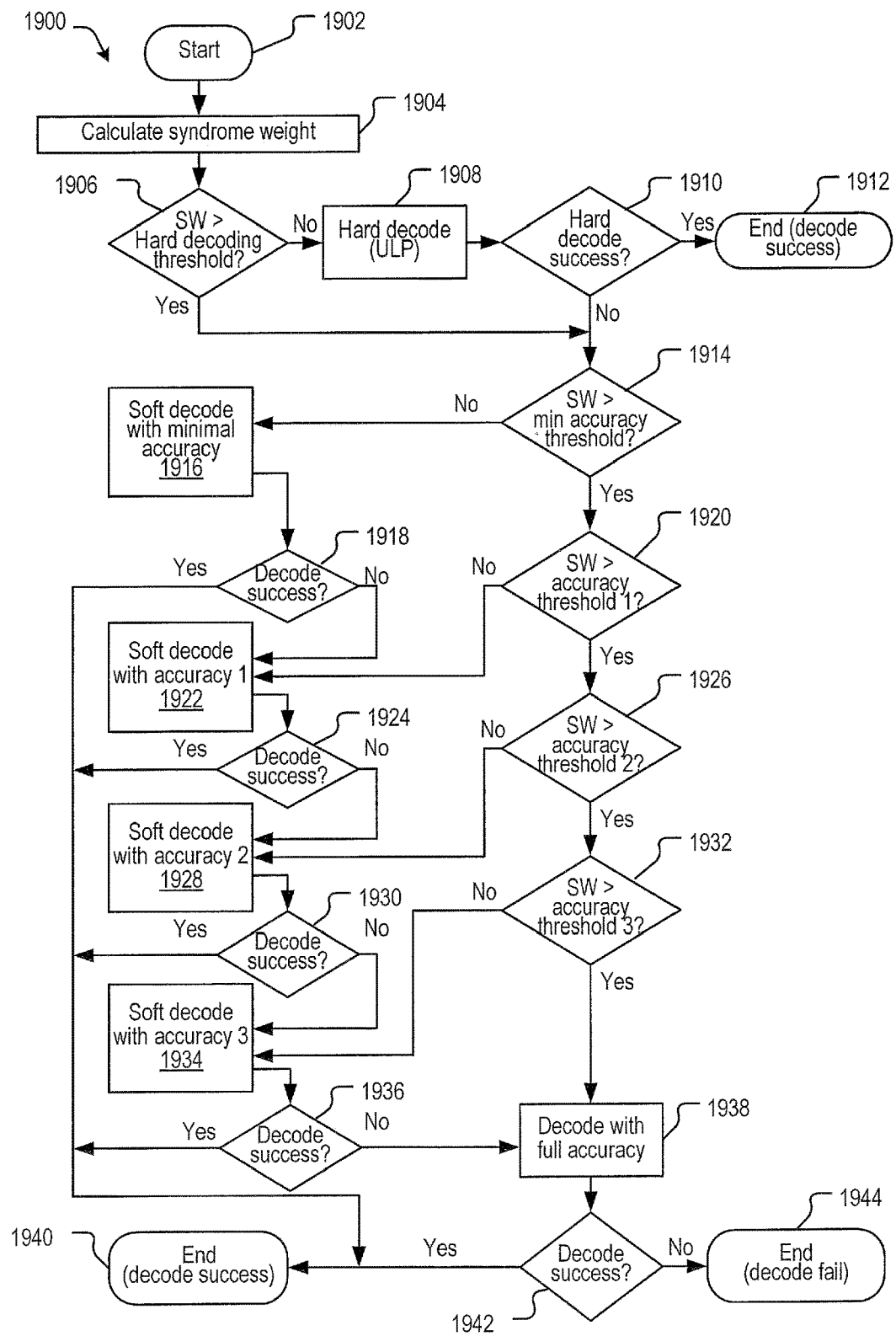
FIG. 19 is a flow diagram of a particular example of a method of operation that may be performed by the data storage device of FIG. 15.

FIG. 19 depicts an illustrative example of a method 1900 of operation at a device including a non-volatile memory and a low density parity check (LDPC) decoder. For example, the method 1900 may be performed at the decoder 152 of FIG. 15.

The method 1900 starts at 1902 and includes calculating a syndrome weight, at 1904. For example, the syndrome weight may correspond to the error metric 1020 of FIG. 15 that is calculated prior to initiating decoding of a representation of a codeword received from the memory 104.

A determination is made as to whether the syndrome weight exceeds a hard decoding threshold, at 1906. For example, the hard decoding threshold may be used to determine whether decoding should be performed using a "hard" decoding mode, such as the ULP bit-flipping mode, or a "soft" decoding mode, such as the LP or FP belief-propagation mode.

In response to determining that the syndrome weight does not exceed the hard decoding threshold, a hard decode operation is performed, at 1908. If the hard decode operation is determined to be successful, at 1910, the method 1900 ends with a decode success, at 1912. Otherwise, if the hard decode operation is not successful, at 1910, or if the syndrome weight is determined to exceed the hard decoding threshold, at 1906, processing advances to a determination as to whether the syndrome weight exceeds a threshold corresponding to a lowest or "minimal" message resolution or accuracy, at 1914.

If the syndrome weight does not exceed the threshold corresponding to the minimal accuracy, at 1914, a soft decode operation is performed using the minimal accuracy, at 1916. For example, the soft decode operation using the minimal accuracy may use 2-bit R messages and 3-bit Q messages, and circuit elements corresponding to unused message bits may be disabled or otherwise unused for reduced power consumption. If the soft decode operation using the minimal accuracy is successful, at 1918, the method 1900 ends, at 1940, with decode success.

If the syndrome weight exceeds the threshold corresponding to the minimal accuracy, a determination is made as to whether the syndrome weight exceeds a threshold corresponding to a first message resolution or accuracy that is greater than the "minimal" accuracy, at 1920. In response to the syndrome weight not exceeding the threshold corresponding to the first accuracy, or in response to decoding failure at 1918, a soft decode operation is performed using the first accuracy, at 1922. For example, the soft decode operation using the first accuracy may use 3-bit R messages and 4-bit Q messages, and circuit elements corresponding to unused message bits may be disabled or otherwise unused for reduced power consumption. If the soft decode operation using the first accuracy is determined to be successful, at 1924, the method 1900 ends, at 1940, with decode success.

If the syndrome weight exceeds the threshold corresponding to the first accuracy, at 1920, a determination is made as to whether the syndrome weight exceeds a threshold corresponding to a second message resolution or accuracy that is greater than the first accuracy, at 1926. In response to the syndrome weight not exceeding the threshold corresponding to the second accuracy, or in response to decoding failure at 1924, a soft decode operation is performed using the second accuracy, at 1928. For example, the soft decode operation using the second accuracy may use 4-bit R messages and 5-bit Q messages, and circuit elements corresponding to unused message bits may be disabled or otherwise unused for reduced power consumption. If the soft decode operation using the second accuracy is determined to be successful, at 1930, the method 1900 ends, at 1940, with decode success.

If the syndrome weight exceeds the threshold corresponding to the second accuracy, at 1926, a determination is made as to whether the syndrome weight exceeds a threshold corresponding to a third message resolution or accuracy that is greater than the second accuracy, at 1932. In response to the syndrome weight not exceeding the threshold corresponding to the third accuracy, or in response to decoding failure at 1930, a soft decode operation is performed using the third accuracy, at 1934. For example, the soft decode operation using the third accuracy may use 5-bit R messages and 6-bit Q messages, and circuit elements corresponding to unused message bits may be disabled or otherwise unused for reduced power consumption. If the soft decode operation using the third accuracy is determined to be successful, at 1936, the method 1900 ends, at 1940, with decode success.

In response to the syndrome weight exceeding the threshold corresponding to the third accuracy, at 1932, or in response to decoding failure at 1936, a soft decode operation is performed using a full message resolution or accuracy, at 1938. For example, the soft decode operation using the full accuracy may use 6-bit R messages and 7-bit Q messages. If the soft decode operation using the full accuracy is determined to be successful, at 1942, the method 1900 ends, at 1940, with decode success. Otherwise, if the soft decode operation is determined to not be successful, at 1942, the method 1900 ends, at 1944, with decode failure.

The method 1900 illustrates selecting a lowest message resolution expected to successfully decode a codeword based on the syndrome weight. Failure to decode using the selected message resolution results in a subsequent attempt to decode using one or more successively higher message resolutions until decoding succeeds or until decoding fails using the highest available message resolution. Reduced power consumption due to using reduced message resolution increases the overall power efficiency of the LDPC decoder. Although the FIG. 19 illustrates five thresholds for comparison to the syndrome weight, in other implementations more than five thresholds or fewer than five thresholds may be used.

Figure 20:
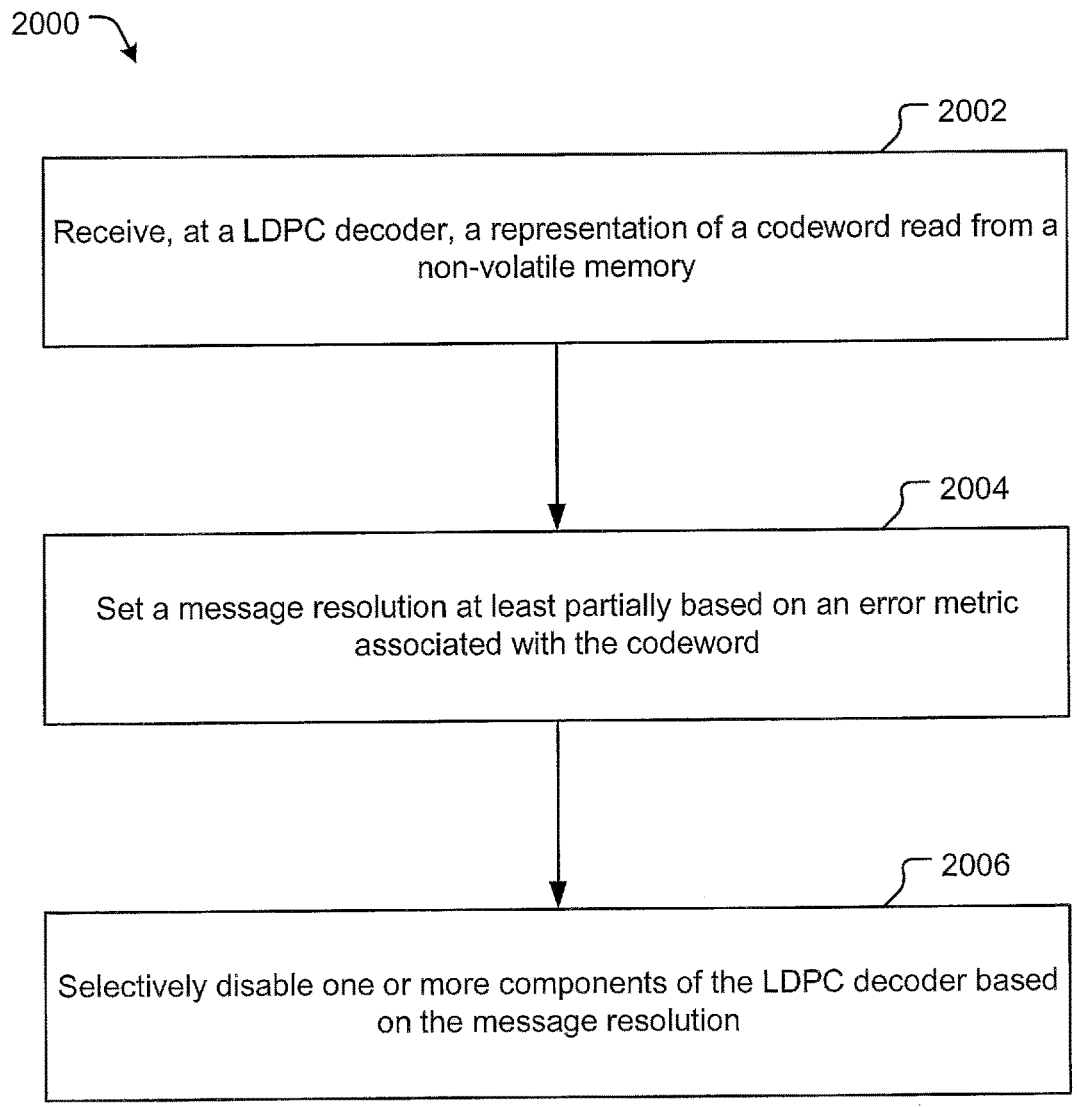
FIG. 20 is a flow diagram of another particular example of a method of operation that may be performed by the data storage device of FIG. 15.

FIG. 20 depicts an illustrative example of a method 2000 of operation at a device including a non-volatile memory and a low density parity check (LDPC) decoder. For example, the method 2000 may be performed at the decoder 152 of FIG. 15.

The method 2000 includes receiving, at the LDPC decoder, a representation of a codeword from the non-volatile memory, at 2002. A message resolution is set at least partially based on an error metric associated with the codeword, at 2004. In an illustrative example, the message resolution is set to a first resolution corresponding to a first number of bits in response to the error metric exceeding a threshold and is set to a second resolution corresponding to a second number of bits in response to the error metric not exceeding the threshold.

One or more components of the LDPC decoder are selectively disabled based on the message resolution, at 2006. In an illustrative example, a particular component of the one or more components is enabled in response to the message resolution being set to the first resolution and is disabled in response to the message resolution being set to the second resolution.

In some implementations, selectively disabling the one or more components includes disabling a portion of a memory of the LDPC decoder that corresponds to an unused message bit. In an illustrative example, the portion includes one or more of the portions P1-Px of the first message memory 1558 of FIG. 15, one or more of the portions P1-Pz of the second message memory 1559 of FIG. 15, one or more of the portions 1602-1606 of FIG. 16, one or more of the portions 1622-1626 of FIG. 16, or a combination thereof.

In some implementations, selectively disabling the one or more components includes disabling operation of a portion of a message adding circuit of the LDPC decoder, the portion corresponding to an unused message bit. In an illustrative example, the portion includes one or more of the adders 1702-1708 (e.g., the adders 1706, 1707, and 1708) of the message adding circuit 1700 of FIG. 17.

In some implementations, selectively disabling the one or more components includes disabling a portion of a shifter circuit of the LDPC decoder. In an illustrative example, the portion includes one or more of the shifters S1-Sy of the reordering circuit 166 of FIG. 15, one or more of the shifters 1612-1616 of FIG. 16, or any combination thereof.

In some implementations, selectively disabling the one or more components includes disabling a portion of a pipeline register of the LDPC decoder based on the message resolution. In an illustrative example, the portion of the pipeline register corresponds to one or more latches of one or more of the pipeline registers 1806 of FIG. 18.

In some implementations, the method 2000 also includes adjusting the message resolution on-the-fly during decoding.

For example, the control circuit 140 may adjust the message resolution in response to the error metric 1020 being updated during decoding. For example, the control circuit 140 may compare the error metric 1020 to a threshold every decoder clock cycle, and may reduce the message resolution in response to the error metric 1020 decreasing to a value below the threshold.

FIGS. 21-26 illustrate examples of LDPC soft decoding hardware and a method for efficient use of the LDPC soft decoder hardware by using the same hardware to perform full-accuracy calculations in a full-power mode and to perform lower-accuracy calculations in a low-power mode. In some examples, processing modules of the LDPC decoder are configurable to process a single message of full accuracy and are also configurable to process two messages in parallel with one-half of the full accuracy. As an illustrative example of a processing module that is configurable to process a single message of full accuracy and that is also configurable to process two messages in parallel with one-half of the full accuracy, an adding circuit of a processing module of the LDPC decoder has a switch to selectively couple a first group of n/2 serially-coupled adding units to a second group of n/2 serially-coupled adding units to add a first n-bit message to a second n-bit message in a full-accuracy mode. In a reduced-accuracy mode, the switch decouples the first group of n/2 serially-coupled adding units from the second group of n/2 serially-coupled adding units to add a first n/2 bit message to a second n/2 bit message in parallel with adding a third n/2 bit message to a fourth n/2 bit message, as described further with reference to FIG. 22. Although some examples of configurable processing modules of the LDPC decoder are configurable to use full-accuracy messages and are configurable to use twice as many half-accuracy messages, hardware and techniques described herein can be extended to support using up to n messages with 1/n of the full accuracy, where n is a positive integer that is less than or equal to the number of bits of a full accuracy message.

Although in some examples messages are described as "full accuracy" or "full resolution" messages or are described as "reduced-accuracy" or "reduced resolution" messages, in other examples such messages may instead be described in relative terms, such as "higher-accuracy" or "higher-resolution" messages and "lower-accuracy" or "lower resolution" messages, respectively. For example, the 3-bit R messages and the 4-bit Q messages used in the soft decode operation using the first accuracy of FIG. 19 are lower-accuracy messages as compared to the 6-bit R messages and the 7-bit Q messages used in the soft decode operation using the full accuracy of FIG. 19. Similarly, the 6-bit R messages and the 7-bit Q messages of the soft decode operation used in the soft decode operation using the full accuracy of FIG. 19 are higher-accuracy messages as compared to the 3-bit R messages and the 4-bit Q messages used in the soft decode operation using the first accuracy of FIG. 19.

Because processing modules of the LDPC decoder are used to support multiple decoding modes (e.g., the full-accuracy mode and the reduced-accuracy mode), decoder size is reduced as compared to decoders that have a first set of processing modules for performing decoding computation in a low-power mode and that have a second set of processing modules for performing decoding computations in a full-power mode.

As explained previously with reference to Equations 4-14, many operations performed during LDPC soft decoding are based on addition and subtraction, enabling re-use of adder hardware. An example of configurable adder hardware is provided in FIG. 22, examples of a configurable DPU are provided in FIG. 23 and FIG. 24, and an example of configurable decoder memory is included in FIG. 25. A system that implements one or more of the examples of FIGS. 22-25 is described with reference to FIG. 21.

Figure 21:
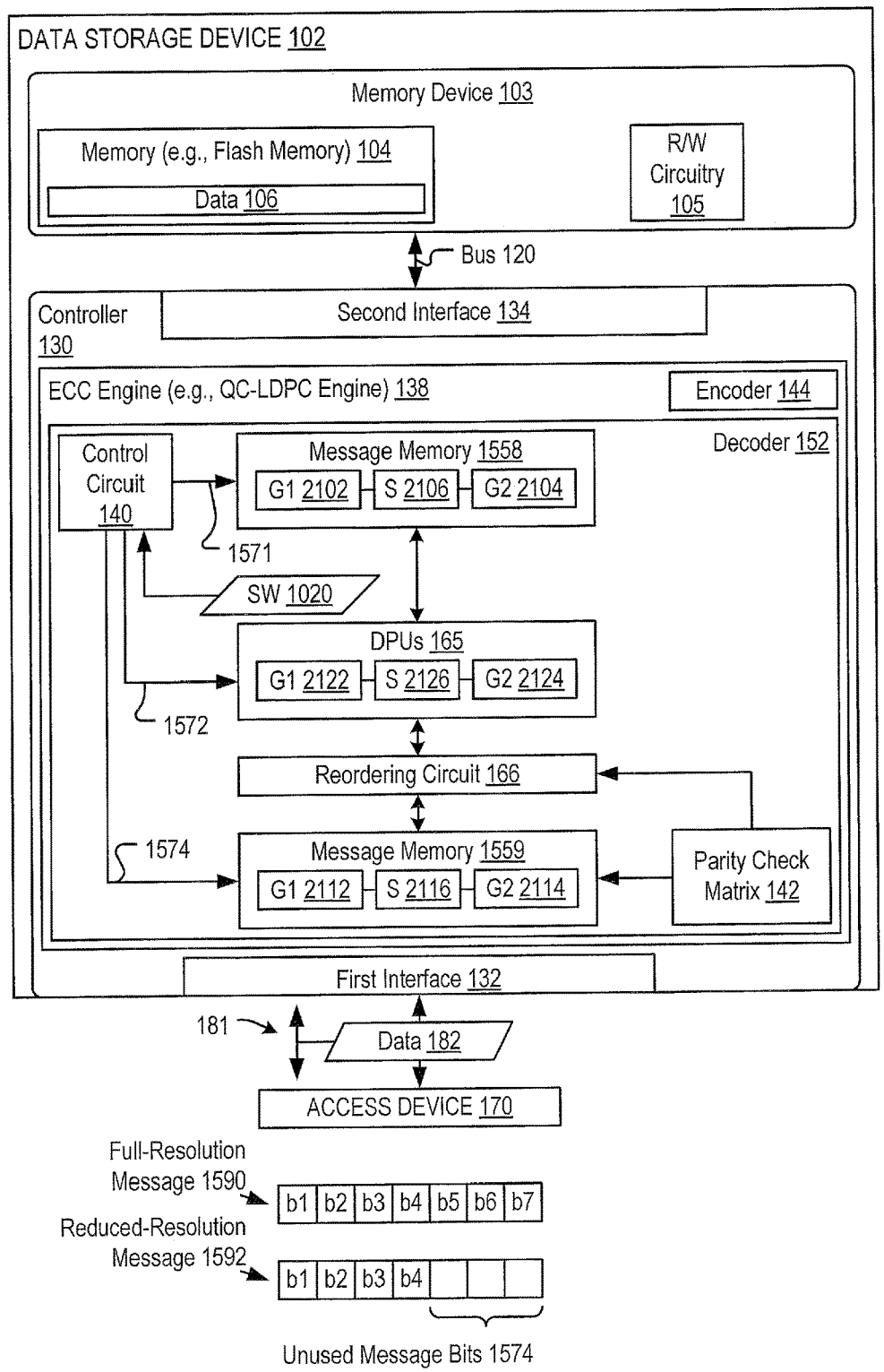
FIG. 21 is a is a block diagram of an illustrative example of a system including the data storage device of FIG. 1 that includes an ECC decoder that supports multiple message resolutions and that is configured to configure decoder components based on the message resolution.

FIG. 21 depicts an illustrative example of a system 2100 that includes the data storage device 102 and the access device 170 of FIG. 1. The decoder 152 of the data storage device 102 is configured to operate in multiple decoding modes having different levels of parallelism, as described with reference to FIG. 1, FIG. 10, and FIG. 15. The decoder 152 is also configurable to select a message resolution for decoding based on the error metric 1020. Rather than including one set of dedicated components for decoding using full-resolution messages and another set of dedicated components for decoding using reduced-resolution messages, processing components and storage components of the decoder 152 of FIG. 21 are configured to be used for decoding using full-resolution messages and also for decoding using reduced-resolution messages. In a decoding mode using a reduced message resolution, one or more components of the decoder 152 are re-configured to support parallel processing of multiple reduced-resolution messages. As compared to serial processing of messages during reduced-resolution decoding, parallel processing of messages during reduced-resolution decoding reduces decoding latency, which enables higher decoder throughput and reduced read latency of the data storage device 102.

The decoder 152 includes the control circuit 140, the DPUs 165, the reordering circuit 166, and the parity check matrix 142, as described with reference to the example implementations of FIG. 1, FIG. 10, and FIG. 15. The decoder 152 also includes the first message memory 1558 and the second message memory 1559 of FIG. 15. The DPUs 165, the reordering circuit 166, the first message memory 1558, and the second message memory 1559 each includes multiple components that may be reconfigured for parallel processing of multiple decoding messages during decoding using a reduced message resolution, as described further below.

To illustrate, in a full-resolution message decoding mode (also referred to herein as a "full-resolution mode"), the decoder 152 uses full-resolution messages, such as the representative full-resolution message 1590 that includes bits b1-b7. In a reduced-resolution message decoding mode (also referred to herein as a "reduced-resolution mode"), the decoder 152 uses reduced-resolution messages, such as the representative reduced-resolution message 1592 that includes bits b1-b4. The three lowest-order (least significant) bits b5-b7 that are used during the full-resolution message decoding mode and that are unused in the reduced-resolution message decoding mode are referred to as the "unused" message bits 1574. Circuit elements (e.g., adders, shifters, memory banks, flip-flops, etc.) of the decoder 152 that are configured to process bits b1-b4 of memory messages in the full-resolution message decoding mode also process bits b1-b4 of memory messages in the reduced-resolution message decoding mode. However, because bits b5-b7 are unused in the reduced-resolution message decoding mode, circuit elements that are configured to process bits b5-b7 of memory messages in the full-resolution message decoding mode are re-configured to process bits of a second reduced-resolution message 1592, such as via activation or deactivation of one or more switches to selectively couple or decouple components of the DPUs 165, the reordering circuit 166, the first message memory 1558, and the second message memory 1559, as explained more fully below and with reference to the illustrative examples of FIGS. 22-26.

The DPUs 165 include a first group 2122 of components and a second group 2124 of components. The first group 2122 is selectively coupled to the second group 2124 via a switch 2126. The switch 2126 is responsive to a control signal 1572 to selectively couple the first group 2122 to the second group 2124 based on a message resolution of a decoding message of the decoder 152. For example, the switch 2126 may be responsive to the control signal 1572 that indicates a message length or resolution (e.g., how many bits are used in a decoding message) or may indicate a decoding message resolution mode that is decoded by the DPUs 165 to determine whether to activate the switch 2126 or to deactivate the switch 2126. In some implementations the first group 2122 is a first group of serially coupled adding units, and the second group 2124 is a second group of serially coupled adding units, such as described in further detail with reference to FIG. 22.

The first message memory 1558 includes a first group 2102 of components and a second group 2104 of components. For example, the first group 2102 may correspond to a bank of flip-flops configured to store a first number of bits per stored message (e.g., per row), and the second group 2104 may correspond to a second bank of flip-flops configured to store a second number of bits per stored message. The second number may equal the first number or may differ from the first number. A switch 2106 is configured to selectively couple the first group 2102 to the second group 2104 based on a message resolution used by the decoder 152. For example, the switch 2106 may be responsive to the control signal 1571 that indicates a message length or resolution (e.g., how many bits are used in a decoding message) or may indicate a decoding message resolution mode that is decoded by the first message memory 1558 to determine whether to activate the switch 2106 or to deactivate the switch 2106. An example of the first message memory 1558 is provided in further detail with reference to FIG. 25.

The second message memory 1559 includes a first group 2112 of components and a second group 2114 of components. For example, the first group 2112 may correspond to a bank of flip-flops configured to store a first number of bits per stored message (e.g., per row), and the second group 2114 may correspond to a second bank of flip-flops configured to store a second number of bits per stored message. The second number may equal the first number or may differ from the first number. A switch 2116 is configured to selectively couple the first group 2112 to the second group 2114 based on a message resolution used by the decoder 152. For example, the switch 2116 may be responsive to the control signal 1574 that indicates a message length or resolution (e.g., how many bits are used in a decoding message) or may indicate a decoding message resolution mode that is decoded by the second message memory 1559 to determine whether to activate the switch 2116 or to deactivate the switch 2116. An example of the second message memory 1559 is provided in further detail with reference to FIG. 25.

During operation, the decoder 152 determines a message resolution of decoding messages based at least partially on the error metric 1020. For example, the decoder 152 (e.g., the control circuit 140) may compare the error metric 1020 (e.g., a syndrome weight) to a threshold. In response to the error message 1020 exceeding the threshold, the control circuit 140 may select a first message resolution for enhanced error correction capability, such as a full resolution (e.g., the FP mode). Otherwise, if the error metric 1020 does not exceed the threshold, the control circuit 140 may select a lower-resolution message decoding mode, such as using decoding messages having a second resolution (e.g., the LP mode). The control circuit 140 is configured to send the control signal 1571 to the first message memory 1558, the control signal 1572 to the DPUs 165, and the control signal 1574 to the second message memory 1559. Each of the control signals 1571, 1572, and 1574 may indicate a message resolution decoding mode or a message length to enable re-configuration of the first message memory 1558, the second message memory 1559, and the DPUs 165 for efficient use of hardware component via parallel processing of reduced-length messages. Although some examples provided with reference to FIGS. 21-26 describe decoding using a full-resolution mode or a reduced-resolution mode, it should be understood that the control circuit 152 may select between more than two decoding modes, such as described previously with reference to FIG. 19.

The first message memory 1558 activates the switch 2106 to couple the first group 2102 to the second group 2104 in response to the control signal 1571 including a first control signal that indicates a full-resolution message decoding mode. Messages stored in the message memory 1558 in the full-resolution mode may be stored with high-order bits of each message in the first group 2102 and low-order bits of each message in the second group 2104. Messages stored in the first message memory 1558 may be accessed from the first group 2102 and the second group 2104 as a single access operation while the switch 2106 is activated.

Otherwise, in response to the control signal 1571 including a second control signal indicating the reduced-resolution mode, the switch 2106 is deactivated. A first set of reduced-resolution messages are stored in the first group 2102 and a second set of reduced-resolution messages are stored in the second group 2104. The messages stored in the first group 2102 may be accessed independently of the messages stored in the second group 2104. Thus, the first message memory 1558 is configured in the full-resolution message decoding mode to store larger decoding messages for enhanced resolution via activation of the switch 2106, and in the reduced-resolution message decoding mode the first message memory 1558 is configured to store two or more lower-resolution messages, instead of a single larger message, via deactivation of the switch 2106.

The second message memory 1559 activates the switch 2116 to couple the first group 2112 to the second group 2114 in response to the control signal 1574 in a similar manner as described with reference to the first message memory 1558. The second message memory 1559 is configured in the full-resolution message decoding mode to store larger decoding messages for enhanced resolution via activation of the switch 2116, and in the reduced-resolution message decoding mode the second message memory 1559 is configured to store two or more lower-resolution messages, instead of a single larger message, via deactivation of the switch 2116.

The DPUs 165 are also configured to process messages based on the selected message resolution by activating the switch 2126 to couple the first group 2122 to the second group 2124 in response to the control signal 1572 indicating a full-resolution mode and by deactivating the switch 2126 to decouple the first group 2122 from the second group 2124 in response to the control signal 1572 indicating a reduced-resolution mode. The DPUs 165 are configured in the full-resolution message decoding mode to process (e.g., add) larger decoding messages for enhanced resolution and are configured in the reduced-resolution message decoding mode to process (e.g., add) two or more lower-resolution messages in parallel, instead of a single larger message, after deactivation of the switch 2126.

By adjusting the configuration of components of the decoder 152 based on whether a decoding operation uses larger message sizes (e.g., higher resolution messages) or smaller message sizes (e.g., lower resolution messages), the decoder 152 may have a smaller size as compared to decoders that include a first set of components to process larger messages and that include a second distinct set of components to process smaller messages. In addition, by reconfiguring portions of the components that would otherwise be unused in the reduced-resolution mode (e.g., corresponding to the unused message bits) to process additional decoding messages, a decoder throughput may be enhanced as compared to an implementation in which the components remain idle or are disabled in the reduced-resolution mode.

Figure 22:
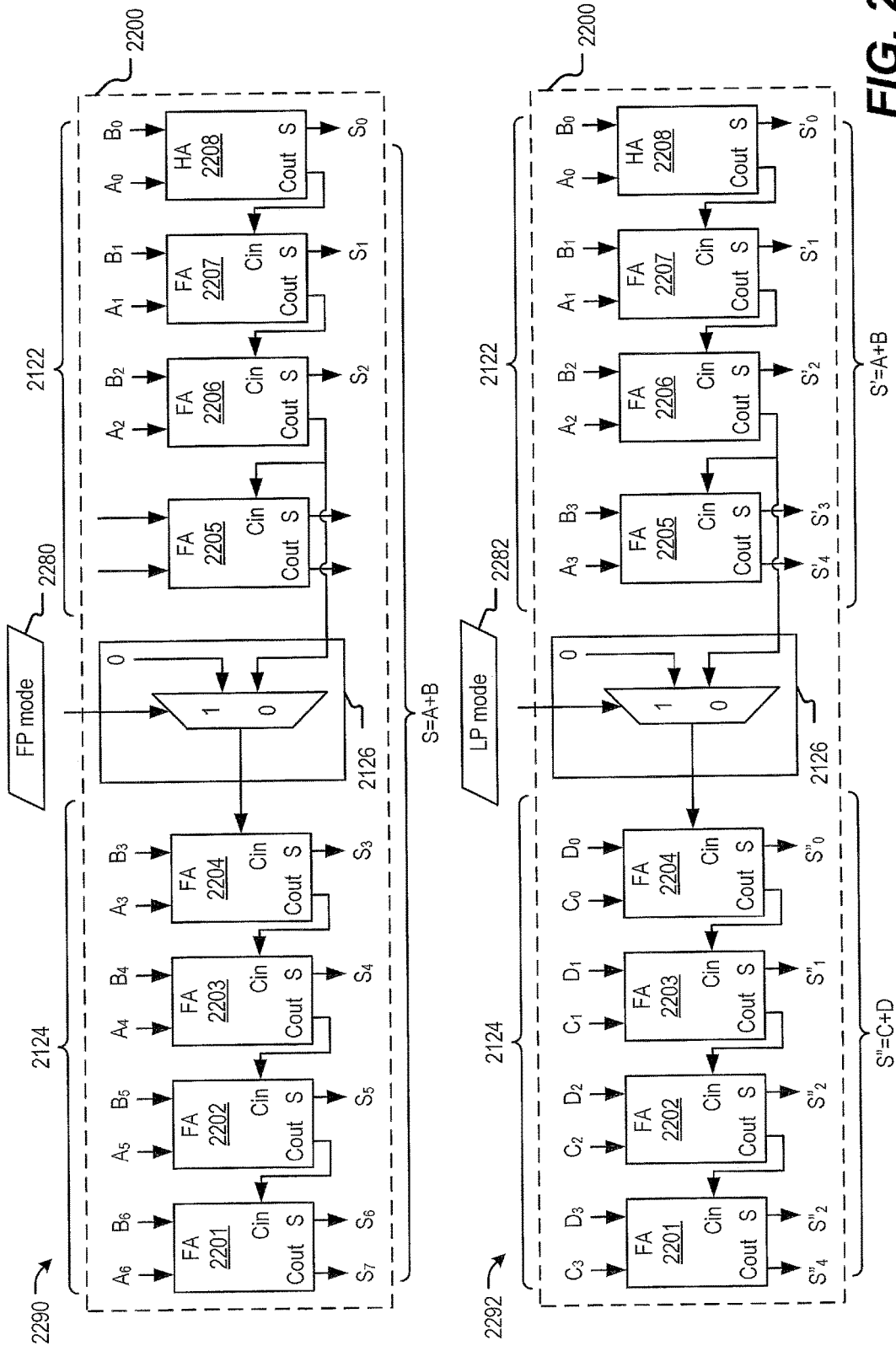
FIG. 22 is a block diagram of an illustrative example of a configurable adding circuit that may be included in the decoder of FIG. 21.

FIG. 22 illustrates an adding circuit 2200 that is configured in a first implementation 2290 configured to operate in the full-resolution message decoding mode and that is configured in a second implementation 2292 to operate in a reduced-resolution message decoding mode. The adding circuit 2200 may be implemented in one or more of the DPUs 165 and may correspond to the message adding circuit 1700 of FIG. 17.

The adding circuit 2200 includes the first group 2122 including serially-coupled adding units and the second group 2124 including serially-coupled adding units. For example, the first group 2122 of serially-coupled adding units includes adder 2205, adder 2206, adder 2207, and adder 2208. The adders 2205-2207 are full adders, such as described with reference to the representative adder 1702 of FIG. 17. The adder 2208 is a half adder, such as described with reference to the representative half adder 1708 of FIG. 17. The second group of adders 2124 includes adder 2201, adder 2202, adder 2203, and adder 2204. The adders 2201-2204 are full adders. The adders 2205-2208 of the first group 2122 are serially coupled, having carry outputs of each adder coupled to a carry input of an adjacent adder. Likewise, the adders 2201-2204 of the second group 2124 are serially coupled via carry outputs being coupled to carry inputs of adjacent adders.

The switch 2126 is coupled to an output of the first group 2122 and to an input of the second group 2124. To illustrate, the switch 2126 receives the carry output Cout of the adder 2206 of the first group 2122 as an input and has an output coupled to the carry input Cin of the adder 2204 of the second group 2124. As illustrated, the switch 2126 includes a multiplexer having a first data input coupled to the carry output of the adder 2206, a second data input that receives a "0" signal (e.g., tied to ground), and a control input configured to receive a first control signal 2280. For example, the first control signal 2280 may correspond to a first value of the control signal 1572. The first control signal 2280 may have a value of 0, corresponding to the FP mode and causing the multiplexer to output the carry output of the adder 2206. Selecting the carry output of the adder 2206 to be provided to the carry input of the adder 2204 causes the adding circuit 2200 to function as a 7-bit adder. For example, the adding circuit 2200 is illustrated in the first implementation 2290 as adding a first 7-bit message "A" to a 7-bit message "B." Each of the adders 2201-2204 and 2206-2208 adds one bit from A to one bit from B (and a carry bit as applicable) to generate a corresponding bit of a resultant message "S" and to provide a carry signal to the adder for the next most significant bit.

In the second implementation 2292, the switch 2126 receives a second control signal 2282 corresponding to the LP mode. For example, the second control signal 2282 may correspond to a second value the control signal 1572 (e.g., a 1 value). The second control signal 2282 causes the switch 2126 to decouple the first group 2122 from the second group 2124. The carry input of the adder 2204 of the first group 2124 receives a 0 value, enabling the second group 2124 to add a second pair of 4-bit messages "C" and "D" while the first group 2122 adds a first pair of 4-bit messages "A" and "B." The first pair of 4-bit messages A and B are added at the first group 2122 in parallel with the second pair of 4-bit messages C and D being added at the second group 2124. For example, the first pair of 4-bit messages A and B may be added to generate a first 5-bit resultant message S', and the second pair of 4-bit messages C and D may be added to generate a second resultant 5-bit message S" during a single cycle of the decoder clock 172 of FIG. 1 or FIG. 10. The adding circuit 2200 is therefore configured to add a single pair of messages (e.g., 7-bit messages A+B) per clock cycle of the decoding clock 172 in each pipeline stage in the first decoding mode (e.g., in the first implementation 2290) and to add multiple pairs of messages (e.g., 4-bit messages A+B, C+D) in parallel per clock cycle of the decoding clock 172 in each pipeline stage in the second decoding mode (e.g., in the second implementation 2292).

By reconfiguring the first group 2122 (e.g., corresponding to lower-order message bits in the first decoding mode) to process an additional message in the second decoding mode instead of remaining idle or being disabled, a higher rate of computations are performed in the second decoding mode and a more efficient use of the hardware of the adding circuit 2200 is achieved. As a result, decoding latency of the decoder 152 may be reduced in the reduced-resolution message decoding mode.

Although the switch 2126 is illustrated as including a multiplexer having a first input coupled to the carry output of the adder 2206 and having a second input receiving a 0 signal, in other implementations the switch 2126 may not include a multiplexer. For example, the switch 2126 may include one or more transistors, pass gates, mechanical switches, latches, flip-flops, digital logic elements, other switching elements, or any combination thereof, configured to selectively couple or decouple the carry output of the adder 2206 to the carry input of the adder 2204.

Although the adding circuit 2200 is illustrated as including eight adders 2201-2208 configured to be partitioned into two groups in the second implementation 2292 or to be operated as a single group in the first implementation 2290, in other implementations fewer than seven adders or more than seven adders are included in the adding circuit 2200. Although the right-most adder 2208 is illustrated as a half adder, in other implementations the adder 2208 is a full adder with a carry input that receives (e.g., is tied to) a "0" input. Further, although a single switch 2126 is illustrated as selectively coupling or decoupling the first group 2122 to the second group 2124, in other implementations the adding circuit 2200 includes two or more switches to enable operation using other message resolutions. For example, in an implementation in which 2-bit messages are used, the adding circuit 2200 may include additional switches between the adders 2202 and 2203 and between the adders 2206 and 2207. In such an implementation, the adder circuit 2200 may be configured to operate in a first configuration to add a single pair of 7-bit messages, in a second configuration to add two pairs of 4-bit messages in parallel, and in a third configuration to add four pairs of 2-bit messages in parallel.

FIG. 23 illustrates a block diagram of an example of a representative DPU 2300 as an integrated FP/LP processing unit that may be implemented in the DPUs 165 of FIG. 21. In a first implementation 2390, the DPU 2300 receives the first control signal 2280, corresponding to the FP mode, and also receives an 8-bit Q message 2302 at a Q information input and a 6-bit R message 2304 at a 6-bit R message input. For example, the Q message 2302 and the R message 2304 may correspond to the Q, R message input to the message input buffers 1802 of FIG. 18. Within the DPU 2300, one or more sets of buffers may be configured to operate using messages having the full-message resolution, and one or more other components may be configured to operate using the full-message resolution, such as one or more of the components that are illustrated in the example 1800 of FIG. 18.

In a second implementation 2392, the second control signal 2282 is provided to the DPU 2300 to reconfigure the DPU 2300 to operate using a reduced-resolution message decoding configuration. The 8-bit Q input receives a pair of 4-bit Q messages 2322 and 2323 in parallel. The 6-bit R message input receives a pair of 3-bit R messages 2324 and 2325 in parallel. The input buffers for the Q and R message input and one or more components of the DPU, such as one or more adders and one or more registers, are reconfigured responsive to the second control signal 2282 to process pairs of messages in parallel at the reduced resolution instead of processing a single message at the higher-resolution (as in the first implementation 2390).

In contrast to the implementation of FIG. 18 where unused portions of components are disabled in a lower-resolution message decoding mode, components of the DPU 2300 of FIG. 23 may be reconfigured to process multiple lower-resolution messages in parallel rather than disabling portions corresponding to unused message bits. By reconfiguring elements of the components of the DPU 2300 based on whether the first control signal 2280 or the second control signal 2282 is received, hardware components of the DPU 2300 may be reused, resulting in enhanced processing speed in reduced-resolution modes as more messages are processed in parallel as compared to in the full power mode.

Although the DPUs 165 of FIG. 21 and the DPU 2300 of FIG. 23 are described as including adding circuits, such as the message adding circuit 2200 of FIG. 22, it should be understood that processing units (DPUs) include not only adding circuits, but also other digital elements, such as flip-flops, subtractors, multiplexers, or comparators, as illustrative, non-limiting examples. The DPUs may perform calculations according to Equations 4-14. Most or all elements of the DPUs may be adapted to operate either with one full-resolution message or with two or more lower-resolution messages.

Some digital elements of the DPUs can be implemented with adders. For example, a subtracting circuit can be implemented using an adding circuit (e.g., A−B=A+(−B)). The operand (−B) may be implemented as a two's complement representation, calculated as NOT(B)+1, where NOT is a bitwise inversion. A subtracting circuit may therefore include a first group of serially-coupled adders that can be selectively coupled to a second group of serially-coupled adders based on the message resolution of the decoding messages.

As another example, comparators may be implemented using subtraction circuits (e.g., A>B is equivalent to A−B>0, which is equivalent to A+(−B)>0). A comparator circuit may therefore include a first group of serially-coupled adders that can be selectively coupled to a second group of serially-coupled adders based on the message resolution of the decoding messages.

An illustrative example of components that may be implemented in the DPUs 165 and that are configurable to operate on one full-resolution message or on two or more lower-resolution messages is described with reference to FIG. 24.

Figure 24:
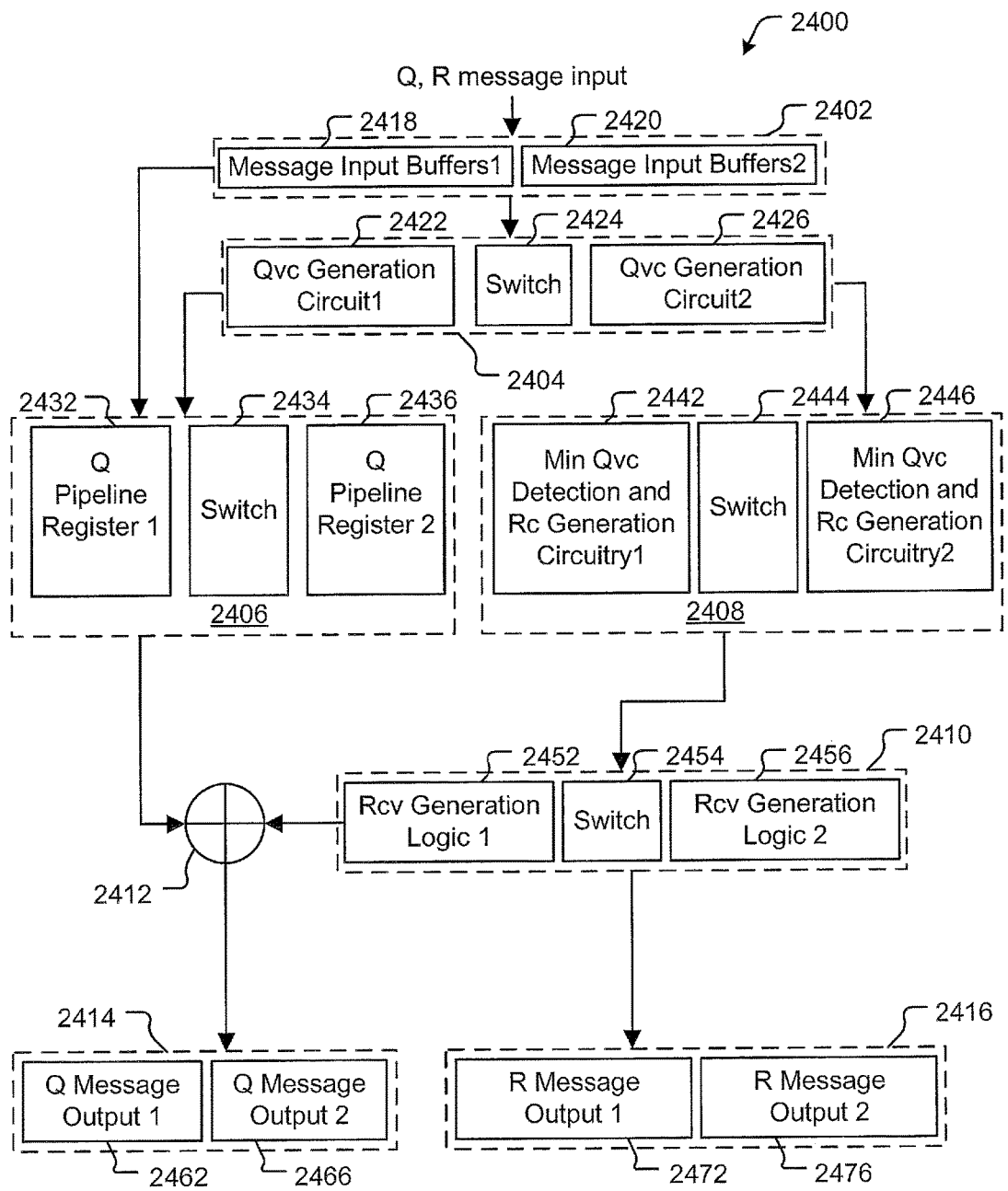
FIG. 24 is a block diagram of an illustrative example of components a data processing unit (DPU) that may be included in the decoder of FIG. 21.

FIG. 24 illustrates an example of a DPU 2400, such as a particular implementation of the DPU 2300 of FIG. 23. The DPU 2400 includes message input buffers 2402, a Qvc generation circuit 2404, pipeline registers 2406 for Q messages, circuitry 2408 configured to determine min Qvc and to generate Rc messages, Rcv generation logic 2410, a message adder 2412, a Q message output buffer 2414, and an R message output buffer 2416, that correspond to the message input buffers 1802, the Qvc generation circuit 1804, the pipeline registers 1806, the circuitry 1808, the Rcv generation logic 1810, the message adder 1812, the Q message output buffer 1814, and the R message output buffer 1816, respectively, of FIG. 18. Each of the components 2404-2416 of the DPU 2400 is configurable to perform one full-resolution message calculation or two or more lower-resolution calculation, such as by using portions of the logic that are disabled in the implementation of the DPU 1800 of FIG. 18.

The message input buffers 2402 include a first group 2418 of message input buffers and a second group 2420 of message input buffers. In a full-resolution message decoding mode, the first group 2418 is coupled to the second group 2420 to store full-resolution messages (e.g., messages 2302 and 2304 of FIG. 23). In a reduced-resolution message decoding mode, the first group 2418 is decoupled from the second group 2420 to store reduced-resolution messages (e.g., messages 2322, 2323, 2324, 2325 of FIG. 23).

The Qvc generation circuit 2404 includes a first circuit 2422, a second circuit 2426, and a switch 2424. In the full-resolution message decoding mode, the first circuit 2422 is coupled to the second circuit 2426 via the switch 2424 to process full-resolution messages. In the reduced-resolution message decoding mode, the switch 2424 decouples the first circuit 2422 from the second circuit 2426 to enable the first circuit 2422 to process reduced-resolution messages in parallel with the second circuit 2422 processing reduced-resolution messages. The circuit 2404 may include one or more adders, flip-flops, or other circuit elements corresponding to components that are selectively coupled to process larger messages or decoupled to process multiple smaller messages. For example, one or more adders, such as the message adding circuit 2200 of FIG. 22, may be included in the circuit 2404.

The pipeline registers 2406 include one or more registers configured to function as pipeline registers to store and convey Qvc message data over multiple clock cycles while processing is ongoing at the circuitry 2408. For example, each of a first pipeline register 2432 and a second pipeline register 2436 is sized to store a respective reduced-resolution Qvc message in the reduced-resolution message decoding mode. In the full-resolution message decoding mode, a switch 2434 couples the first pipeline register 2432 to the second pipeline register 2436, and the resulting combined pipeline registers is sized to store a full-resolution Qvc message. In some implementations, the Q pipeline registers 2406 are implemented using an SRAM (instead of flip-flops) to store and convey the Qvc message data. The SRAM may be organized into memory banks according to bit significance and shared between DPUs in a manner similar to the first (Rcv) message memory 1558 of FIG. 21 and the second (Qv) message memory 1559 of FIG. 21.

The circuitry 2408 includes first circuitry 2442 configured to be selectively coupled to second circuitry 2446 via a switch 2444. When decoupled from each other in the reduced-resolution message decoding mode, each of the first circuitry 2442 and the second circuitry 2446 separately processes reduced-resolution messages. In the full-resolution message decoding mode, the first circuitry 2442 is coupled to the second circuitry 2446 to process full-resolution messages.

The Rcv generation logic 2410 includes first logic 2452 that is configured to be selectively coupled to second logic 2456 via a switch 2454. When decoupled from each other in the reduced-resolution message decoding mode, each of the first logic 2452 and the second logic 2456 separately processes reduced-resolution messages. In the full-resolution message decoding mode, the first logic 2452 is coupled to the second logic 2456 to process full-resolution messages.

The adder 2412 corresponds to the adding circuit 2200 of FIG. 22 and is configured to generate Qv messages, such as described with reference to FIG. 22.

The Q message output buffer 2414 includes a first group 2462 of message output buffers and a second group 2466 of message output buffers. In the full-resolution message decoding mode, the first group 2462 is coupled to the second group 2466 to store full-resolution messages. In the reduced-resolution message decoding mode, the first group 2462 is decoupled from the second group 2466 to store reduced-resolution messages.

The R message output buffer 2416 includes a first group 2472 of message output buffers and a second group 2476 of message output buffers. In the full-resolution message decoding mode, the first group 2472 is coupled to the second group 2476 to store full-resolution messages. In the reduced-resolution message decoding mode, the first group 2472 is decoupled from the second group 2476 to store reduced-resolution messages.

Components of the DPU 2400 are thus responsive to the message resolution of the decoding mode (e.g., as indicated by the control signal 1572) to process full-resolution messages or to process multiple reduced-resolution messages in parallel. Although each component of FIG. 24 is described as supporting a full-resolution decoding mode and a reduced-resolution decoding mode, in other implementations one or more (or all) components support multiple reduced-resolution decoding modes in addition to supporting the full-resolution decoding mode. As an illustrative, non-limiting example, one or more of the components of FIG. 24 may support an 8-bit message in the full-resolution decoding mode, two 4-bit messages in parallel in a first reduced-resolution decoding mode, three 3-bit messages in parallel in a second reduced-resolution decoding mode, four 2-bit messages in parallel in a third reduced-resolution decoding mode, or any combination thereof. Although the DPU 2400 includes components to perform LDPC decoding in accordance with Equations 4-14, in other implementations one or more other LDPC decoding techniques, such as a min-sum or sum-product variation, is implemented by the decoder 152 and consequently the DPU 2400 includes one or more additional or alternative components than those illustrated in FIG. 24. Thus, it should be understood that the above equations and corresponding implementations are provided as illustrative, non-limiting examples, and that the multi-resolution techniques described herein may be applied to other implementations.

Figure 25:
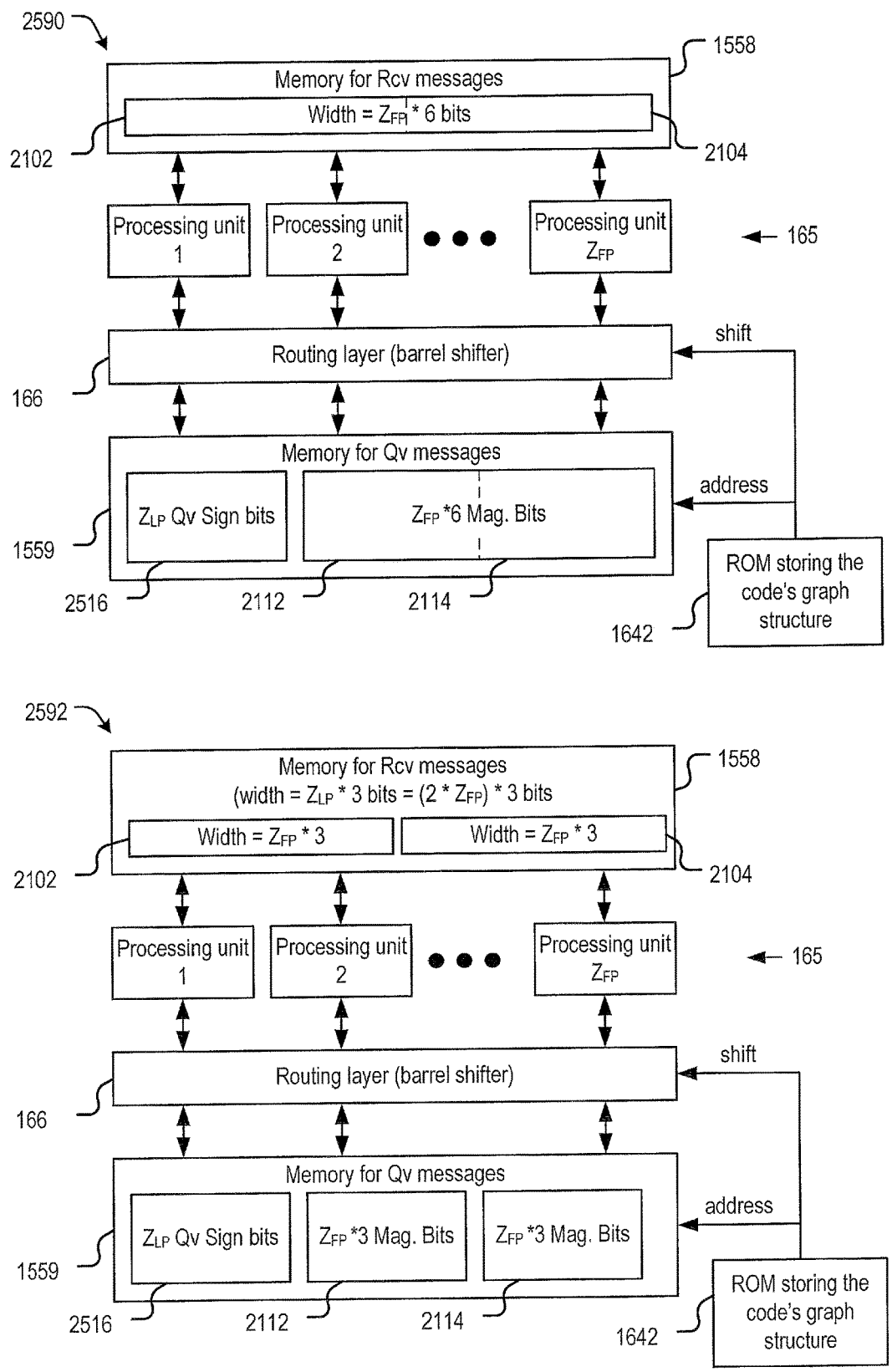
FIG. 25 is a block diagram of an illustrative example of the decoder of FIG. 21.

FIG. 25 illustrates an example of the decoder 152 of FIG. 21 in a first implementation 2590 and in a second implementation 2592. In the first implementation 2590, decode processing uses the full-resolution mode (FP mode) with parallelism $Z_{FP}$. In the second implementation 2592, decoding processing uses a reduced-resolution mode (LP mode) with parallelism $Z_{LP}=2*Z_{FP}$.

In the first implementation 2590, the first message memory 1558 is configured such that the first group 2102 is coupled to the second group 2104 to store Rcv messages having the full resolution, illustrated as a 6-bit message resolution. The second message memory 1559 is illustrated as having the first group 2112 coupled to the second group 2114 to store 6-bit magnitude values of Qv messages. The second message memory 1559 also includes a group 2516 of storage elements configured to store 1-bit sign values of the 7-bit Qv messages.

In the second implementation 2592, the first group 2102 is decoupled from the second group 2104 in the first message memory 1558. Each of the first group 2102 and the second group 2104 stores a respective set of 3-bit Rcv messages. In the second message memory 1559, the first group 2112 is decoupled from the second group 2114 to store 3-bit magnitude values of 4-bit Qv messages. The 1-bit sign values of the 4-bit Qv messages are stored in the group 2516.

The first message memory 1558 has a width of $Z_{FP}*6$ bits to enable exchanging of 6-bit Rcv messages with each of the $Z_{FP}$ DPUs 165 per clock cycle in the first implementation 2590 (e.g., R 2304 in the first implementation 2390 of FIG. 23) and to enable exchanging pairs of 3-bit Rcv messages with each of the $Z_{FP}$ DPUs 165 per clock cycle in the second implementation 2592 (e.g., $R_1$ 2324 and $R_2$ 2325 in the second implementation 2392 of FIG. 23).

The second message memory 1559 has a width of $Z_{FP}*8$ bits to enable exchanging of 7-bit Qv messages with each of the $Z_{FP}$ DPUs 165 per clock cycle in the first implementation 2590 (e.g., Q 2302 in the first implementation 2390 of FIG. 23) and to enable exchanging pairs of 4-bit Qv messages with each of the $Z_{FP}$ DPUs 165 per clock cycle in the second implementation 2592 (e.g., $Q_1$ 2322 and $Q_2$ 2323 in the second implementation 2392 of FIG. 23). The group 2516 is sized to access $Z_{LP}$ sign bits per clock cycle, which is twice the number of sign bits accessed per clock cycle in the FP mode (i.e., $Z_{FP}$ sign bits). In some implementations, one or more portions of the group 2516 corresponding to unused sign bits may be disabled in FP mode to reduce power consumption.

Each of the DPUs 165 is configured to exchange 7-bit Qv messages and 6-bit Rcv messages in the first implementation 2590, such as described with reference to the first implementation 2390 of the DPU 2300 of FIG. 23. In the second configuration 2592, each of the DPUs 165 is configured to exchange pairs of 4-bit Qv messages and pairs of 3-bit Rcv messages, such as described with reference to the second implementation 2392 of FIG. 23. For example, each of the DPUs 165 may include the adding circuit 2200 of FIG. 22 to support addition of full-resolution messages in the FP mode and to support addition of pairs of lower-resolution messages in the LP mode.

By reconfiguring components of the decoder 152 as depicted in FIG. 24 to support different message resolutions in the FP mode and in the LP mode, the decoder 152 may provide increased average decoding speed as compared to decoders that do not re-configure hardware that would otherwise remain idle in the LP mode and may have a smaller size and cost as compared to decoders that use a first set of components dedicated to high-resolution decoding and that uses a distinct second set of components dedicated to lower-resolution decoding.

Figure 26:
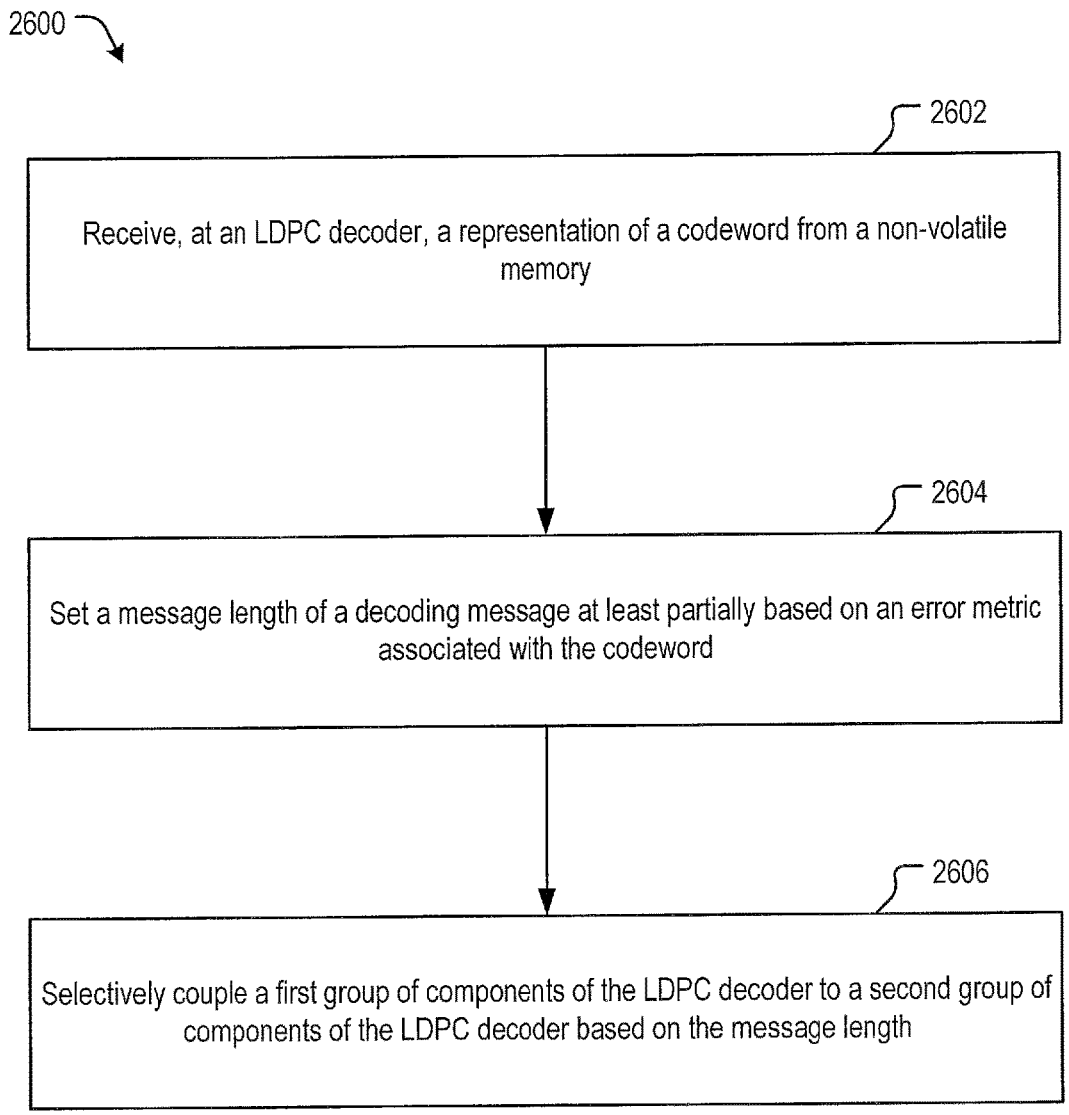
FIG. 26 is a flow diagram of a particular example of a method of operation that may be performed by the data storage device of FIG. 21.

FIG. 26 depicts an illustrative example of a method 2600 of operation at a device including a non-volatile memory and a low density parity check (LDPC) decoder. For example, the method 2000 may be performed at the decoder 152 of FIG. 21. The method 2100 includes receiving, at the LDPC decoder, a representation of a codeword from the non-volatile memory, at 2602. For example, the representation of the codeword may correspond to the data 106 read from the memory 104 and provided to the decoder 152 of FIG. 21.

A message length (e.g., a message resolution) of a decoding message is set at least partially based on an error metric associated with the representation of the codeword, at 2604. In some implementations, setting the message length at least partially based on the error metric includes setting the decoding message to have a first number of bits in response to the error metric exceeding a threshold. In an illustrative example, the error metric comprises a syndrome weight of the representation of the codeword and is compared to a syndrome weight threshold to determine whether to decode the representation of the codeword using a full-resolution message decoding mode (e.g., FP mode) using the full-resolution message 1590 or a reduced-resolution message decoding mode (e.g., LP mode) using the reduced-resolution message 1592.

A first group of components of the LDPC decoder is selectively coupled to a second group of components of the LDPC decoder based on the message length, at 2606. In a particular example, the first group of components includes a first group of serially-coupled adders and the second group of components includes a second group of serially-coupled adders, such as the first group 2122 and the second group 2124 of FIG. 22. In this example, selectively coupling the first group of components to the second group of components includes sending a control signal to a control input of a switch that is coupled to an output of the first group of serially-coupled adders and that is coupled to an input of the second group of serially-coupled adders, such as the control signal 2280 or 2282 of FIG. 22.

In another example, the first group of components includes a first portion of a memory of the LDPC decoder and the second group of components includes a second portion of the memory. In a particular example, the first group of components corresponds to the first group 2102 and the second group of components corresponds to the second group 2104 of the first message memory 1558 of FIG. 21 or FIG. 25. In another particular example, the first group of components corresponds to the first group 2112 and the second group of components corresponds to the second group 2114 of the second message memory 1559 of FIG. 21 or FIG. 25. In some implementations, a first message having a first length is stored in the first portion and the second portion, such as in the first implementation 2590 of FIG. 25. In other implementations, a second message is stored in the first portion and a third message is stored in the second portion, such as in the second implementation 2592 of FIG. 25.

By selectively coupling the first group to the second group, the components of the LDPC decoder that may be unused in a reduced-resolution message decoding mode may be reconfigured to process additional reduced-resolution messages. As a result, multiple decoding messages may be processed in parallel in the reduced-resolution mode using the same decoder hardware that processes a single message in the full-power mode. Decoder throughput in the reduced-resolution mode may therefore be increased without incurring a substantial increase in decoder size or complexity.

Although various components depicted herein are illustrated as block components and described in general terms, such components may include one or more microprocessors, state machines, or other circuits configured to enable the controller 130 to implement the decoder 152 of FIG. 21. For example, the control circuit 140, the reordering circuit 166, the first message memory 1558, the second message memory 1559, the adding circuit 2200, the DPU 2300, or a combination thereof, may represent physical components, such as hardware controllers, state machines, logic circuits, or other structures, to set a first component configuration to process a first-sized message in a first decoding mode and to set a second component configuration to process multiple second-sized messages in a second decoding mode. The control circuit 140 may be implemented using a microprocessor or microcontroller programmed compare the error metric 1020 to a threshold and to select a message resolution based on the comparison. The control circuit 140 may be implemented using a microprocessor or microcontroller further programmed to generate one or more of the control signals 1571, 1572, or 1574 in response to the selected message resolution being lower than the full resolution.

Although the controller 130 and certain other components described herein are illustrated as block components and described in general terms, such components may include one or more microprocessors, state machines, and/or other circuits configured to enable the data storage device 102 (or one or more components thereof) to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein.

Alternatively or in addition, one or more aspects of the data storage device 102 may be implemented using a microprocessor or microcontroller programmed (e.g., by executing instructions) to perform one or more operations described herein, such as one or more operations of the method 800, the method 900, the methods 1200, the method 1300, the method 1400, the method 1900, the method 2000, the method 2600, or any combination thereof. In a particular implementation, the data storage device 102 includes a processor executing instructions (e.g., firmware) retrieved from the memory device 103. Alternatively or in addition, instructions that are executed by the processor may be retrieved from memory separate from the memory device 103, such as at a read-only memory (ROM) that is external to the memory device 103.

In conjunction with the described aspects, an apparatus includes means for storing data. For example, the means for storing data may include or correspond to the memory device 103, the memory 104, one or more other structures, devices, circuits, or modules to store data, or a combination thereof.

The apparatus also includes means for low-density parity check (LDPC) decoding of a representation of a codeword from the means for storing data. For example, the means for LDPC decoding may include or correspond to the decoder 152 of FIG. 21 or FIG. 25, one or more other structures, devices, circuits, modules, or instructions to perform LDPC decoding, or a combination thereof. The means for LDPC decoding includes means for setting a message resolution of a decoding message at least partially based on an error metric associated with the codeword (e.g., the control circuit 140 of FIG. 21). The means for LDPC decoding also includes means for selectively coupling a first group of components to a second group of components based on the message resolution of the decoding message (e.g., one or more of the switches 2106, 2126, 2116, 2424, 2434, 2444, or 2454, as illustrative, non-limiting examples).

It should be appreciated that one or more operations described herein as being performed by the controller 130 may be performed at the memory device 103. As an illustrative example, in-memory ECC operations (e.g., encoding operations and/or decoding operations) may be performed at the memory device 103 alternatively or in addition to performing such operations at the controller 130.

The data storage device 102 may be configured to communicate with the access device 170 using one or more protocols such as NVM Express (NVMe), serial advanced technology attachment (SATA), and peripheral component interconnect express (PCIe) interface specifications, as illustrative, non-limiting examples. The data storage device 102 may be configured to be coupled to the access device 170 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory device 103 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory device 103 may include another type of memory. In a particular embodiment, the data storage device 102 is indirectly coupled to an access device (e.g., the access device 170) via a network. For example, the data storage device 102 may be a network-attached storage (NAS) device or a component (e.g., a solid-state drive (SSD) component) of a data center storage system, an enterprise storage system, or a storage area network. The memory device 103 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
    at a device including a non-volatile memory and a low density parity check (LDPC) decoder, performing:
        receiving, at the LDPC decoder, a codeword from the non-volatile memory;
        setting a message length of decoding messages at least partially based on a syndrome weight of the codeword;
        selectively coupling a first group of serially-coupled adders of the LDPC decoder to a second group of serially-coupled adders of the LDPC decoder based on the message length;
        adding multiple pairs of the decoding messages in parallel per clock cycle of a decoding clock with the first group of serially-coupled adders and the second group of serially-coupled adders when the first group of serially-coupled adders is not coupled to the second group of serially-coupled adders; and
        adding a single pair of the decoding messages per clock cycle of the decoding clock with the first group of serially-coupled adders and the second group of serially-coupled adders when the first group of serially-coupled adders is coupled to the second group of serially-coupled adders.

2. The method of claim 1, wherein setting the message length at least partially based on the syndrome weight of the codeword includes setting the decoding messages to have a first number of bits in response to the syndrome weight of the codeword exceeding a threshold.

3. The method of claim 1, wherein selectively coupling the first group of serially-coupled adders to the second group of serially-coupled adders includes sending a control signal to a control input of a switch that is coupled to an output of the first group of serially-coupled adders and that is coupled to an input of the second group of serially-coupled adders.

4. The method of claim 1, further comprising selectively coupling a first portion of a memory of the LDPC decoder to a second portion of the memory based on the message length.

5. The method of claim 4, further comprising storing a first message having a first length in the first portion and the second portion.

6. The method of claim 4, further comprising storing a second message in the first portion and a third message in the second portion.

7. A device comprising:
a non-volatile memory; and
a low density parity check (LDPC) decoder configured to receive a representation of a codeword from the non-volatile memory, the LDPC decoder comprising:
 a decoding clock;
 a circuit configured to set a message length of decoding messages at least partially based on a syndrome weight of the codeword; and
 a processing unit including first serially-coupled adding units and second serially-coupled adding units, the processing unit configured to
  selectively couple the first serially-coupled adding units to the second serially-coupled adding units based on the message length of the decoding messages,
  add multiple pairs of the decoding messages in parallel per clock cycle of the decoding clock with the first serially-coupled adding units and the second serially-coupled adding units when the first serially-coupled adding units are not coupled to the second serially-coupled adding units, and
  add a single pair of the decoding messages per clock cycle of the decoding clock with the first serially-coupled adding units and the second serially-coupled adding units when the first serially-coupled adding units are coupled to the second serially-coupled adding units.

8. The device of claim 7, wherein:
the LDPC decoder further comprises a memory that includes a first portion and a second portion;
the memory is configured to couple the first portion to the second portion to store a first message having a first length; and
the memory is configured to decouple the first portion from the second portion to store a second message in the first portion and to store a third message in the second portion.

9. The device of claim 8, wherein the second message and the third message each have a second length that is less than the first length.

10. The device of claim 7, wherein:
the processing unit further includes a switch coupled to an output of the first serially-coupled adding units and to an input of the second serially-coupled adding units, the switch configured to:
 couple the output of the first serially-coupled adding units to the input of the second serially-coupled adding units in response to a first control signal that indicates a first message length; and
 decouple the output of the first serially-coupled adding units from the input of the second serially-coupled adding units in response to a second control signal that indicates a second message length, the second message length less than the first message length.

11. The device of claim 10, wherein:
the processing unit is configured, while the output of the first serially-coupled adding units is coupled to the input of the second serially-coupled adding units, to add a first message to a second message, wherein each of the first message and the second message has the first message length; and
the processing unit is configured, while the output of the first serially-coupled adding units is decoupled from the input of the second serially-coupled adding units, to:
 add a third message to a fourth message at the first serially-coupled adding units; and
 add a fifth message to a sixth message at the second serially-coupled adding units,
 wherein each of the third message, the fourth message, the fifth message, and the sixth message has the second message length.

12. The device of claim 11, wherein:
the message length is set to the first message length in a first decoding mode of the LDPC decoder; and
the message length is set to the second message length in a second decoding mode of the LDPC decoder.

13. The device of claim 7, wherein the circuit is further configured to selectively set a reduced-power configuration of one or more components of the LDPC decoder at least partially based on a decoding mode indicator and that syndrome weight of the codeword, the reduced-power configuration including at least one of:
a reduced number of data processing units (DPUs) that are enabled;
a reduced clock frequency of the decoder clock; or
a reduced supply voltage of the LDPC decoder.

14. An apparatus comprising:
means for storing data; and
means for low density parity check (LDPC) decoding a representation of a codeword from the means for storing data, the means for LDPC decoding comprising:
 means for setting a message length of decoding messages at least partially based on a syndrome weight of the codeword; and
 means for selectively coupling a first means for adding to a second means for adding based on the message length;
 means for adding multiple pairs of the decoding messages in parallel per clock cycle of a decoding clock with the first means for adding and the second means for adding when the first means for adding are not coupled to the second means for adding; and
 means for adding a single pair of the decoding messages per clock cycle of the decoding clock with the first means for adding and the second means for adding when the first means for adding are coupled to the second means for adding.

15. The apparatus of claim 14, wherein the means for selectively coupling is further configured to:
couple an output of the first means for adding to an input of the second means for adding in response to a first control signal that indicates a first length; and
decouple the output of the first means for adding from the input of the second means for adding in response to a second control signal that indicates a second length, the second length less than the first length.

16. The apparatus of claim 15, wherein the means for setting the message length is further configured to generate the first control signal and the second control signal.

* * * * *